US008824125B1

(12) United States Patent
Cox et al.

(10) Patent No.: US 8,824,125 B1
(45) Date of Patent: Sep. 2, 2014

(54) MODULAR INSTALLATION AND CONVERSION KIT FOR ELECTRONIC SIGN STRUCTURE AND METHOD OF USING SAME

(71) Applicant: Adti Media, LLC, Temecula, CA (US)

(72) Inventors: David Franklin Cox, Escondido, CA (US); Arne E. Carlso, Ramona, CA (US); James Warren Frederick, Temecula, CA (US); Richard J. Romano, Temecula, CA (US)

(73) Assignee: Adti Media, LLC, Temecula, CA (US)

(*) Notice: Subject to any disclaimer, the term of this patent is extended or adjusted under 35 U.S.C. 154(b) by 0 days.

(21) Appl. No.: 14/075,308

(22) Filed: Nov. 8, 2013

Related U.S. Application Data

(63) Continuation-in-part of application No. 14/056,017, filed on Oct. 17, 2013, and a continuation-in-part of application No. 14/044,620, filed on Oct. 2, 2013, and a continuation-in-part of application No. 13/844,832, filed on Mar. 16, 2013.

(51) Int. Cl.

| | |
|---|---|
| ***H02B 1/26*** | (2006.01) |
| ***G09F 13/22*** | (2006.01) |
| ***G09F 15/00*** | (2006.01) |
| ***H05K 7/06*** | (2006.01) |
| ***G09F 9/33*** | (2006.01) |

(52) U.S. Cl.
CPC ... *G09F 9/33* (2013.01); *H05K 7/06* (2013.01)
USPC ................ 361/622; 361/826; 40/544; 40/624

(58) Field of Classification Search
CPC . G09F 15/00; G09F 15/0006; G09F 15/0012; G09F 15/0018
USPC ............................. 361/622, 826; 40/544, 624
See application file for complete search history.

(56) References Cited

U.S. PATENT DOCUMENTS

| | | | | |
|---|---|---|---|---|
| 4,457,090 | A * | 7/1984 | McDonough | 40/624 |
| 5,410,328 | A * | 4/1995 | Yoksza et al. | 345/82 |
| 5,563,470 | A | 10/1996 | Li | |
| 5,693,170 | A | 12/1997 | Li | |

(Continued)

FOREIGN PATENT DOCUMENTS

| | | |
|---|---|---|
| AU | WO2004042690 | 5/2003 |
| EP | 2042983 | 4/2009 |
| KR | WO2011059247 | 11/2009 |
| PL | EP 2042983 | 8/2010 |
| WO | WO2009019657 | 3/2004 |
| WO | WO2008157262 | 12/2008 |

(Continued)

*Primary Examiner* — Jeremy C Norris
*Assistant Examiner* — Nathan Milakovich
(74) *Attorney, Agent, or Firm* — Jerry R. Potts

(57) ABSTRACT

An out of the box signage kit facilitates in field conversion of a static billboard having an anchored planar mounting structure into a large format billboard type electronic sign that includes a plurality of interchangeable weatherized display modules; a plurality of hand mountable interchangeable structural frames for supporting the plurality of weatherized display modules, each structural frame having a back portion for mounting to a frontside of the anchored planar mounting structure and a front portion defining a plurality of bay members for receiving corresponding ones of said plurality of weatherized display modules; and a plurality of interchangeable wire harnesses, each individual wire harness including a first end for coupling to a power source mounted on a backside of the anchored planar mounting structure, each individual wire harness having a plurality of power extensions for coupling the power source to at least one of the display modules.

20 Claims, 30 Drawing Sheets

(56) References Cited

U.S. PATENT DOCUMENTS 5,785,415 A 7/1998 Matsumura et al.
5,949,581 A 9/1999 Kurtenbach et al.
5,990,802 A 11/1999 Maskeny
6,065,854 A 5/2000 West et al.
6,150,996 A 11/2000 Nicholson et al.
6,169,632 B1 1/2001 Kurtenbach et al.
6,175,342 B1 1/2001 Nicholson et al.
6,237,290 B1 5/2001 Tokimoto et al.
6,314,669 B1 11/2001 Tucker
6,414,650 B1 7/2002 Nicholson et al.
6,445,373 B1 * 9/2002 Yamamoto .................... 345/102
6,634,124 B1 10/2003 Bierschbach
6,657,605 B1 12/2003 Boldt, Jr. et al.
6,677,918 B2 1/2004 Yuhara et al.
6,741,222 B1 5/2004 Tucker
6,810,612 B2 11/2004 Huang
6,813,853 B1 11/2004 Tucker
6,956,541 B2 * 10/2005 McClintock ................... 345/1.1
6,956,545 B2 * 10/2005 McClintock et al. ........... 345/55
7,055,271 B2 6/2006 Lutz et al.
7,064,674 B2 6/2006 Pederson
7,086,188 B2 8/2006 Tsao
7,091,933 B2 * 8/2006 McClintock et al. ........... 345/55
7,131,226 B2 11/2006 Gray et al.
7,138,659 B2 11/2006 Raos et al.
7,144,748 B2 12/2006 Popovich
7,170,480 B2 1/2007 Boldt, Jr. et al.
7,207,693 B2 4/2007 Ratcliffe
7,224,347 B2 5/2007 Martin et al.
7,284,881 B2 10/2007 Kim et al.
7,287,878 B2 10/2007 Miller
7,315,049 B2 1/2008 Raos et al.
7,334,361 B2 2/2008 Schrimpf et al.
7,355,562 B2 4/2008 Schubert et al.
7,450,085 B2 11/2008 Thielemans et al.
7,473,020 B2 1/2009 Pickering
7,498,933 B2 3/2009 Pederson
7,543,976 B2 6/2009 Abogabir
7,576,707 B2 8/2009 Nishimura
7,605,772 B2 10/2009 Syrstad
7,612,736 B2 11/2009 Nakajima
7,614,771 B2 11/2009 McKechnie et al.
7,665,874 B2 * 2/2010 Chadwell et al. ............. 362/561
7,682,043 B2 3/2010 Malstrom et al.
7,688,280 B2 3/2010 Callegari et al.
7,694,444 B2 * 4/2010 Miller et al. .................... 40/446
7,703,941 B2 4/2010 Lee
7,774,968 B2 8/2010 Nearman et al.
7,779,568 B2 8/2010 Gettelfinger et al.
7,797,865 B2 9/2010 Patel et al.
7,823,308 B1 * 11/2010 Munson et al. ................. 40/564
7,868,903 B2 1/2011 Wendler et al.
7,869,198 B1 1/2011 Nearman et al.
7,926,213 B1 * 4/2011 Kludt et al. ..................... 40/605
7,928,968 B2 4/2011 Shon et al.
7,950,174 B2 * 5/2011 Xu .................................. 40/624
7,971,378 B2 7/2011 Campoy Odena
8,007,121 B2 8/2011 Elliott et al.
8,016,452 B2 9/2011 Dunn
8,066,403 B2 * 11/2011 Sanfilippo et al. ............ 362/219
8,074,387 B2 12/2011 Mancuso
8,104,204 B1 * 1/2012 Syrstad ........................... 40/573
8,111,208 B2 2/2012 Brown
8,154,864 B1 * 4/2012 Nearman et al. ......... 361/679.46
8,156,672 B2 * 4/2012 Xu .................................. 40/624
8,172,097 B2 5/2012 Nearman et al.
8,183,794 B2 5/2012 Grajcar
8,228,261 B2 7/2012 Callegari et al.
8,246,220 B2 8/2012 Epstein et al.
8,269,700 B2 * 9/2012 Joffer et al. ..................... 345/76
8,344,410 B2 * 1/2013 Wendler et al. ................. 257/99
8,350,788 B1 * 1/2013 Nearman et al. ................ 345/83
8,362,696 B2 1/2013 Zheng
D681,263 S * 4/2013 Van Eekeren et al. ....... D26/122
8,414,149 B2 4/2013 Nearman
8,434,898 B2 * 5/2013 Sanfilippo et al. ....... 362/249.02
8,558,755 B2 * 10/2013 Kharrati et al. ................ 345/1.1
8,599,108 B2 * 12/2013 Kline et al. ...................... 345/46
8,604,509 B2 * 12/2013 Wendler et al. ................. 257/99
2001/0037591 A1 11/2001 Nicholson et al.
2002/0122134 A1 9/2002 Kalua
2003/0058191 A1 3/2003 Yubara et al.
2003/0210236 A1 11/2003 Martin et al.
2004/0040248 A1 * 3/2004 Vilnes .......................... 52/653.1
2004/0104871 A1 6/2004 Boldt, Jr. et al.
2004/0123501 A1 7/2004 Safavi et al.
2005/0081414 A1 4/2005 Lutz et al.
2005/0151708 A1 7/2005 Farmer et al.
2005/0178034 A1 8/2005 Schubert et al.
2005/0212717 A1 9/2005 Baumstark
2005/0231949 A1 10/2005 Kim et al.
2005/0259036 A1 11/2005 Callegari et al.
2005/0259418 A1 11/2005 Callegari et al.
2006/0055641 A1 3/2006 Robertus et al.
2006/0056169 A1 3/2006 Lodhie et al.
2006/0171148 A1 8/2006 Huang
2006/0244681 A1 11/2006 Nakajima
2006/0254103 A1 * 11/2006 Strick et al. ..................... 40/605
2006/0279493 A1 12/2006 Syrstad
2007/0000849 A1 1/2007 Lutz et al.
2007/0008259 A1 1/2007 Baker
2007/0068055 A1 3/2007 Segan et al.
2007/0081341 A1 4/2007 Raos et al.
2007/0086187 A1 4/2007 Raos et al.
2007/0086188 A1 4/2007 Raos et al.
2007/0086189 A1 4/2007 Raos et al.
2008/0130282 A1 6/2008 Negley
2008/0141571 A1 6/2008 Kowittz
2008/0141572 A1 6/2008 Tomich et al.
2008/0263924 A1 10/2008 Nearman et al.
2008/0266206 A1 10/2008 Nelson et al.
2009/0009103 A1 1/2009 McKechnie et al.
2009/0015997 A1 1/2009 Barajas et al.
2009/0040137 A1 2/2009 Callegari et al.
2009/0058760 A1 3/2009 Aoki
2009/0128461 A1 5/2009 Geldard et al.
2009/0146910 A1 6/2009 Gardner
2009/0146918 A1 6/2009 Kleine et al.
2009/0146919 A1 6/2009 Kleine et al.
2009/0147028 A1 * 6/2009 Sefton et al. .................. 345/690
2009/0190353 A1 7/2009 Barker
2009/0241388 A1 10/2009 Dunn
2009/0284978 A1 11/2009 Elliot et al.
2009/0289160 A1 11/2009 Kludt et al.
2010/0019535 A1 1/2010 Chang et al.
2010/0090934 A1 4/2010 Elliot et al.
2010/0123732 A1 5/2010 Jenks et al.
2010/0171686 A1 7/2010 Callegari et al.
2010/0251583 A1 10/2010 Brown et al.
2010/0309185 A1 * 12/2010 Koester et al. ................ 345/211
2011/0002129 A1 1/2011 Zheng et al.
2011/0019414 A1 1/2011 Jiang et al.
2011/0051409 A1 3/2011 Nearman
2011/0057215 A1 3/2011 Chen et al.
2011/0072697 A1 3/2011 Miller
2011/0074833 A1 3/2011 Murayama et al.
2011/0085321 A1 4/2011 Eli
2011/0089824 A1 4/2011 Zheng
2011/0090138 A1 4/2011 Zheng
2011/0102307 A1 5/2011 Wendler
2011/0116232 A1 5/2011 Brown et al.
2011/0133659 A1 * 6/2011 Li et al. ......................... 315/193
2011/0181495 A1 7/2011 Chu et al.
2011/0188235 A1 8/2011 Bollmann
2011/0188981 A1 8/2011 Bonn
2011/0215992 A1 9/2011 Kleine et al.

(56) References Cited

U.S. PATENT DOCUMENTS

| | | | |
|---|---|---|---|
| 2011/0219650 | A1 | 9/2011 | Wright |
| 2011/0221662 | A1 | 9/2011 | Klein et al. |
| 2011/0235332 | A1 | 9/2011 | Cheung |
| 2012/0206277 | A1 | 8/2012 | Cai |

FOREIGN PATENT DOCUMENTS

| | | |
|---|---|---|
| WO | WO2009008964 | 1/2009 |
| WO | WO2009008986 | 1/2009 |
| WO | WO2009064219 | 5/2009 |
| WO | WO2009104982 | 8/2009 |

* cited by examiner

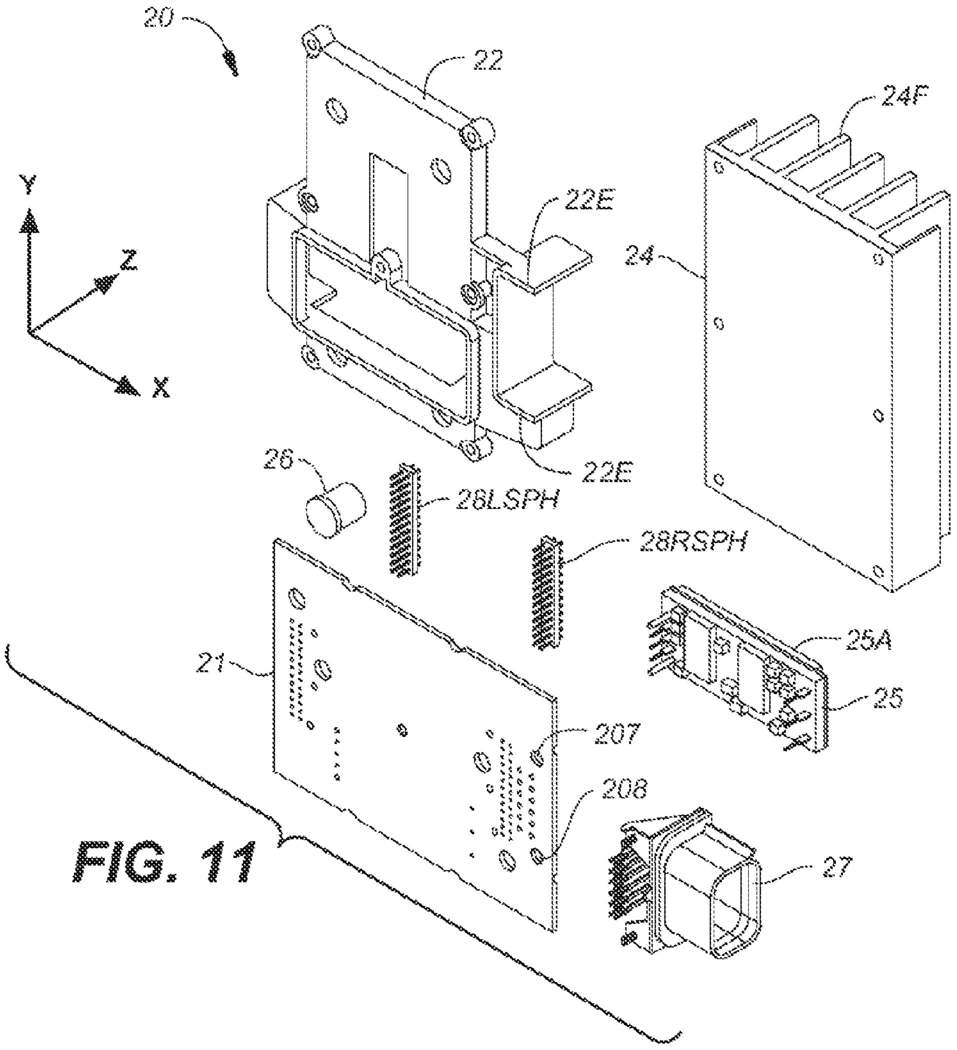
FIG. 11
FIG. 12
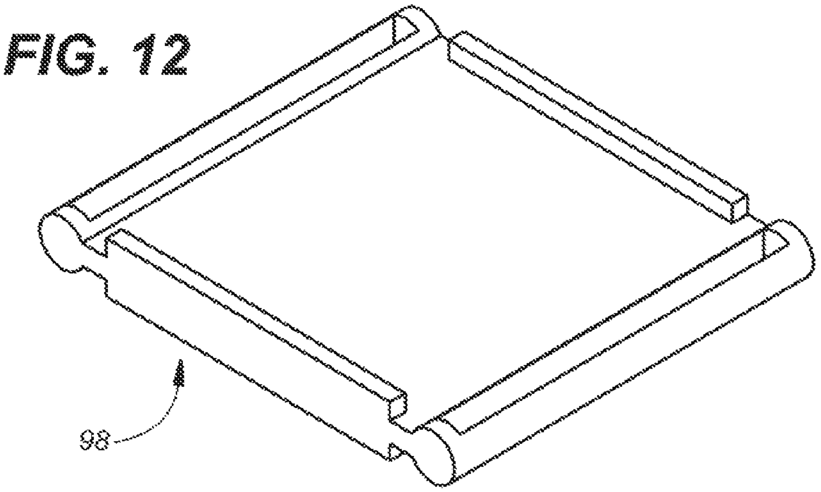

MODULAR INSTALLATION AND CONVERSION KIT FOR ELECTRONIC SIGN STRUCTURE AND METHOD OF USING SAME

RELATED APPLICATIONS

This application is a continuation-in-part patent application of U.S. patent application Ser. No. 14/056,017 entitled, "Modular Wire Harness Arrangements and Methods of Using Same for Backside to Frontside Power and Data Distribution Safety Schemes", by Arne E. Carlson, et al. filed on Oct. 17, 2013 and a continuation-in-part patent application of U.S. patent application Ser. No. 14/044,620 entitled, "Compound Structural Frame and Method of Using Same for Efficient Retrofitting", by David Franklin Cox, et al. filed on Oct. 2, 2013 and a continuation-in-part patent application of U.S. patent application Ser. No. 13/844,832, entitled, "In Field Kit for Converting a Non Electronic Billboard into an Electronic Billboard, and Methods of Retrofitting and Using Same", by David Franklin Cox, et al. filed on Mar. 16, 2013, which applications are incorporated herein as though fully set forth.

FIELD OF THE INVENTION

This invention relates generally to roadside and building signage, and more particularly to an out of the box signage kit to facilitate in field conversion of a static billboard having an anchored planar mounting structure into a dynamic electronic sign for roadside or building signage use.

BACKGROUND OF THE INVENTION

Retrofitting non-digital billboards have proven to be expensive, time consuming and labor intensive. Moreover, simply removing an older non-digital billboard and replacing it with a new digital billboard has not proven entirely satisfactory since older installed, non-digital, billboard panels represent substantial capital outlays making it financially difficult, if not impossible, to discard such panels arbitrarily for replacement with digital panels. Therefore, it would be highly desirable to have a new and improved billboard retrofit kit that can be easily and quickly installed on any structural surface, such as an existing billboard, without the need to replace or discard existing media mounting panels. The new and improved billboard retrofit kit should greatly improve displayed information, displaying such advertising information, with improved resolution, contrast and brightness characteristics. Moreover, the retrofit kit should enable the displayed content to be easily and quickly changed or updated, either on-site or remotely, at a lesser cost than updating the content of an older billboard. Finally, installation of the kit in the field on an existing billboard structure should not require any special installation equipment and should be able to be accomplished by one or two individuals in a fast and convenient manner.

SUMMARY OF THE INVENTION

Throughout this specification the word "comprising", or variations such as "comprise", or "comprises", will be understood to imply the inclusion of a stated element, integer or step, or group of elements, integers or steps, but not the exclusion of any other element, integer or step, or group of elements, integers, or steps.

In a first aspect, the present invention is a universal display module for a build-in-place billboard sign whereby the display module is mountable into any one of an array of structural bay members, each bay member including a plurality of latches and a single structural bay connector, the display module comprising: a generally rectangularly shaped display frame having a frontside and a backside and defining lateral and mutually perpendicular X and Y axes when viewed from the frontside or backside of the display frame and a Z-axis that is perpendicular to the lateral axes, the backside of the frame including a plurality of latch receivers each configured to receive an individual one of the plurality of latches in a direction perpendicular to the Z-axis, the backside of the display frame including a module connector configured to couple to the structural bay connector; and at least one LED board coupled to the frontside of the frame to emit light along the Z-axis when the display module is properly installed in the bay.

In one embodiment, the at least one LED board includes two LED boards disposed in a side-by-side arrangement along the X-axis.

In another embodiment, the display module further comprising: a driver board mounted to the backside of the display frame and electrically coupled to the module connector and to the at least one LED board.

In a still further embodiment, the display module further comprising: a heat sink coupled to the driver board and including cooling fins extending parallel to the Z-axis.

In yet another embodiment, the backside of the display frame includes a plurality of perforated channels and wherein a potting compound fills a portion of a space between the LED board and the frame and interlocks with at least a portion of the perforated channels.

In still yet another embodiment, one of the latch receivers is configured to receive a latch in a direction parallel to the X-axis and another of the latch receivers is configured to receive a latch in a direction parallel to the Y-axis.

In a still further yet another embodiment, the X-axis is the major axis, the Y-axis is the intermediate axis, and the Z-axis is the minor axis.

In still yet another embodiment an access hole formed into the module along the Z-axis is adjacent to each of the latch receivers providing access for a tool that is utilized to actuate each bay latch.

According to a second aspect, the present invention is an electronic display or billboard comprising: a plurality of hand mountable structural frames arranged on a set of poster panels or boards of an existing in field non electronic static billboard; the structural frames being laid out on the poster boards as an array of frames, individual ones of the structural frames being configured in a further array of structural bays that help facilitate power and data wire routing; individual ones of the structural bays configured in pairs for accepting corresponding pairs of display panels that facilitate the display of dynamic visible radiant energy; a power and data harness is electrically and mechanically coupled between individual ones of the structural bays and a utility power data controller box receives data display information and universal electrical power and then rectifies the electrical power and controls the data display information for distribution to the individual ones of the display panels, and each individual display panel having a plurality of light emitting diodes to facilitate the conversion of the distributed data display information into visible radiant energy for display by the electronic billboard.

According to a third aspect, the present invention is a method of manufacturing a digital sign or display in place from an existing billboard panel, the existing billboard panel having a panel frontside for viewing and a panel backside, the manufacturing method generally comprising the steps of:

aligning and affixing an array of hand mountable structural frames across the panel frontside, each hand mountable structural frame having a frame frontside and a frame backside, each frame backside facing the panel frontside, the frontside of the frames collectively defining an array of structural bays; routing a power and data system from the panel backside to the panel frontside and to each bay of the array of bays whereby the power and data system disposes at least one connector providing data and power connections into each bay; and coupling a display module to each of the bays including, for each module and bay (1) electrically coupling the at least one connector to the module, (2) positioning each module upon the bay, and (3) securing the display module to the bay.

In one embodiment of the third aspect, is that the existing billboard panel is a structural back panel selected from a group of back panel materials consisting of steel, wood, structural foam, alloy metals, and plastic compositions.

In another embodiment of the third aspect, the step of aligning and affixing the hand mountable structural frames includes: abutting the frames wherein the abutment of frames provides a relative alignment between the frames.

In yet another embodiment of the third aspect, each of the hand mountable structural frames have mounting bosses as drill guides and wherein the method further includes the steps of drilling through the existing panel using the mounting bosses; and bolting the structural frames to the existing panel.

In still yet another embodiment of the third aspect, the method of manufacturing a digital sign further comprising: mounting at least one utility box to the backside of the existing billboard panels wherein the at least one utility box provides at least power to the routed power and data system.

In yet another embodiment of the third aspect, the step of routing the power and data system includes routing and coupling a plurality of power and data harnesses from the utility box to at least some of the structural bays.

In yet another embodiment of the third aspect, the frontside of each structural frame defines a plurality of bays each structural bay being configured to receive one of the display modules.

In another embodiment of the third aspect, the frame backside geometrically cooperates with the panel frontside to define a vertical cooling conduit therebetween, each structural frame includes an opening that couples the bay to the cooling conduit, each module includes a set of cooling fins whereby positioning the module upon the bay positions the set of cooling fins in the cooling conduit.

In yet another embodiment of the third aspect, each bay includes a plurality of bay latching features, each display module includes a corresponding plurality of module latching features and alignment features which facilitate the alignment and securing of the display module within an associated structural bay; the bay latching features engaging with the module latching features.

According to an fourth aspect, the present invention is a sign that has been manufactured in place upon an existing panel, the existing panel having a panel frontside for viewing and a panel backside, the sign comprising: at least one utility box mounted to the panel backside; an array of structural frames, each structural frame having a frame backside mounted against the panel frontside and a frame frontside defining at least one bay whereby the array of structural frames defines an array of bays, each bay including a bay alignment feature; a power and data system routing power and data from the at least one utility box, through an opening in the panel that passes from the panel backside to the panel frontside, and distributing the power and data to at least one bay connector in each of the array of bays; and a display module disposed upon each of the bays, each display module including: a module connector that is coupled to the at least one bay connector; and a module alignment feature engaged with the bay alignment feature to properly position the display module.

In one embodiment of the fourth aspect, the sign utility box is configured to rectify a universal line voltage to a DC voltage such that the power and data system routes DC voltage to each of the bays.

In another embodiment of the fourth aspect, each frame frontside defines a plurality of bays upon which is disposed one of the modules.

In yet another embodiment of the fourth aspect, the at least one channel is defined in each frame backside whereby the frame backside cooperates with the panel frontside to define a cooling channel, each bay includes an opening that connects the bay to the cooling channel, each module includes a backside with cooling fins that extend through the opening and into the cooling channel.

In still yet another embodiment of the fourth aspect, the display module is completely weatherized.

In yet another embodiment of the fourth aspect, the structural frame array is bolt mounted to the plurality of poster panels to resist substantial wind load forces defined within commercial building code signage standards.

In another embodiment of the fourth aspect, each individual structural frame is composed of a structural foam material.

According to an fifth aspect, the present invention is a support for plural display modules, comprising: a compound structural frame having a front surface for defining a plurality of structural bay members for receiving and supporting therein the plural display modules and a back surface for interfacing with a planar billboard front surface and for defining a plurality of open channel features extending longitudinally from a top surface of the frame to a bottom surface of the frame, the plurality of open channel features cooperating with the planar billboard front surface to facilitate the formation of a plurality of air flow paths for cooling the plural display modules when the back surface is mounted in a face to face relationship with the planar billboard front surface and the plural display modules are received and supported within corresponding ones of the plurality of structural bay members; and wherein the front surface is provided with plural passageway openings in fluid communication with the plurality of open channels to facilitate cooling the plural display modules when they are supported within corresponding ones of the plurality of structural bay members.

In one embodiment of the fifth aspect of the present invention, each individual one of the plurality of structural bay members and each individual one of the plural display modules are provided with complementary alignment features for facilitating the frontside slidable mounting of individual ones of the plural display modules into individual ones of the plurality of structural bay members; and wherein each individual one of the plurality of structural bay members includes a set of structural bay upstanding alignment posts dimensioned to slidingly receive thereon a rear side set of display module alignment receptacles to help facilitate the frontside slidable mounting of individual ones of the plural display modules into individual ones of the plurality of structural bay members so that the plural display modules are arranged in an array having a substantially planar front face configuration for helping to distribute and resist wind load forces directed against the support.

In another embodiment of the fifth aspect of the present invention each individual one of the plurality of structural bay members and each individual one of the plural display modules are further provided with complementary latching features for removably latching individual ones of the plural display modules into individual ones of the plurality of structural bay members; and wherein each individual one of the plurality of structural bay members includes a plurality of frame latch assembly units oriented either in a lateral direction or a vertical direction relative to the compound structural frame to latchingly engage individual ones of the plural display modules in multi-latching directions so that individual one of the plural display modules are secured and protected against wind load forces in excess of 100 pounds per square foot and degradation from the effects of ultra-violet sunlight.

In yet another embodiment of the fifth aspect of the present invention the compound structural frame is further provided with a plurality of interconnecting reference features, the plurality of interconnecting reference features including: a first set of tabs disposed on the compound structural frame; a first set of slots disposed on the compound structural frame; the first set of tabs and the first set of slots in combination defining a plurality of top to bottom dovetail joints to facilitate interconnecting pairs of compound structural frames in flush top surface to flush bottom surface alignment along a longitudinal axis of the planar billboard front surface; a second set of tabs disposed on the compound structural frame; a second set of slots disposed on the compound structural frame; the second set of tabs and the second set of slots defining a plurality of side to side dovetail joints to facilitate interconnecting pairs of compound structural frames in flush right side surface to flush left side surface alignment along a lateral axis of the planar billboard front surface; and wherein pairs of compound structural frames are interconnectable in an array of the plural display modules for providing a billboard display.

In still yet another embodiment of the fifth aspect of the present invention the compound structural frame is provided with plural vertical axis mounting holes and plural lateral axis mounting holes, the plural vertical axis mounting holes and the plural axis mounting holes being distributed in plural mounting hole locations throughout the compound structural frame and each being dimensioned for receiving therein a mounting screw to facilitate securing the structural frame to the planar billboard front surface so that a sufficient mounting force may be applied to the compound structural frame to substantially eliminate face to face separation of the compound structural frame and the planar billboard front surface in wind load forces in excess of 100 pounds per square foot.

According to an sixth aspect, the present invention is a support for plural display modules, comprising: a compound structural frame member having a sufficient number of frame cutout areas to minimize frame weight to no greater than fifty pounds for hand lifting and mounting to a planar billboard surface, but not such a sufficient number of frame cutout areas to compromise the structural integrity of the frame member for resisting wind load forces in excess of 100 pounds per square foot when mounted to the planar billboard surface while supporting the plural display modules; and wherein the compound structural frame member is composed of structural foam to help minimize frame weight for hand lifting and mounting of the compound structural frame member to the planar billboard surface by one person without the use of a mechanical frame lifting device.

In one embodiment of the sixth aspect of the present invention the compound structural frame member includes a front portion having a locating feature, the locating feature providing a visual indication of top and bottom mounting orientation of the compound structural frame and further providing a visual indication for drilling a power pilot hole and a data pilot hole in the planar billboard front surface to facilitate the routing of preformed power and data wiring harnesses within the compound structural frame member.

In another embodiment of the sixth aspect of the present invention the front portion defines a plurality of structural bay members for receiving and supporting therein the plural display modules; and wherein each individual one of the plurality of structural bay members is provided with a plurality of wire routing features to further facilitate the routing of the preformed power wiring harnesses within the compound structural frame member for providing the plural display modules with electrically power.

In yet another embodiment of the sixth aspect of the present invention the compound structural frame member further includes a back portion configured to interface in a face to face relationship with the planar billboard surface and to be mounted thereto with a sufficient mounting force to substantially eliminate face to face separation in wind load forces in excess of 100 pounds per square foot; and wherein the plurality of structural bay members are arranged in rows and columns, the rows being defined by a plurality of front face surface lateral ribs bounding the frame cutout areas and a centrally disposed longitudinal rib bounding columns of structural bay members, the lateral and longitudinal ribs functioning as visual cutting line guides enabling the compound structural frame to be cut to a customized size ranging from a maximum full frame size for supporting and receiving the plural display modules to a minimum structural bay member size for supporting and receiving an individual one of the plural display modules.

According to a seventh aspect, the present invention is a support for plural display modules, comprising: a compound structural frame having a back surface, a front surface, and plural peripheral edges coupling the back surface and the front surface for defining a plurality of structural bay members for receiving and supporting therein the plural display modules; wherein the back surface is provided with a plurality of mounting features to facilitate coupling the back surface in a face to face relationship with a planar billboard surface; wherein the front surface is provided with another plurality of mounting features to facilitate mechanically and electrically coupling the plural display modules in the plurality of structural bay members to provide a billboard display coupled to the planar billboard surface; and wherein the plural peripheral edges are provided with complementary interconnecting features to facilitate interconnecting the compound structural frame with another compound structural frame to form an array.

According to one embodiment of the seventh aspect of the present invention the plurality of mounting features includes a plurality of open channel features extending along the entire longitudinal length of the frame member, wherein the plurality of open channel features cooperate with the planar billboard front-face surface to facilitate the formation of a plurality of air flow paths for cooling of the plural display modules when the back surface of the compound structural frame is mounted in a face to face relationship with the planar billboard front-face surface.

According to another embodiment of the seventh aspect of the present invention each individual one of the plurality of structural bay members has a sufficient number of cutout areas to provide a frame weight for hand lifting and mounting to the planar billboard front-face surface by a single person without the use of lifting equipment, but not such a sufficient number of cutout areas to compromise the structural integrity of the compound structural frame for resisting wind load forces in excess of 100 pounds per square foot when mounted to the planar billboard front-face surface while supporting the plural display.

According to yet another embodiment of the seventh aspect of the present invention the compound structural frame is composed of structural foam to help minimize frame weight for hand lifting and mounting of the compound structural frame to the planar billboard front-face surface by one person without the use of a mechanical frame lifting device and to facilitate the formation of the plurality of mounting features and the another plurality of mounting features.

According to still yet another embodiment of the seventh aspect of the present invention the plurality of mounting features includes a plurality of open channel features extending along the entire longitudinal length of the frame member, wherein the plurality of open channel features cooperate with the planar billboard front-face surface to facilitate the formation of a plurality of air flow paths for cooling of the plural display modules.

According to yet another embodiment of the seventh aspect of the present invention each individual structural bay member includes an opening dimensioned to receive therein a set of cooling fins extending from an individual one of the plural display modules; and wherein the opening is in physical communication with an individual one of the plurality of air flow paths to facilitate air flow bathing of the set of cooling fins for display module cooling purposes.

According to another embodiment of the seventh aspect of the present invention, the plurality of structural bay members are arranged in an array.

According to one embodiment of the seventh aspect of the present invention, the array of structural bay members is arranged in a five bay high by two bay wide configuration.

According to another embodiment of the seventh aspect of the present invention, the array of structural bay members are further defined by visual separation features to facilitate scaling the array of structural bay members into smaller array configurations, wherein the smallest array is a one bay high by one bay wide configuration.

According to yet another embodiment of the seventh aspect of the present invention, each individual one of the plurality of structural bay members includes a snap-in node receptacle feature and at least one wire routing protuberance-like feature for receiving and routing preformed power wiring harnesses to help facilitate providing electrical power to the plural display modules.

According to still yet another embodiment of the seventh aspect of the present invention' each individual one of the plurality of structural bay members and each individual one of the plural display modules are provided with complementary alignment and latching features; and wherein each individual one of the plurality of structural bay members includes a set of structural bay upstanding alignment posts dimensioned to slidingly receive thereon a rear side set of display module alignment receptacles to help facilitate the frontside slidable mounting of individual ones of the plural display modules into individual ones of the plurality of structural bay members so that the plural display modules are arranged in an array having a substantially planar front face configuration for helping to distribute and resist wind load forces directed against the support.

According to an eighth aspect, the present invention is a billboard sign having plural display modules mechanically coupled to a planar mounting structure, comprising: a plurality of compound structural frame members mounted to a front face area of the planar mounting structure and arranged in an frame array; at least one low voltage junction box mounted to a back face area of the planar mounting structure for facilitating the distribution of a source of low voltage constant current power to the plural display modules; at least one preformed harness electrically and mechanically coupled between the at least one junction box and the plural display modules; the at least one preformed wiring harness extending from the source of low voltage constant current power through the planar mounting structure and an individual one of the plurality of compound structural frame members and being mechanically coupled to a bay array of structural bay members defined by an individual one of the plurality of compound structural frame members and further being mechanically and electrically coupled to the plural display modules so that individual ones of the plural display modules can be mechanically and electrically disconnected from the billboard sign without shutting down power for the billboard sign.

In one embodiment of the eight aspect of the present invention each individual one of the plurality of compound structural frame members is provided with a pilot hole feature, the pilot hole feature being disposed in a bottom row of the individual one of the plurality of compound structural frame members for providing a visual indication of the front and bottom orientation of the individual structural frame members for frame mounting purposes; and wherein the pilot hole feature further providing another visual indication of a frame array access hole location to facilitate determining a back face mounting location of the at least one junction box to effect efficient harness routing of the at least one power harnesses from the back face area to the front face area for providing power to the plural display modules.

In another embodiment of the eighth aspect of the present invention each individual one of the plurality of compound structural frame members is provided with a plurality of receptacles; and wherein individual ones of the receptacles are disposed in individual ones of the structural bay members to facilitate coupling low voltage power to individual ones of the plural display modules.

In yet another embodiment of the eighth aspect of the present invention the at least one preformed power harness includes a junction box mounting end for mechanically and electrically coupling to the low voltage junction box and a plurality of power node mounting ends, each individual power node mounting end being dimensioned to mechanically engage an individual one of the receptacles; and wherein each individual power node mounting end including a connector power cord extension for electrically and mechanically coupling the low voltage constant current power source to individual ones of the plural display modules.

In still yet another embodiment of the eighth aspect of the present invention each individual one of the plurality of structural frame members is provided with pairs of harness pass-through openings to facilitate routing of the preformed harness between two adjacent structural frame members.

In yet another embodiment of the eighth aspect of the present invention each individual one of the structural bay members in the bay array is provided with a plurality of receptacles to facilitate mechanically and electrically coupling the at least one preformed wiring harness to the plural display modules.

In another embodiment of the eighth aspect of the present invention at least one preformed harness is provided with a plurality of preformed nodes, each individual one of the plurality of preformed nodes is dimensioned to be pressed or snapped into position in a corresponding wire harness node receptacle forming part of the plurality of receptacles for mechanically securing the at least one preformed wiring harness within the structural frame and for electrically coupling the plural display modules to the source of low voltage constant current power.

In one embodiment of the eighth aspect of the present invention the billboard sign further comprising: a utility power data controller box mounted to another back face area of the planar mounting structure to facilitate receiving electronic data and a universal source of electrical energy and for rectifying the universal source of universal power into a source of low voltage constant current power and for controlling data distribution to the plural display modules.

In another embodiment of the eighth aspect of the present invention the billboard sign further comprising: at least one preformed data harness for coupling data from the utility power data controller box to the plural display modules.

In yet another embodiment of the eighth aspect of the present invention, each individual one of the plurality of structural frame members is provided with a plurality of data routing features to facilitate routing the at least one preformed data harness within an individual one of the plurality of structural frame members.

In still yet another embodiment of the eighth aspect of the present invention, each individual one of the plurality of structural frame members is provided with a plurality of cut out areas to facilitate in-field hand wire routing of the at least one preformed data harness with an individual one of the plurality of structural frame members.

In yet another embodiment of the eighth aspect of the present invention, each individual one of the plural display modules is weatherized and is dimensioned to be received in an individual structural bay member to form with each adjacent display module a protective cover for the at least one preformed harness and the at least one preformed data harness.

According to a ninth aspect, the present invention is a billboard sign having plural display modules mechanically coupled to a planar mounting structure, comprising: a low voltage junction box mounted to a backside of the planar mounting structure for facilitating the distribution of a low voltage constant current power source to the plural display modules; at least one structural frame member for mechanically coupling the plural display modules to a frontside of the planar mounting structure, the frame member defining an array of display module receiving bays arranged in rows and columns; each individual display module receiving bay including a receptacle feature to facilitate mechanically and electrically coupling the low voltage constant current power source to an individual one of the plural display modules; and at least one preformed power harness having a junction box mounting end for mechanically and electrically coupling to the low voltage junction box and plural power node mounting ends, each individual power node mounting end being configured to be received and secured into an individual node receptacle feature and including an electrical cord extension and connector for electrically coupling the low voltage constant current power source to an individual one of the plural display modules.

In one embodiment of the ninth aspect of the present invention, each display module receiving bay includes a complementary alignment feature for front loading an individual one of the plural display modules in sufficiently close proximity to the electrical cord extension and connector to electrically and mechanically coupled the individual one of the plural display modules to the at least one preformed power harness.

According to a tenth aspect, the present invention is a large format billboard type electronic sign having an anchored planar mounting structure, the sign comprising: at least one structural frame member mounted to a front side of the planar mounting structure, the structural frame defining a plurality of structural bay members configured for receiving and removably supporting therein a corresponding plurality of weatherized display modules to conceal and protect at least one preformed wiring harness from wind load forces in excess of 100 pounds per square foot; wherein each individual one of the plurality of structural bay members is provided with a plurality of receptacles to facilitate mechanically and electrically coupling the at least one preformed wiring harness to the plurality of weatherized display module; and wherein the at least one preformed wiring harness is provided with a plurality of preformed nodes, each individual one of the plurality of preformed nodes is dimensioned to be snapped or pressed into position in a wire harness node receptacle forming part of the plurality of receptacles for mechanically securing the at least one preformed wiring harness within the structural frame and for electrically coupling the plurality of weatherized display modules to a source of low voltage power.

In one embodiment of the tenth aspect of the present invention, each individual one of the plurality of preformed nodes includes a power connector to mechanically and electrically couple the source of low voltage power to an individual weatherized display module.

In another embodiment of the tenth aspect of the present invention, the at least one preformed wiring harness is further provided with a plurality of data connectors, each individual ones of the data connectors for interconnecting with a preformed data wiring harness to facilitate distributing data throughout the structural frame for utilization by each weatherized display module.

In yet another embodiment of the tenth aspect of the present invention, the plurality of receptacles includes a plurality of data connection wire routing receptacles, including a left side data connection wire routing receptacle to facilitate anchoring another preformed data wiring harness for interconnection between at least another structural frame having a right side portion thereof abutting a left side portion of the structural frame and a right side data connection wire routing receptacle to facilitate anchoring the preformed data wiring harness for interconnection between at least yet another structural frame having a left side portion thereof abutting a right side portion of the structural frame.

In still yet another embodiment of the tenth aspect of the present invention, the plurality of receptacles further includes a central data connection wire routing receptacle to facilitate anchoring the preformed data wiring harness and the another preformed data wiring harness with an individual one of the structural bay members to further facilitate the distribution of data within the structural frame.

In yet another embodiment of the tenth aspect of the present invention, the at least one structural frame is provided with a pilot hole feature, the pilot hole feature being disposed in a bottom row of the plurality of structural bay members for providing a visual indication of the front and bottom orientation of the structural frame for frame mounting purposes to the anchored planar mounting structure; and wherein the pilot hole feature further providing another visual indication of an access hole location to facilitate determining a back face mounting location of at least one electrical junction box to effect efficient routing of the at least one preformed wiring harness from a back face area of the mounting structure to the front face area of the least one structural frame.

According to an eleventh aspect, the present invention is a modification kit for converting an anchored planar mounting structure having a frontside and an opposing backside into a dynamic electronic sign, the modification kit comprising: a plurality of weatherized display modules; a plurality of structural frames for supporting the plurality of weatherized display modules, each structural frame having a back portion for mounting to the frontside of the anchored planar mounting structure and a front portion defining a plurality of bay members for receiving corresponding ones of the plurality of weatherized display modules; and at least one wiring harness including a first end for coupling to a power source mounted on the backside of the anchored planar mounting structure and a plurality of power extensions for coupling the power source to the plurality of weatherized display modules.

In one embodiment of the eleventh aspect of the present invention, each individual one of the plurality of bays defines a receiving feature for receiving and aligning a portion of the at least one wiring harness within the bay to facilitate assembly of the at least one wiring harness to the bay.

In another embodiment of the eleventh aspect of the present invention, the receiving feature is a receptacle, and the at least one wiring harness including a portion to be received into each receptacle.

In yet another embodiment of the eleventh aspect of the present invention, the portion to be received into the receptacle is an overmolded node which is configured to be received into the receptacle and retained therein to help facilitate the routing of at least one of the plurality of power extensions to an individual one of the plurality of weatherized display modules.

In still yet another embodiment of the eleventh aspect of the present invention, each individual one of the plurality of structural frames includes pilot features for facilitating the forming of at least one bore through the anchored planar mounting structure to enable routing of the at least one wiring harness through the anchored planar mounting structure for facilitating the coupling of the power source to the plurality of weatherized display modules.

In yet another embodiment of the eleventh aspect of the present invention, each individual one of the plurality of structural frames is interchangeable with any other individual one of the plurality of structural frames; and each individual one of the plurality of structural frames is provided with a plurality of wind load resisting features to facilitate accommodating installation of the plurality of interchangeable structural frames in any wind zone specified for the anchored planar mounting structure.

In another embodiment of the eleventh aspect of the present invention, the plurality of bays are arranged in an array defined by a plurality of visual separation features to facilitate separating the array of bay members into smaller array configurations for customizing a display sign area to comply with the size of the anchored planar mounting structure.

In one embodiment of the eleventh aspect of the present invention, the modification kit further comprises a utility box mountable to the opposing backside of the planar mounting structure for facilitating the coupling of the power source to the at least one wiring harness and for receiving electrical energy to be rectified into a low voltage power source for use by the plurality of weatherized display modules to convert display data into visible radiant energy for instantaneous dynamic display purposes.

In another embodiment of the eleventh aspect of the present invention, each individual one of the plurality of interchangeable structural frames, when mounted to the frontside of the anchored planar mounting structure, defines a set of cooling conduits; where the set of cooling conduits are in fluid communication with individual ones of the plurality of display modules when mounted in individual ones of the plurality of interchangeable structural frames.

In yet another embodiment of the eleventh aspect of the present invention, each individual one of the plurality of interchangeable structural frames is provided with rows and columns of aligned wire routing features and node receptacles to help facilitate the routing and securing of the at least one wiring harnesses within the frame to enable power to be distributed throughout the structural frame in a daisy-chain manner.

In still yet another embodiment of the eleventh aspect of the present invention, the node receptacles are arranged in alignment to eliminate the need for special node to receptacle alignment markings to facilitate installation of the plurality of interchangeable preformed wiring harnesses without installation placement errors.

In yet another embodiment of the eleventh aspect of the present invention, each individual bay member has integrally formed therein a plurality of different types and kinds of wire harness receptacles distributed among a plurality of latching features, where the plurality of latching features are multi-directional and complementary to corresponding display module multi-directional latching features to help facilitate the mounting of individual ones of the plurality of display modules within individual ones of the plurality of bay members with a sufficient latching force to resist wind load forces in excess of 100 pounds per square foot.

In another embodiment of the eleventh aspect of the present invention, each individual one of the plurality of structural frames has a plurality of cutout areas in a sufficient number to minimize the frame weight of an individual one of the plurality of structural frames to no greater than 50 pounds, but not such a sufficient number of cutout areas to compromise the structural integrity of the individual structural frame for resisting wind load forces in excess of 100 pounds per square foot when the individual structural frame is mounted to a frontside surface of the anchored planar mounting structure.

According to a twelfth aspect, the present invention is a modification kit for sign conversion, comprising: a plurality of display modules for converting electrical data into visible radiant energy for display by an electronic sign; at least one compound structural frame for defining a plurality of structural bay members, each individual one of the plurality of structural bay members being configured for removably receiving, supporting and latching therein corresponding ones of the plurality of display modules each being mounted with a sufficient latching force to withstand a wind load force in excess of 100 pounds per square foot; wherein each individual one of the plurality of bay members has a sufficient number of cutout areas to provide a frame weight of no greater than 50 pounds for hand lifting and mounting the frame to a planar structure by a single person, but not such a sufficient number of cutout areas to compromise the structural integrity of the compound structural frame for resisting wind load forces of up to 100 pounds per square foot when mounted to the planar structure while supporting the plurality of display modules; and at least one preformed interchangeable wiring harness having a plurality of mechanical-electrical nodes for coupling a source of low voltage power from a backside to a frontside of the planar structure and then to the plurality of display modules.

In one embodiment of the twelfth aspect of the present invention, each individual one of said plurality of bay members is provided with a plurality of node receptacles for securing therein said plurality of mechanical-electrical nodes to facilitate coupling the source of lower voltage power at said frontside of the sign mounting structure to said plurality of display modules.

In another embodiment of the twelfth aspect of the present invention, the plurality of structural bay members are arranged in an array defined by a plurality of visual separation features to facilitate separating the array of structural bay members into smaller array configurations for customizing a display sign area to comply with the size of the planar structural surface.

In yet another embodiment of the twelfth aspect of the present invention, the at least one compound structural frame is provided with rows and columns of wire routing features and node receptacles to accommodate the at least one interchangeable wiring harness and to facilitate distribution of power and data throughout said at least one compound structural frame in a daisy-chain manner.

In still yet another embodiment of the twelfth aspect of the present invention, the at least one compound structural frame is provided with a plurality of interconnecting reference features, the plurality of interconnecting reference features including: a first set of tabs disposed on the compound structural frame; a first set of slots disposed on the compound structural frame; the first set of tabs and the first set of slots in combination defining a plurality of top to bottom dovetail joints to facilitate interconnecting pairs of compound structural frames in flush top surface to flush bottom surface alignment along a longitudinal axis of the planar structural surface; a second set of tabs disposed on the compound structural frame; a second set of slots disposed on the compound structural frame; the second set of tabs and the second set of slots defining a plurality of side to side dovetail joints to facilitate interconnecting pairs of compound structural frames in flush right side surface to flush left side surface alignment along a lateral axis of the planar structural surface; and wherein pairs of compound structural frames are interconnectable in an array to support therein the plurality of display modules for providing a billboard display sign.

In yet another embodiment of the twelfth aspect of the present invention, the at least one compound structural frame is provided with plural vertical axis mounting holes and plural lateral axis mounting holes, the plural vertical axis mounting holes and the plural lateral axis mounting holes being distributed in plural mounting hole locations throughout the at least one compound structural frame and each being dimensioned for receiving therein a mounting bolt or screw to facilitate securing the at least one structural frame to the planar structural surface so that a sufficient mounting force may be applied to the compound structural frame to substantially eliminate face to face separation of the compound structural frame and the planar structural surface in wind load forces in excess of 100 pounds per square foot.

According to a thirteenth aspect, the present invention is a self contained in-field retrofit kit for a static billboard coupled to a universal source of electrical power, the self contained kit comprising: at least one modular hand mountable compound structural frame for mounting to at least one poster panel of a static billboard, the at least one modular compound structural frame and the at least one poster panel cooperating to provide a plurality of self cooling vents and a plurality of wire routing paths between the at least one modular compound structural frame and the universal source of electrical power; wherein the at least one modular compound structural frame is provided with a plurality of receptacle nodes and wire routing guides to receive substantially identical power and data wire harnesses for coupling electrical energy along a plurality of wire routing paths within the compound structural frame; at least one modular electrical conversion device for mounting partially within an individual one of the plurality of self cooling vents and partially within the at least one modular compound structural frame, the at least one modular electrical conversion device for coupling to the universal source of electrical power via at least an individual one of the plurality of wire routing paths to transform the universal source of power to a constant power source; wherein the at least one modular electrical conversion device includes a plurality of electrical elements coupled to the constant power source and to the data source for converting electrical energy into visible radiant energy indicative of an electronic message intended for pubic viewing; and wherein the at least one modular electrical conversion device is further for coupling to a data source via the at least an individual one of the plurality of wire routing paths.

From the foregoing, it should be understood by those skilled in the art, that an existing static billboard may be retrofitted or converted into a dynamic electronic billboard, in a fast and convenient manner by an installer or a team of installers following a few simple and easy retrofitting steps. For example, an installer arrives at an in-the field billboard, performs a quick electrical inspection to (1) determine that the existing billboard or signage site is provided with adequate high voltage alternating current power; (2) next the installer deans the signage surface or poster panels of the static billboard of their current and old paper advertising posters; (3) next the installer inspects the poster panels for any uneven or sharp metal protrusions and then using conventional tools, such as a hammer, the installer removes any uncovered or discovered uneven or sharp metal protrusions from the poster panels since the poster panels should all be substantially flat and uniform for the retrofitting process; (4) the installer then verifies that all the poster panels are provided with substantially flat mounting surfaces and that all of the poster panels have been cleaned including removing any vinyl or paper left over from old static images; (5) the installer then verifies the overall length and width of the billboard poster panels in order to confirm the mounting surface area is within the standard size dimensions for the static billboard to be converted into a dynamic billboard of a given size; (6) then the installer determines whether the input power needs to be converted for use with the retrofit kit so that an optional power converter may be installed if necessary; (7) the installer then turns off the main power breaker disconnecting the main power source supplying power to the static billboard so the electricity supplied to the billboard site is temporarily shut off; (8) the installer then disconnects all static billboard lighting and associated wiring; and (9) then unpacks the various modular components of a retrofit kit which is constructed in accordance with the present invention to determine that all the modular components of the retrofit kit are present and accounted for to complete the conversion.

After completing the above-mentioned verification and preparation processes, the installers then simply (10) hand mount a plurality of hand mountable structural frame units in a frame array on the existing poster panels of the non electronic billboard; (11) next the team mounts bee stops to the structural frame array to protect the structures from insect, bee and pest invasions; (12) next, the installer using the resulting node receptacles, cable hooks, conduits paths and wiring paths created as the array of structural frames was installed begins installing the various power data wiring harnesses of the kit within the structural frames; (13) next, the installer makes provision within the structural frame array for coupling mechanically and electrically the installed harnesses from the frontside of the frames to the backside of the billboard, making connection to power data controller boxes and power junction boxes installed by the installer on the backside of the billboard; (14) next the display modules of the kit are received in alignment features of the structural bays and latched into their respective structural bay members; (15) the installer then establishes an electrical path from a high voltage circuit breaker to the now completely new dynamic billboard; and finally (16) the installer downloads a test message for display on the new dynamic billboard to verify that all its modular components are operating correctly.

Because of the many different types and kinds of roadside and outdoor and indoor building signs which may be converted, the principals that will be taught hereinafter will be generally directed to only two billboard sizes; namely, an 11 by 22 square foot billboard and a 14 by 48 square foot billboard comprised of 20 gauge metal poster panels. Nevertheless, there is no intention by this description to limit the scope of the present invention to only these specific sizes and applications. In this regard, the principles that will be taught hereinafter may be applied to other types and kinds of advertising displays so long as the mounting surface area is at least of a 20 gauge metal construction or other suitable construction materials such as concrete, wood and other material of sufficient thickness and strength to support the frames and within the dimensional limits of the underlying modular structural frames forming part of the retrofit kit that will be described. Even so, since the modular structural frames of the retrofit kit may be reduced in size, the only limitation therefore is that the surface area of the existing signage must be sufficient in dimension to receive the structural frames and be constructed of at least 20 gauge metal panel sheets. The kit as described herein is generally for utilized by a large format advertising display intended for viewing from an extended distance of generally more than 50 feet. However, because of the modular nature of the kit, signage of much smaller sizes may also be accommodated by the kit.

BRIEF DESCRIPTION OF DRAWINGS

The above mentioned features and steps of the invention and the manner of attaining them will become apparent, and the invention itself will be best understood by reference to the following description of the embodiments of the invention in conjunction with the accompanying drawings wherein:

FIG. 11 is an exploded view of a daughter board forming part of the display module of FIG. 10;

FIG. 12 is a perspective view of a bee stop utilized to occlude a wiring access opening forming part of the structural frame of FIG. 5;

DETAILED DESCRIPTION OF PREFERRED EMBODIMENTS

For reference purposes, whenever the term "frontside" is used it will always refer to the front viewing side of any element or component part that will be described hereinafter. Backside always opposes the frontside for any part or portion being discussed and is the reverse of the viewing side. Each surface is defined hereinafter in the following manner as a part frontside/backside.

Figure 1:
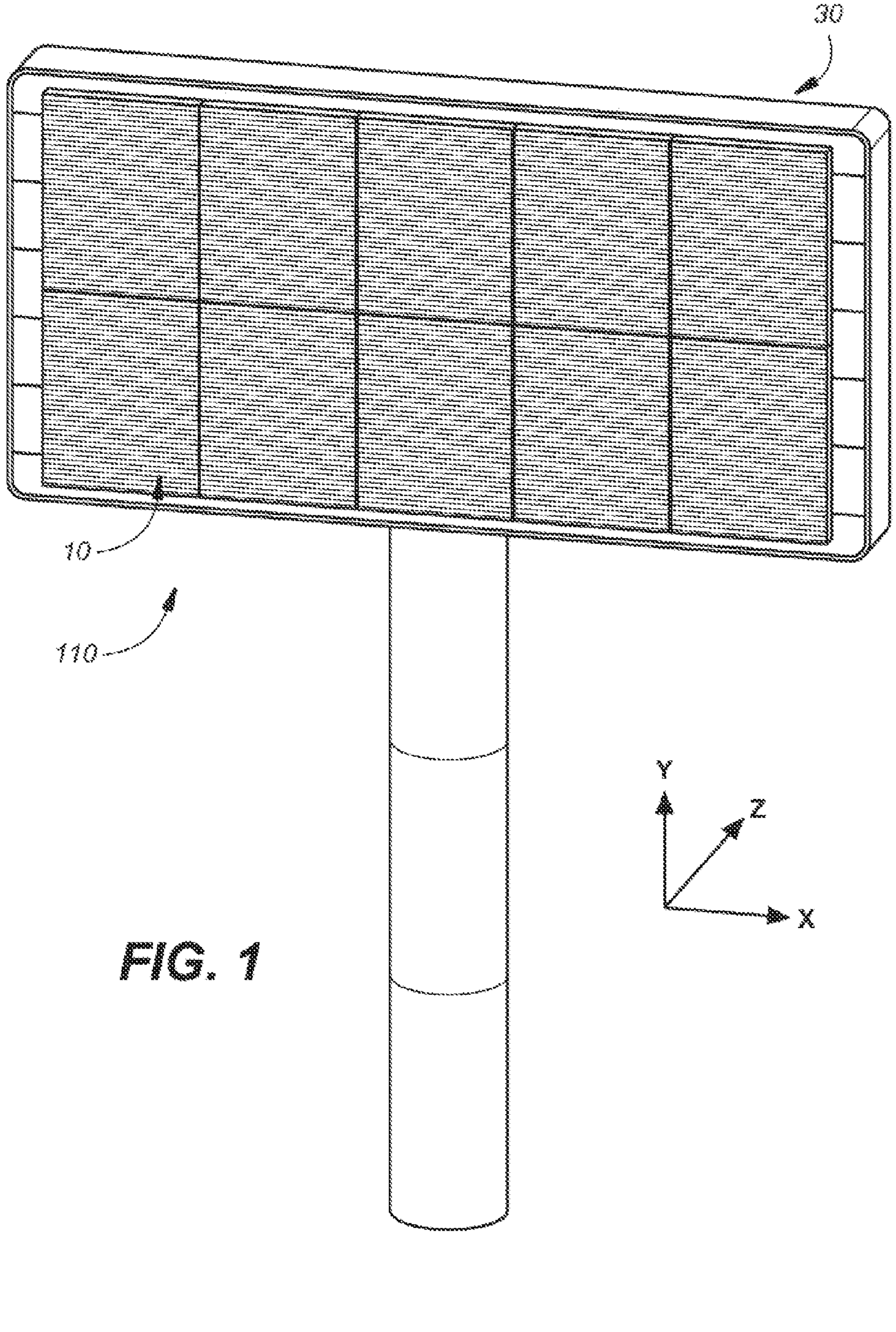
FIG. 1 is a perspective view of a digital billboard constructed in accordance with the present invention through the use of the in field modification kit of FIG. 1.
Figure 2:
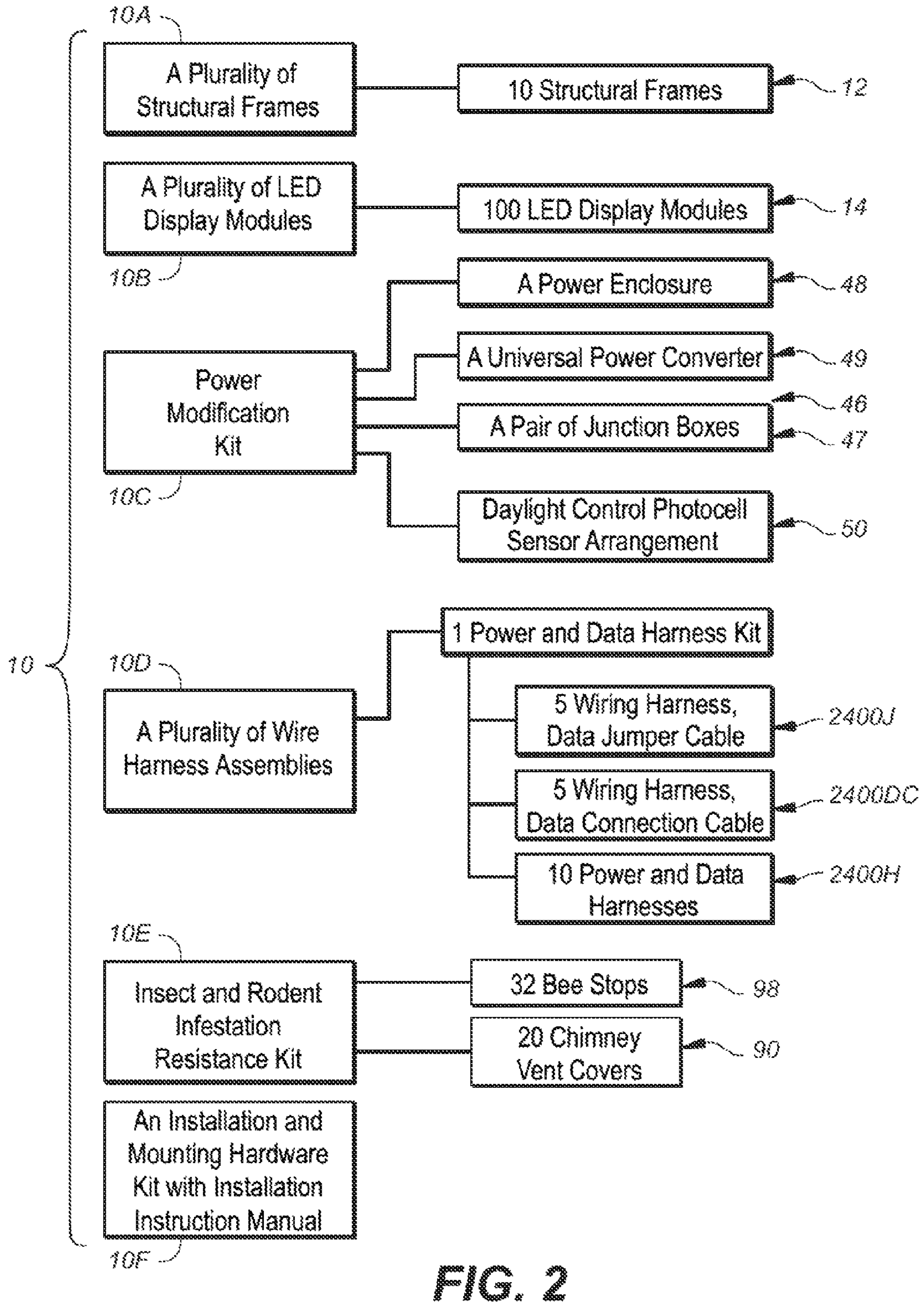
FIG. 2 is a diagrammatic block diagram of a field modification kit for converting a non electronic billboard sign into an electronic billboard sign, wherein the field modification kit is constructed in accordance with the present invention.
Figure 3:
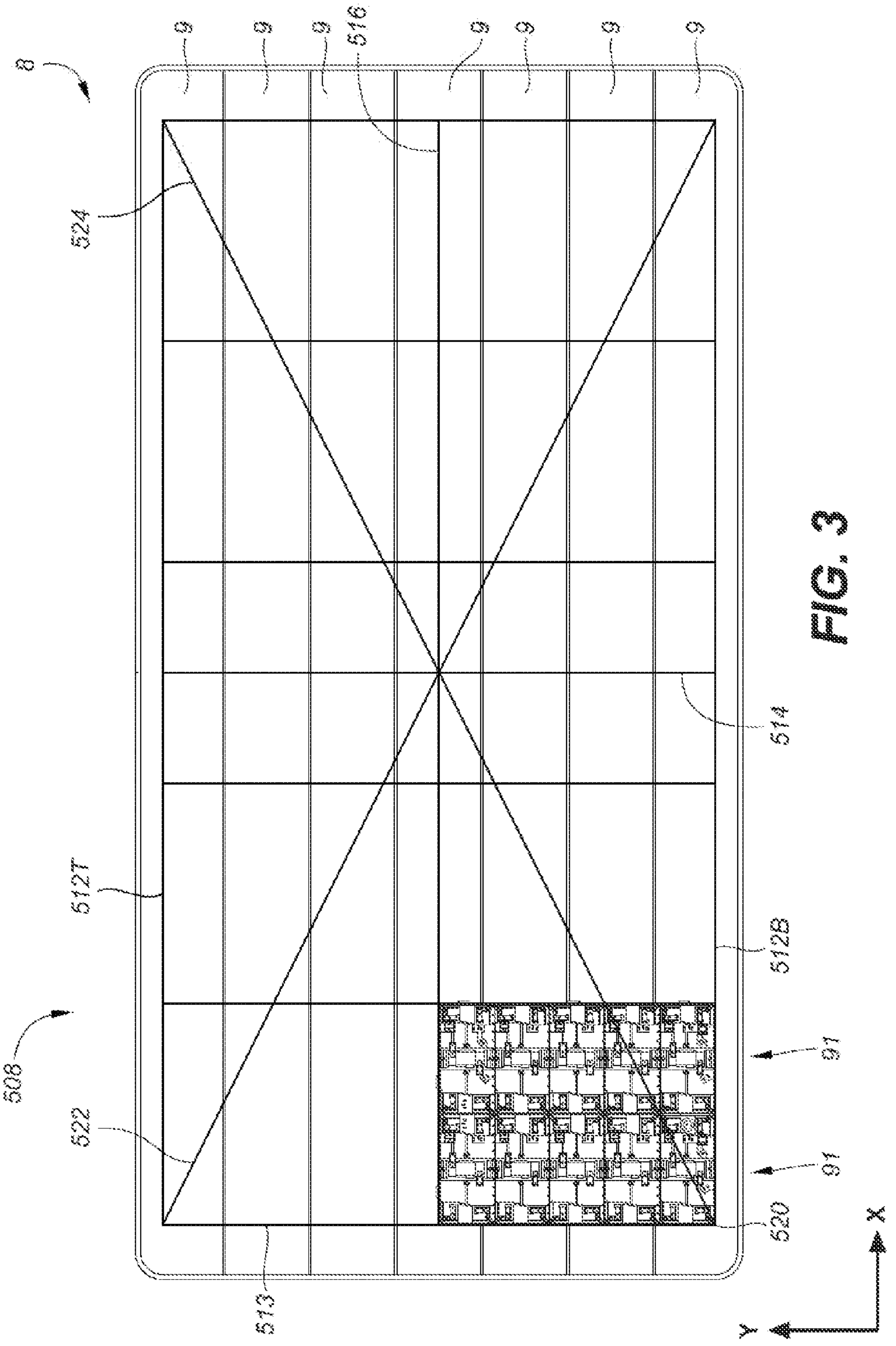
FIG. 3 is a front plane view of a non electronic billboard sign being provided with chalk marks for a grid layout indicative of the size and pattern of the structural frames being installed on the existing poster panels; modification kit is constructed in accordance with the present invention.

Referring now to the drawings and more particularly to FIGS. 1 and 2, there is illustrated a self contained retrofit kit 10 and a resulting dynamic electronic sign or billboard 110 respectively, which kit 10 and which billboard 110 are each constructed in accordance with the present invention. The electronic billboard 110, when constructed in accordance with a novel method of retrofitting or assembling 1010 (FIG. 19) as hereinafter disclosed, is assembled in a fast and convenient manner without the need of special tools or equipment. In short, by use of the in field retrofit kit 10, a static non-electronic billboard 8, as best seen in FIG. 3, is transformed or converted into a dynamic electronic billboard 110 that greatly improves displayed information, such as advertising information, with improved resolution, contrast, and brightness characteristics. The simplicity of the various hand mountable component parts of the electronic billboard 110 are such, that a team of two people or even a single installer, with a ladder, a drill, a skill saw, a hammer and a screwdriver are able to quickly and easily convert an existing static (non electronic) roadside or building billboard 8 into a high-tech digital billboard 110 regardless of location. For example, the kit 10 may be applied to rooftop signs, inside building signs, hung signs (i.e. hung from the underside of a catwalk), building wall mounted signs or pole mounted signs. The simplicity of the design enables a digital billboard 110 constructed in accordance with the present invention, to be utilized in a football stadium during the football season, and then if desired, disassembled and moved to a baseball stadium and re-assembled for billboard display presentations during the baseball season. Portability and easy of assembly and disassembly are unique and important novel features of the present invention.

For the purpose of this disclosure the term static non-electronic billboard or sign with respect to being retrofit by the retrofit kit 10, means any sign that has an advertising display mounting surface composed of steel, wood, concrete, masonry or other suitable mounting materials of a sufficient strength to support the array of structural frames provided in the retrofit kit 10. The advertising media of such a static non-electronic billboard or sign includes paper, paper panels and any other advertising media having permanent and non-changing indicia in the form of images, text, and symbols disposed thereon. Notwithstanding the foregoing, it is contemplated that the billboard 110 of the present invention may also be utilized to replace existing electronic signage, whether such electronic signage is of a roadside structure or an indoor or outdoor building structure configuration.

As will be explained hereinafter in greater detail, the electronic billboard 110 is constructed by the use of standardized ultra lightweight hand mountable structural frames composed of structural foam and fully integrated electronics for simple and quick, "plug and play" installation. The panelized or sectional construction of the billboard 110 as described herein allows for installation with no major structure modifications being required at the sign installation site. Existing alternating current power, for operation in the United States, such as a 2-phase, 40 amp, 240 VAC source or a 2-phase, 80 amp, 120 VAC source, supplied for illuminating the non electronic billboard 8 is all that is required for the fully integrated electronics forming part of the billboard 110. Power converters, as optional equipment, may be provided so the conversion process may utilize "universal power" as provided anywhere in the world for driving the fully integrated electronics forming part of the billboard 110 as will be explained hereinafter in greater detail.

The modular nature of the billboard 110 and the hand mountable component parts of the in field modification kit 10 allow for installation in a fast and convenient manner. The frame construction utilizing by the kit 10, coupled with "plug and play" electronic technology allows for a customer to retrofit virtually any existing non electronic billboard 8 into a sophisticated electronic billboard 110 capable of displaying instantaneously changing images and textual information for achieving significantly improved advertising results than previously provided for by the static billboard 8.

In summary then, the in field modification kit 10 when used in accordance with the method of retrofitting 1010 facilitates the conversion of a static non electronic billboard 8 into a dynamic electronic billboard display 110, which obtains for a customer several unique and novel advantages:

1. The in field modification kit 10 enables a static billboard display 8 to be easily and quickly converted into a dynamic billboard 110, where displayed information can be changed instantaneously and remotely as needed via a power data routing system that will be described hereinafter in greater detail;

2. The simplicity of the kit design allows for the installation by an installation team or even a single installer without sophisticated installation training;

3. The converted electronic billboard 110 is relatively inexpensive to operate using low power consumption electronic devices;

4. The integration of the existing on-site power utilized to illuminate a static billboard coupled with the use of standardized modular components with integrated preformed power and data cables allows for quick and easy installation;

5. The utilization of a structural frame construction that duplicates itself coupled with the utilization of a display module construction which also duplicates itself completely eliminates the common need of section identification markers normally required of sectional signs, such as the sectional sign of the present invention;

6. The utilization of a ultra-light frame construction permits the retrofit kit of the present invention to be easily and conveniently transported to any remote sign location for installation by hand without the need of any special moving equipment; and 7. The simplicity of the dynamic billboard design allows for the use of existing poster panels in an existing static billboard making the retrofit process highly efficient.

The Retrofit Kit

Figure 8:
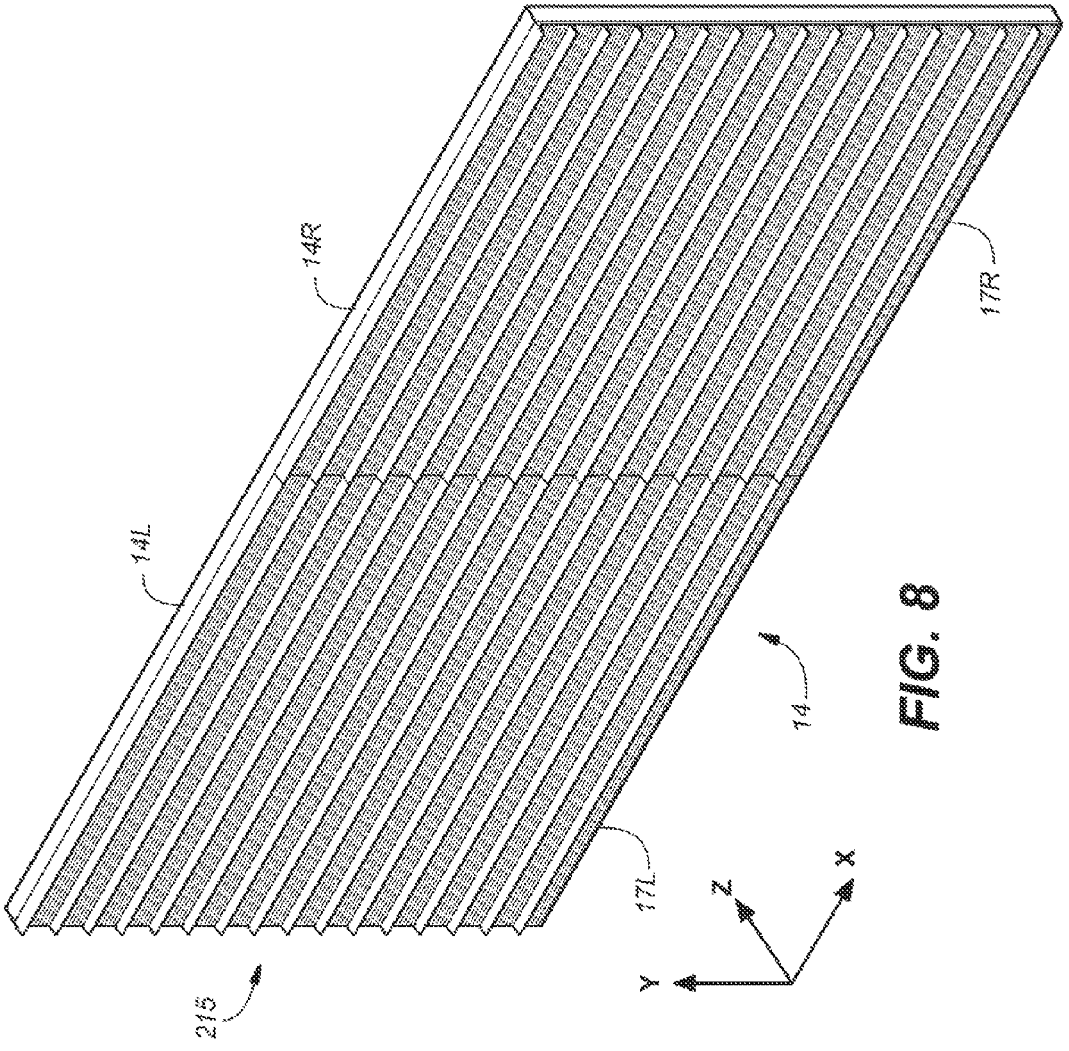
FIG. 8 is an enlarged frontside perspective view of a display module forming part of the field modification kit of FIG. 2.
Figure 9:
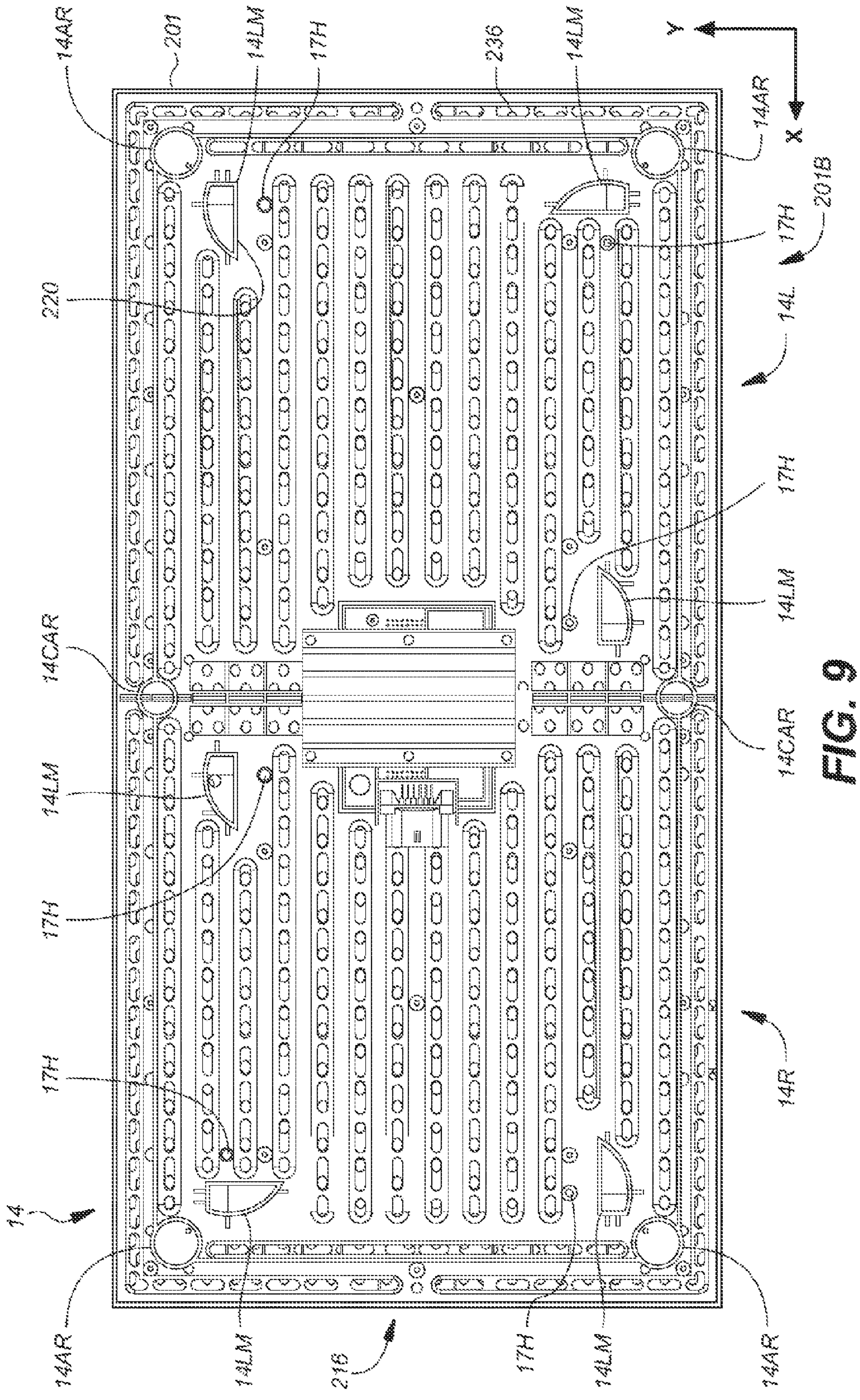
FIG. 9 is an enlarged backside plane view of the display module of FIG. 8.
Figure 23:
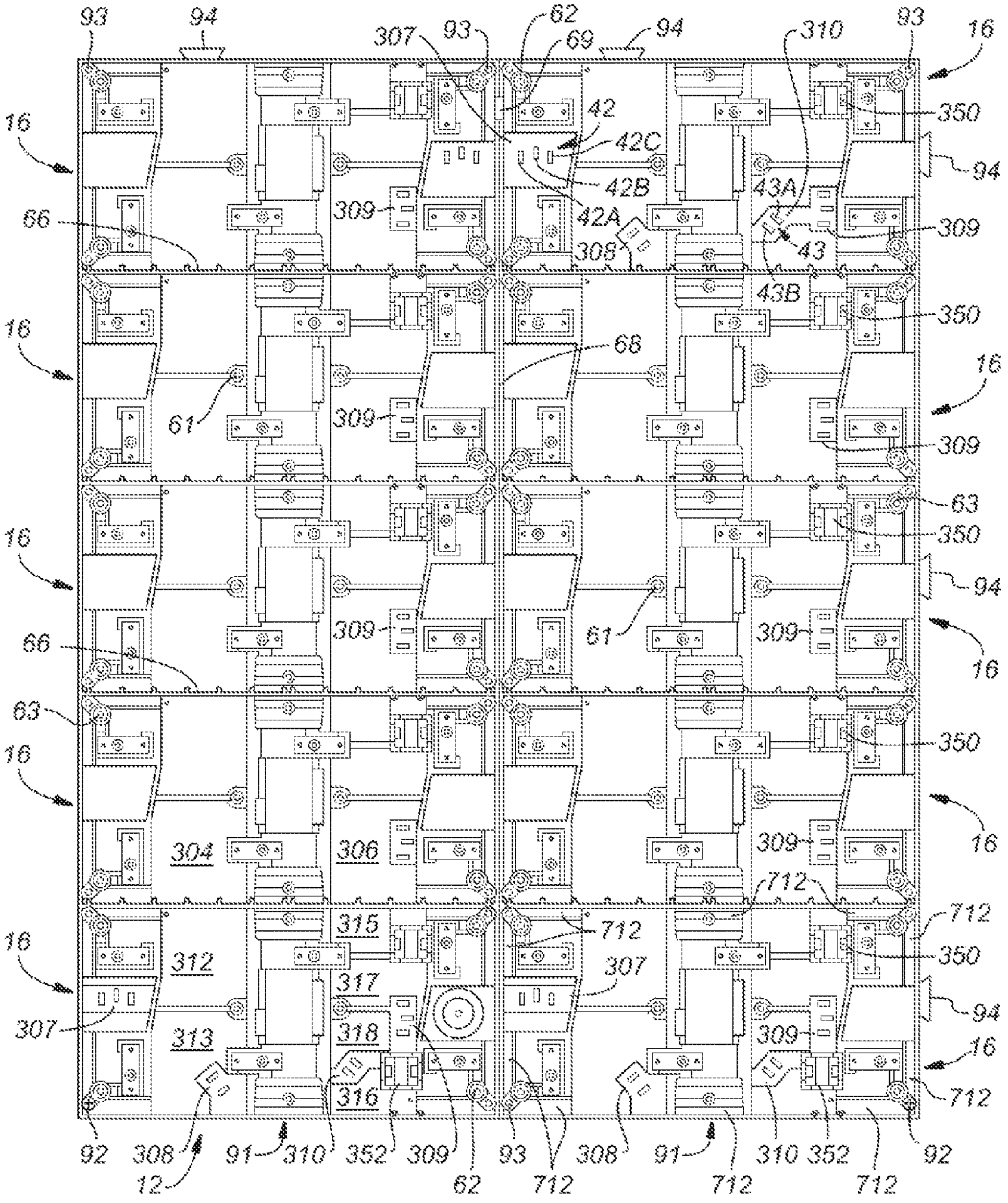
FIG. 23 is a front plane view of a structural frame forming part of the retrofit kit of FIG. 2.
Figure 24A:
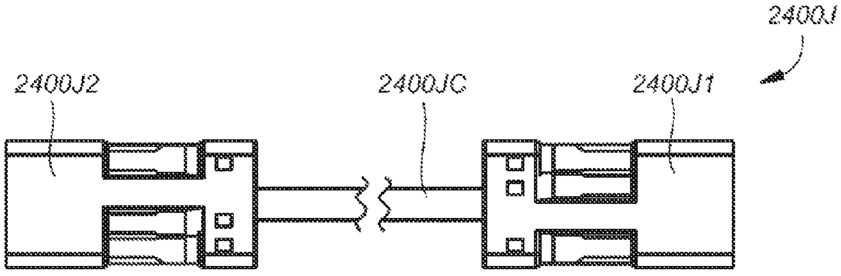
FIGS. 24A, 24B and 24C are diagrammatic illustrations of various wire harness assemblies forming part of the power data routing system.
Figure 24B:
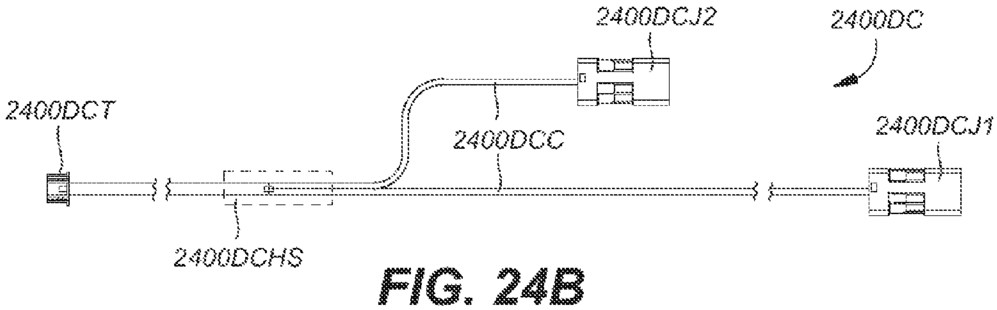
Figure 24C:
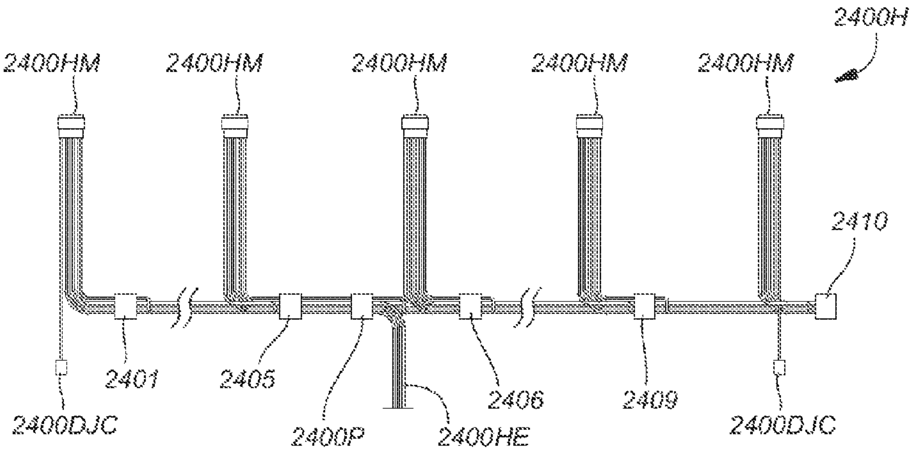

Before describing in detail the on-site or in-field retrofitting process 1010, it will be beneficial to first describe the retrofit kit 10 that is utilized by an installation team or installer in transforming the static billboard 8 into the dynamic billboard 110. In this regard, the retrofit kit 10 as best seen in FIG. 2, generally includes (1) a plurality 10A of thin, ultra-light weight compound functional structural frames, such as a compound structural frame 12 as best seen in FIG. 23; (2) a plurality 10B of fully weatherized latch in place display modules, such as a display module 14, as best seen in FIGS. 8-9; (3) a plurality 10D of preformed wire harness assemblies as best seen in FIGS. 24A-C; and (4) a power modification kit 10C that enables the plurality 10D of harness assemblies to be coupled to a source of electrical information or data as well as a source of universal power that will be described hereinafter in greater detail. The kit 10 also includes an instruction manual and mounting hardware 10F, as well as an insect and rodent infestation resistance kit 10E that will also be described hereinafter in greater detail.

The Structural Frames and Display Modules of the Kit, in General

Figure 4:
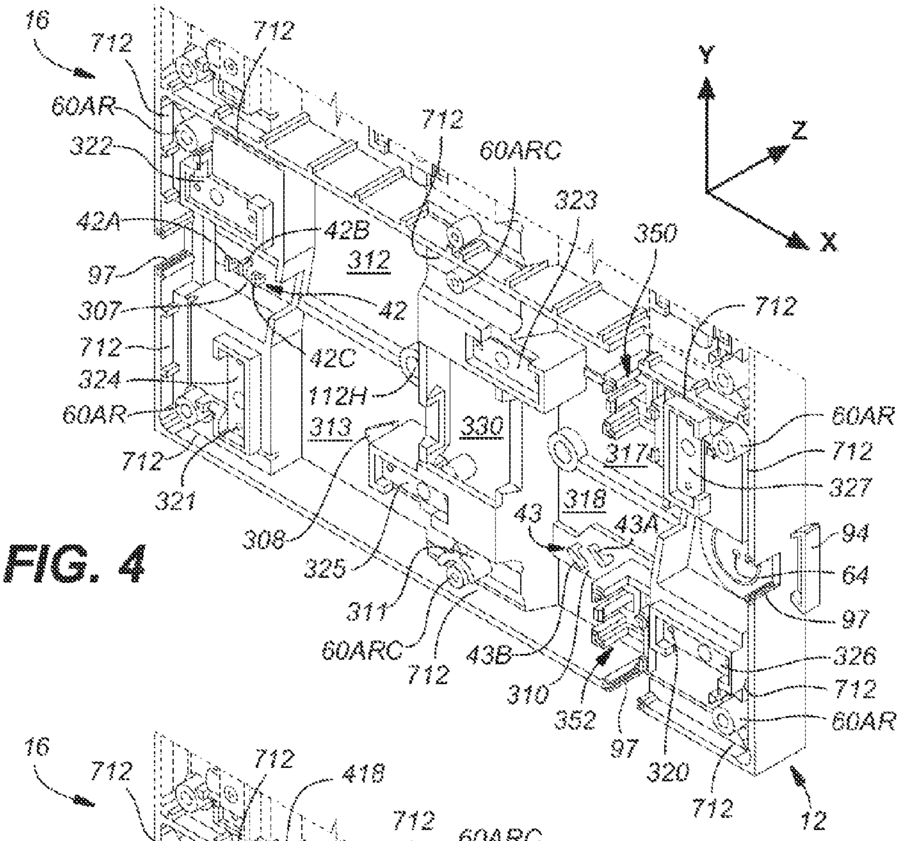
FIG. 4 is a greatly enlarged frontside perspective view of a structural frame forming part of the field modification kit of FIG. 2.
Figure 5:
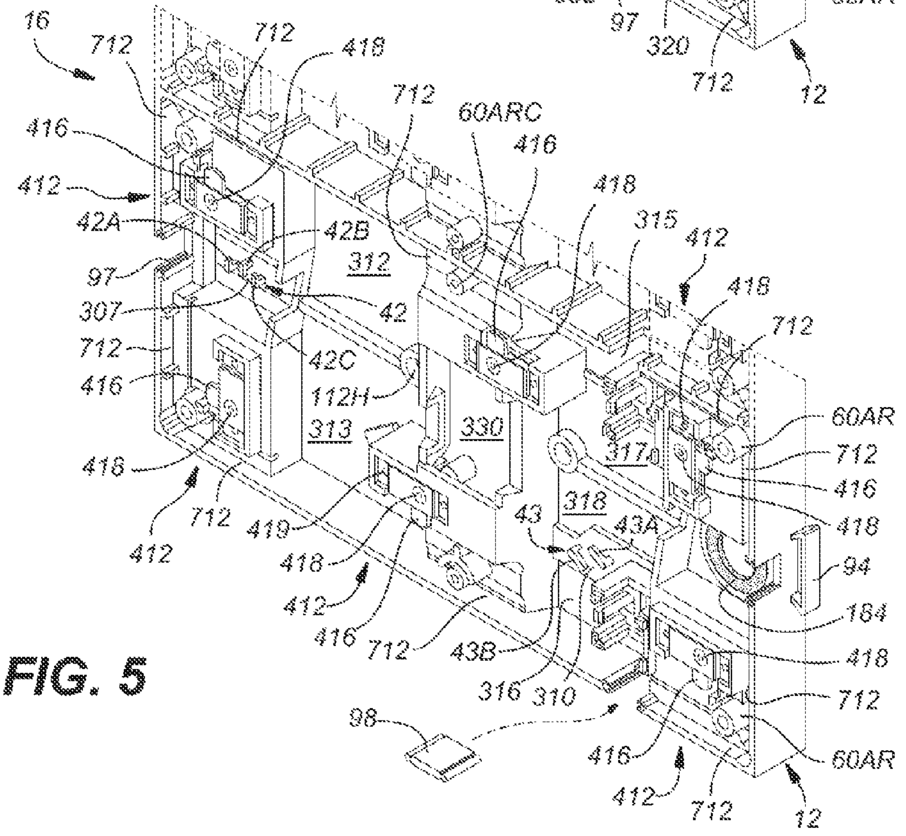
FIG. 5 is a greatly enlarged frontside perspective view of the of the structural frame forming part of the field modification kit of FIG. 2, illustrating some of the modular components forming part of the field modification kit of FIG. 2.
Figure 6:
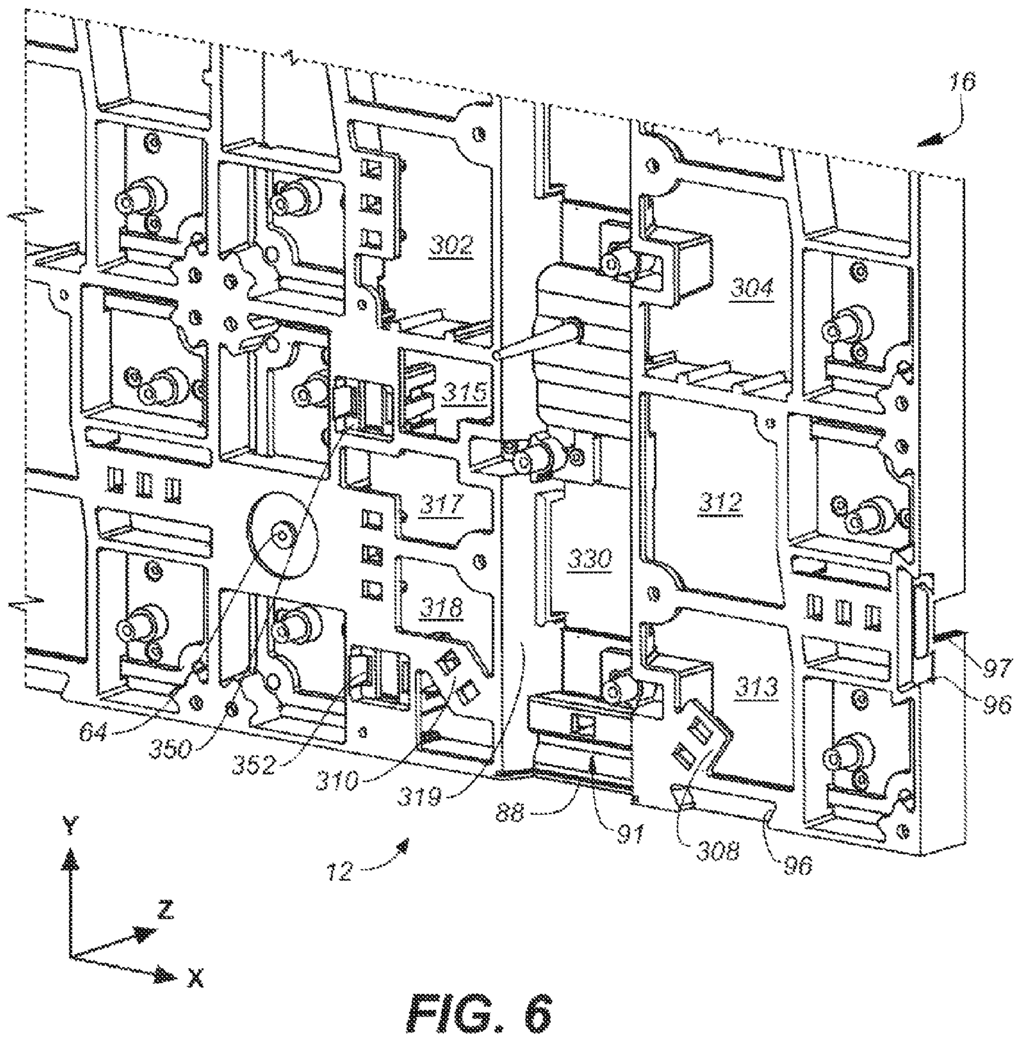
FIG. 6 is a greatly enlarged backside perspective view of the structural frame of FIG. 4.
Figure 7:
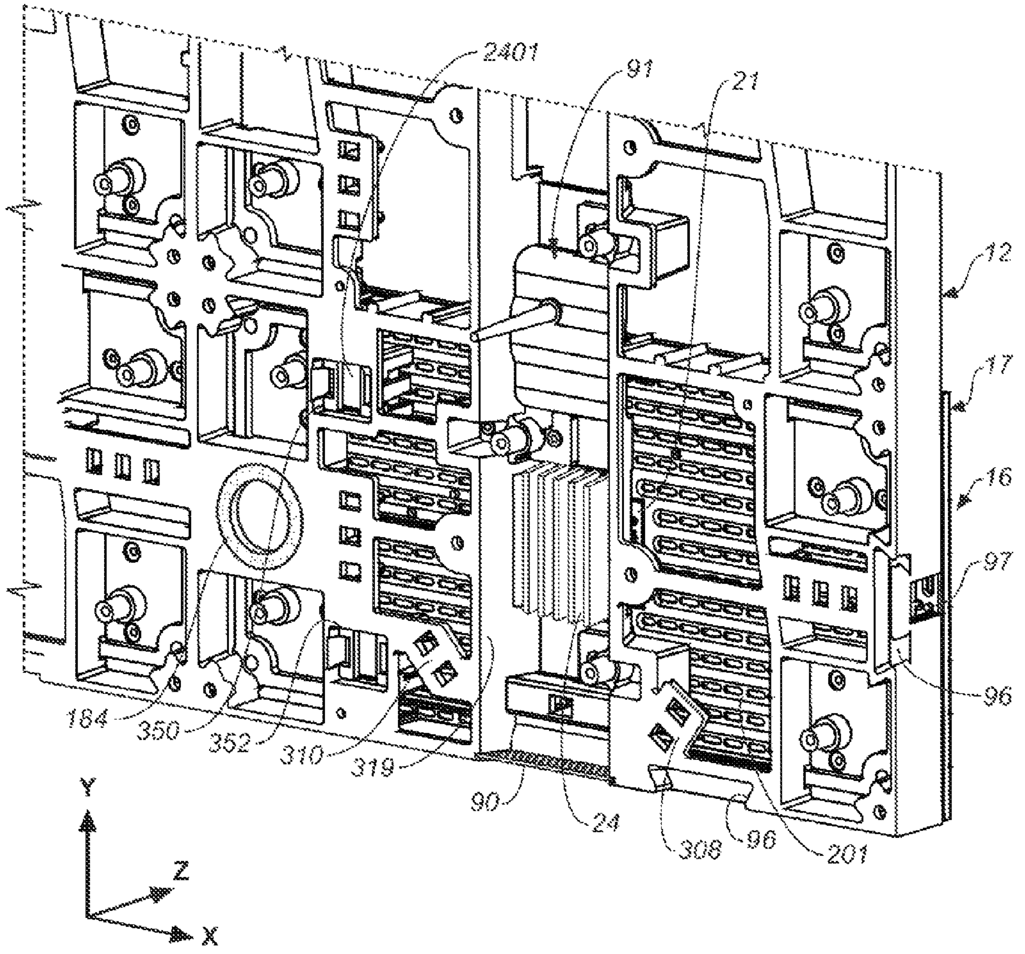
FIG. 7 is a backside perspective view of the structural frame of FIG. 5 illustrating some of the modular components forming part of the field retrofit kit of FIG. 2.

As best seen in FIG. 23, each structural frame 12 forming part of the retrofit kit 10 includes a plurality of structural bay members, such as a structural bay member 16 as best seen in FIGS. 4-7. FIG. 23 is a front plane view of a single structural frame 12 having an array of structural bay members 16 arranged in a five (5) bay high by a two (2) bay wide configuration. FIGS. 4-5 are greatly enlarged frontside views of an individual structural bay member 16 without and with certain installed features respectively. FIGS. 6-7 are greatly enlarged backside views of an individual structural bay member 16, also illustrated with and without certain installed features respectively. Each structural bay member 16 is adapted to receive and support therein a fully weatherized and sealed LED display module 14. The display module 14 of the present invention may be installed in any structural bay member 16 forming part of the electronic billboard 110. In this regard, the display module 14 of the present invention is universal, and requires no special sectional markings or indicia for installation purposes.

As will be explained hereinafter in greater detail, the structural frames 12 and its associated structural bay members 16 have built in alignment features, self cooling features, wire routing features, and node receptacle feature, which (1) facilitate a quick and easy installation process for the fully weatherized LED display modules 14; (2) facilitate and provide front billboard access for simple servicing processes which easy removal and replacement of display modules 14 as needed; (3) facilitate simple and effective cooling methods for each display module 14 due to a unique and novel structural cooperation between the structural frames 12 and the existing static billboard poster panels, such as a poster panel 9; and (4) facilitates a unique and novel overall billboard structure that substantially prevents invasion by bees and other insects or pests into the hollow interior areas of the billboard 110.

Figure 16:
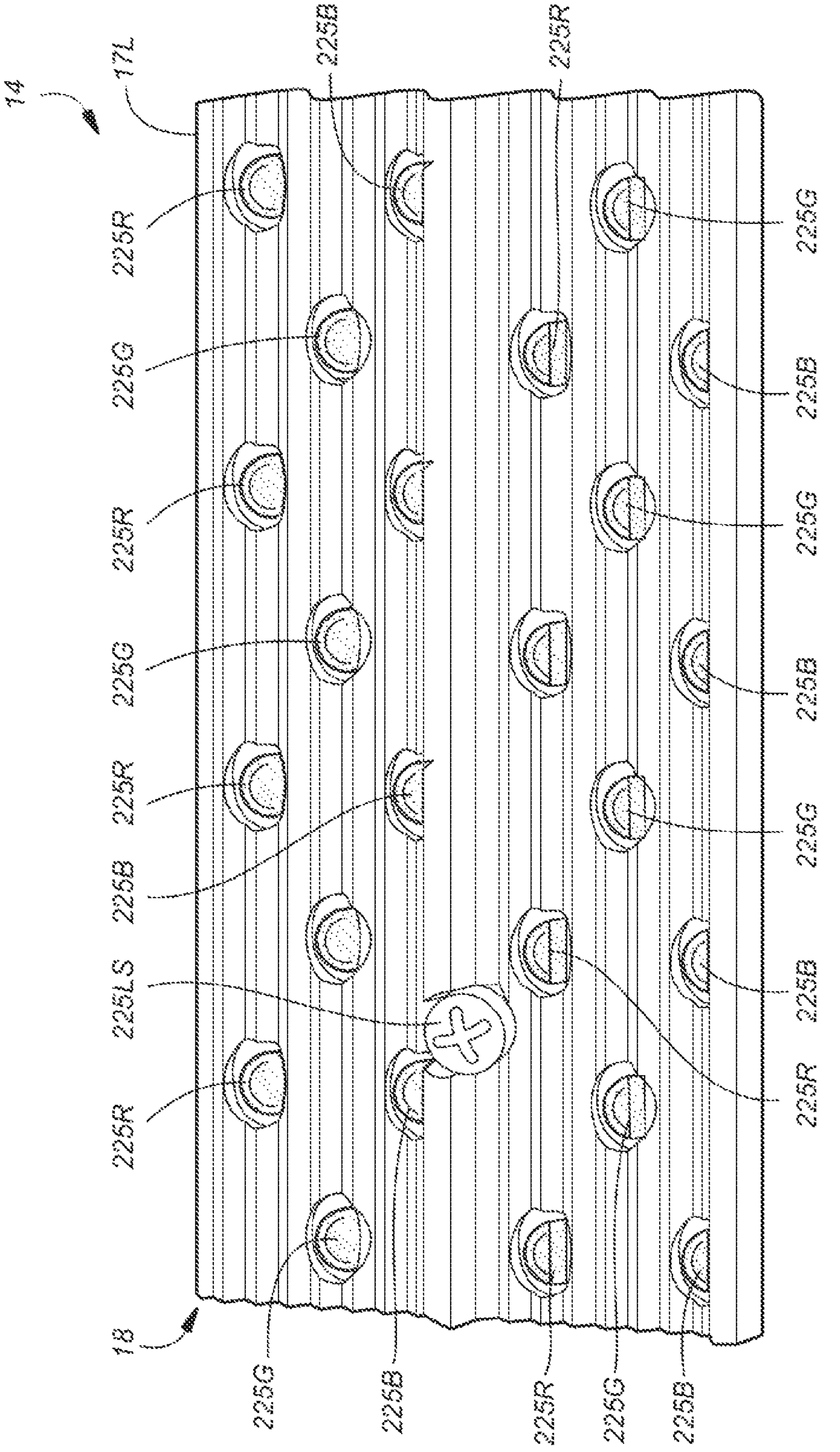
FIG. 16 is a greatly enlarged front perspective view of a portion of a louver forming part of a display module constructed in accordance with the present invention, illustrating a pixel arrangement of light emitting diodes.

Each individual display panel module 14 which forms part of the kit 10 and the billboard 110 includes dual LED display panels indicated generally at 14L and 14R as best seen in FIGS. 8-9. This dual LED display panel construction of the display module 14 provides for the display of a total of 512 multi-color pixels (red, green and blue) consisting of 1536 LEDs (512R/512G/512B) which LEDs are configured in identical pixel arrangements, such as a pixel arrangement 18 as best seen in FIG. 16. Each LED display module 14 as best seen in FIG. 8, is 317 mm in height or about one foot in height and 634 mm in width or about two feet in width, so arrangement that two display boards with 512 pixels are distributed over 0.2 square meters or about 2.16 square foot. Each pixel in this regard, includes a red LED, a green LED, and a blue LED to provide thousand of pixel color combinations. Each pixel arrangement 18 is therefore configured with a pixel pitch given by the following formula:

$$\text{Pixel pitch}=317\text{ mm}\div 16=19.8\text{ mm} \quad \text{[Equation 1]}$$

Accordingly, each pixel arrangement 18 is configured as a 19.8 millimeter display arrangement with a narrow viewing angle, which is best suited to roadside billboard products, optimized sign brightness and hence configured for the utilization of less power. It should be noted that wider angle light emitting diodes are fully contemplated for use without changing the other physical components of the present invention to accommodate various types of advertising displays such as high definition video displays for indoor use as an example without limitation.

The total number of compound structural frames 12 and the total number of display modules 14 provided in any given retrofit kit 10 is determined in advance by the size of the static billboard 8 that is being converted. Table I that follows provides a cross reference between standard sized billboards and the number of compound frames 12 and display modules 14 provided in any given kit:

TABLE I

| Standard Billboard Size | Number of Frames | Number of Modules |
|---|---|---|
| 11 Ft. (Height) by 22 Ft. (Width) | 10 Full Size Frames | 100 Modules |
| 14 Ft. (Height) by 48 Ft. (Width) | 22 Full Size Frames and 11 Partial Frames with top pair of bays removed, and 3 Partial Frame with one column of bays removed | 230 Modules (Lower 2 Rows)<br>69 Modules (Upper Rows) |

Each structural frame 12 in the retrofit kit 10 is composed of a low cost, light weight structural foam material which easily and conveniently mates in a tight surface to surface configuration with the poster panel surfaces of the existing static billboard 8. Such mating provides a low cost means to support routed wires and to cool the display modules, such as the display module 14 by and through unique and novel design flexibility, light weight properties, strength and weathering capabilities. As needed for certain custom sized static billboards, a structural frame 12 may be easily and quickly configured into smaller units by the simple use of a skill saw.

Stated otherwise, the light weight structural foam material may be field cut in LED modular increments by using the skill saw to cut along lateral frame ribs areas 66 disposed between individual ones of the structural bay members to reduce frame height or in the alternatively the foam material may be cut along the longitudinal frame rib area 68 between the columns of the structural bay members to reduce frame width. The ability to cut a structural frame 12 to suit the structure in the field both vertically and horizontally in LED modular increments adds flexibility for field installers. Such flexibility allows customized arrays to be constructed in the field in a fast, convenient, and inexpensive manner without any expensive manufacturing changes. Moreover, such flexibility allows customized display sizes to be easily and conveniently to be form in the field. In short, the lateral ribs 66 and longitudinal ribs 68 serve as cutting line guides or visualization features enabling the compound structural frame 12 to be cut in customized sizes ranging from a maximum full frame size for supporting and receiving plural display modules to a minimum structural bay member size for supporting and receiving an individual display module.

The surface mating properties between the closed poster panel surfaces of the static billboard 8 and the individual structural frames 12 which are sealed by the individual weatherized display modules 14, further eliminates the need for air conditioning and or fans to cool the large number of display modules 14 distributed across a frame array 30 of the billboard 110. In this regard, a passive cooling structure or venting system is formed in this surface to surface mating relationship which allows substantially portions of the display module 14 to be latched and fixedly removably positioned or located within individual venting channels (FIG. 27) designed into the physical configuration of individual ones of the compound structural frames 12.

Figure 10:
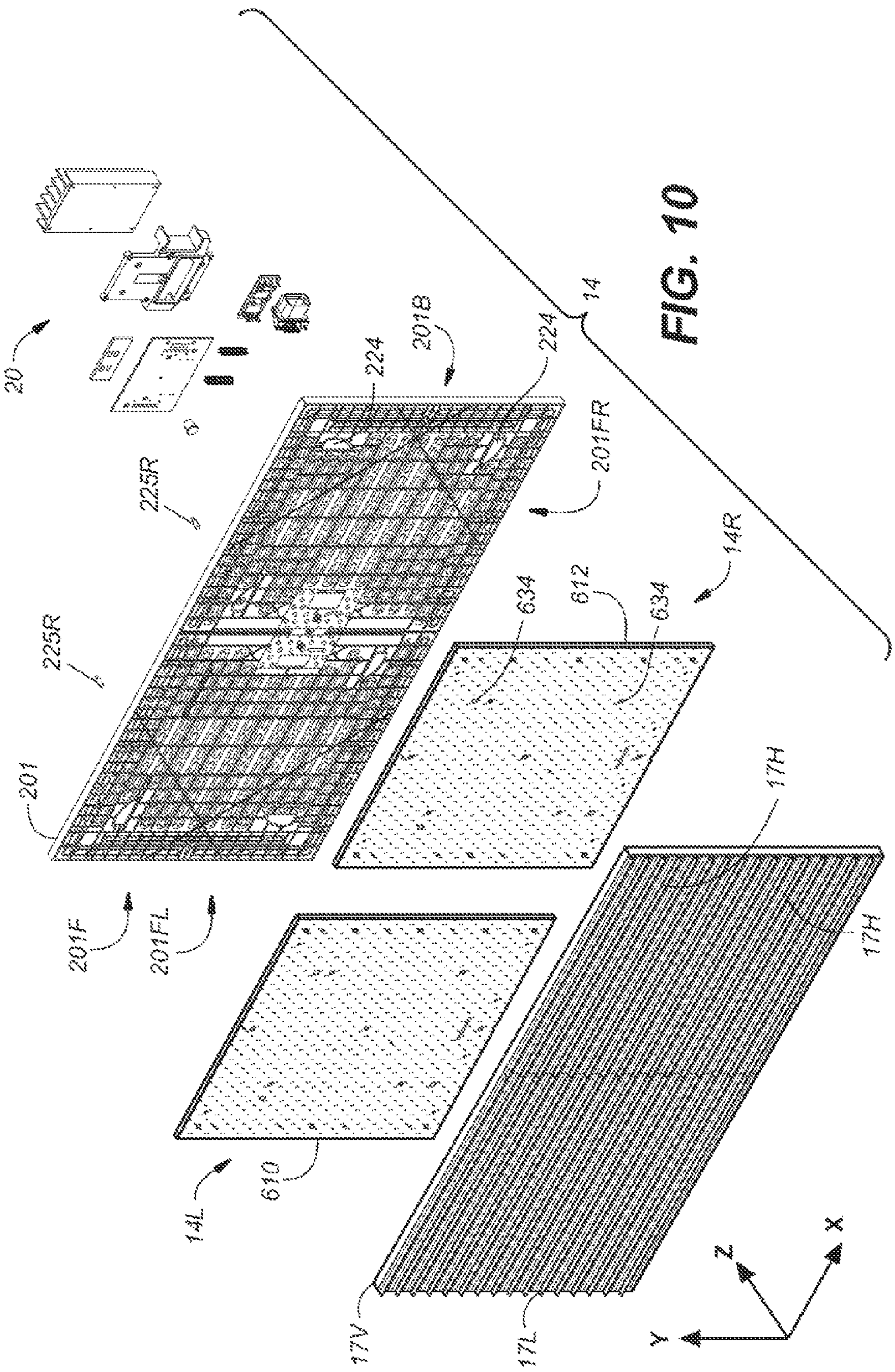
FIG. 10 is an exploded view of the display module of FIG. 8.

It should be appreciated by those skilled in the art, that the surface mating properties enable the individual structural frames 12 to further function as effective cable trays, cable management system, and conduits for the power and data cables coupled to the various ones of the display modules. Moreover, the sealed display modules 14, as will be described hereinafter in greater detail, eliminate the need for any type of sealing between the modules 14 and their receiving bay members, such as the bay member 16. This in turn, provides an added benefit namely that little or no static billboard steelwork modifications are required. Also with the aid of an interconnecting daughter board 20, as best seen in FIGS. 7 and 10, a significant reduction is achieved as only a single DC/DC converter is utilized to power the two optimum sized LED panels 14L and 14R respectively of the display module 14. In short, the simplicity of the in field retrofit kit 10 enables a "Digital Sign in a Box" kit type of methodology, which moves assembly of the dynamic billboard 110, from the factory to a field end user. This is especially attractive for hard to reach or landlocked sites where cranes cannot gain access.

It should be further appreciated by those skilled in the art, that the structural foam material that each structural frame 12 is constructed of is not subject to post shrinkage and therefore the structural integrity of a resulting billboard 110, is protected and weatherized against post extreme cold and extreme heat experiences in normal weather conditions. Moreover, mounting or latching tolerances required of the latched in display modules will not be affected so there is no danger of a display module 14 or any other component of the sign 110 from distorting due to shrinkage. In this regard, safe and effective operation of the dynamic billboard sign 110 can be expected over a substantial life period of about 10-15 years or longer.

Based on the foregoing, it should be understood by those skilled in the art, that the retrofit kit 10 is a self contained, in-field or on-site, retrofit kit 10 for converting a static billboard 8 having a least one poster panel 9 into a dynamic electronic billboard 110 which is adapted to be coupled to a universal source of electrical power. To effect the conversion from a static billboard 8 to a dynamic billboard 110, the kit 10 may be customized for the size of the static billboard 8 being converted. In this regard, there is no intention of limiting the size of the kit 10 to the precise size described herein as it is fully contemplated that larger and smaller kit size may be constructed, for example a kit with at least one modular compound structural frame 14 that is adapted to be mounted to at least one poster panel 9 of the static billboard 8.

The number of modular compound structural frames 12 provided in any given kit 10, as noted earlier, is therefore determined by the actual size of the static billboard 8. In this regard, a static billboard can be as small as about a 2 square foot billboard or as large as needed. In this regard, the kit is fully scalable by adding additional power enclosures and power junction boxes as needed.

Figure 27:
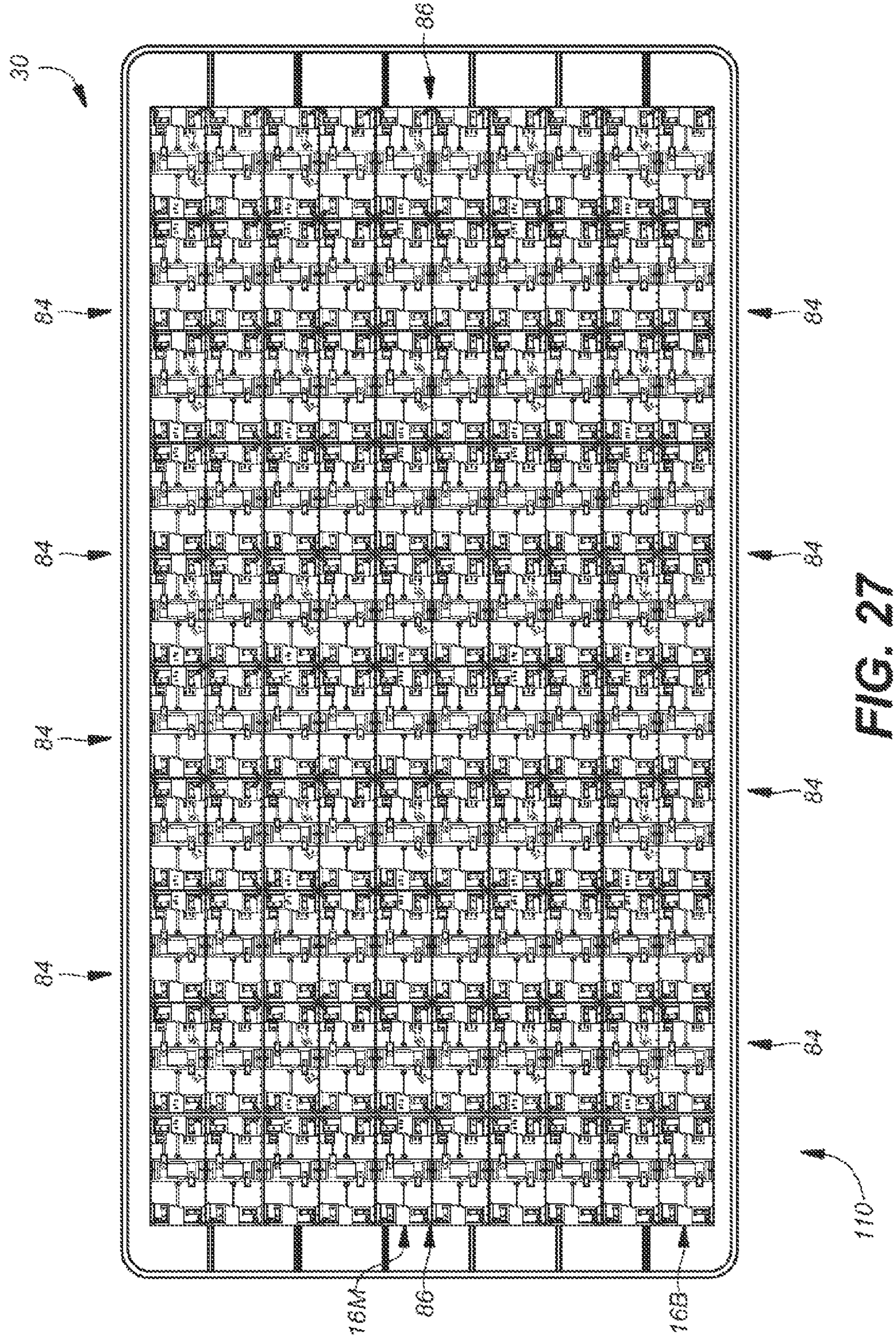
FIG. 27 is a front plane view of an array of structural frames illustrating their preparation for installation of the power wire harnesses and data wire harnesses of FIG. 24C.
Figure 27A:
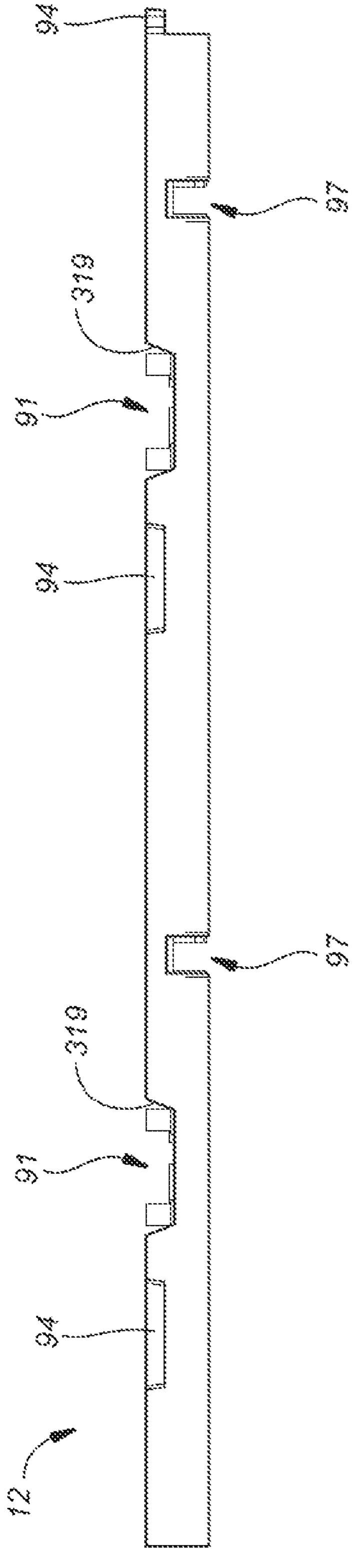
FIG. 27A is a top plane view of the structural frame of FIG. 23 illustrating typical locations for bee stops and air flow channels.

Another unique and novel feature of the structural frame 12 as already briefly mentioned is that when a structural frame 12 is mounted to the poster panel structures of the static billboard 8, the backside of the structural frame 12 cooperates with the frontside of the poster panels, such as the poster panel 9, to form a pair of air columns or self cooling air vents 91 as best seen in FIGS. 23 and 27A. The air vent columns 91 extend from the bottom of the structural frame 12 to the top of the structural frame 12. Still yet another unique and novel feature of the structural frame 12 is that the structural frame 12 further functions to define a plurality of wire routing paths, node receptacles, and frame/poster panel access paths which are disposed throughout the billboard 110. These access paths, as will be described hereinafter, ensure that all the HVAC power is confined to the backside of the billboard 110, while all the LVDC power is coupled to the frontside of the billboard 110; thus, making the billboard 110 very safe from potential electrical shock scenarios.

The air vents or air conduits 91 formed between each structural frame 12 and its associated poster panels 9 are formed due to the physical structure of the structural frame 12 as it is secured to the flat surface area of the poster panel 9 on billboard 8. In this regard, a cooling vent 91 is disposed in a left side column of the structural bay members or in a right side column of structural bay members relative to a structural frame 12. In this regard, since the structural bay members are arranged in 5 separate rows and two separate columns, the structural frame 12 may be customized in size to provide a single cooling vent column 91 or a pair of spaced apart cooling vent columns 91 as needed.

This passive cooling arrangement is an important and novel feature of the present invention. In this regard, when there is a large array of LED modules provided in a large outdoor billboard display, there may be temperature variations across the display array. In particular, modules that are disposed toward the center of the display array or toward the higher points in the array, may reach higher temperature during normal operating conditions. It is for this reason that conventional billboard display systems are provided with active fan driven cooling arrangement to compensate for these variations. The present invention however solves the variation in heat spots in a unique and novel way with a passive cooling system that uses the cooperation of air channels 91 (FIGS. 23 and 27A) built into the backside of each structural frame 12 to provide a plurality of cooling conduits spread out across the whole of the structural frame array 30.

Moreover, windows or cutout areas, such as a daughter board window 330 (FIG. 5-6) forming part of each structural bay member 16 enable a set heat sink cooling fins, indicated generally at 24F (FIG. 11) associated with each display module 14, to be located within an associated cooling vent 91 where air flow travels from a bottom area of the billboard 110 to a top area of the billboard 110 by natural air flow convection. With this natural air column structure, should a billboard 110 be constructed from a retrofit kit 10 and installed in an extremely hot and humid environmental area of the country, cooling fans could be quickly and easily installed for each cooling vent 91 to provide forced convection cooling along these cooling vent paths, if needed.

Yet another unique and novel feature of the compound structural frame 12 is its compound structure. That is, a single structural frame 12 contains plural structural bay members, such as the structural bay member 16. Each bay member 16 is adapted to latchingly receive and secure one completely weatherized display module 14, which in turn, as already mentioned is configured with side by side LED boards or panels, such as the left side display panel 14L and the right side display panel 14R. The bay member 16 and the display module 14 of the retrofit kit 10 are provided with complementary alignment and latching features that will be described hereinafter in greater detail. It will suffice for the moment to mention that each display module 14 includes a set of rear side alignment receptacles, such as a rear side alignment receptacle 14AR, as well as a pair of spaced apart center alignment receptacles 14CAR as best seen in FIG. 9, which receptacles 14AR and 14CAR are adapted to slidably receive therein a corresponding set of structural bay alignment posts or columns, such as upstanding alignment posts 60AR and 60ARC respectively (FIG. 4-5). In this regard, each display module 14 is slidably mounted into a structural bay 16 from the frontside of the billboard 110 for easy and quick installation.

As mentioned earlier, the display module 14 of the present invention is latched into placement within an associated structural bay member 16. In this regard, each display module 14 also includes a set of latch receiving members, such as a latch receiving member 14LM (FIG. 9), which latch receiving member 14LM is adapted to receive a latch member 416 (FIG. 5) from an associated latch assembly 412, which assembly 412 is mounted within the structural bay member 16. This latching arrangement is an important and novel feature of the present invention, as it not only allows for the individual ones of the display modules to be easily and quickly installed or removed from an associate structural bay member 16, but it also protect each display module 14 from being dislodged from its associate bay member 16 due to unwanted and unexpected wind load forces.

Figure 25:
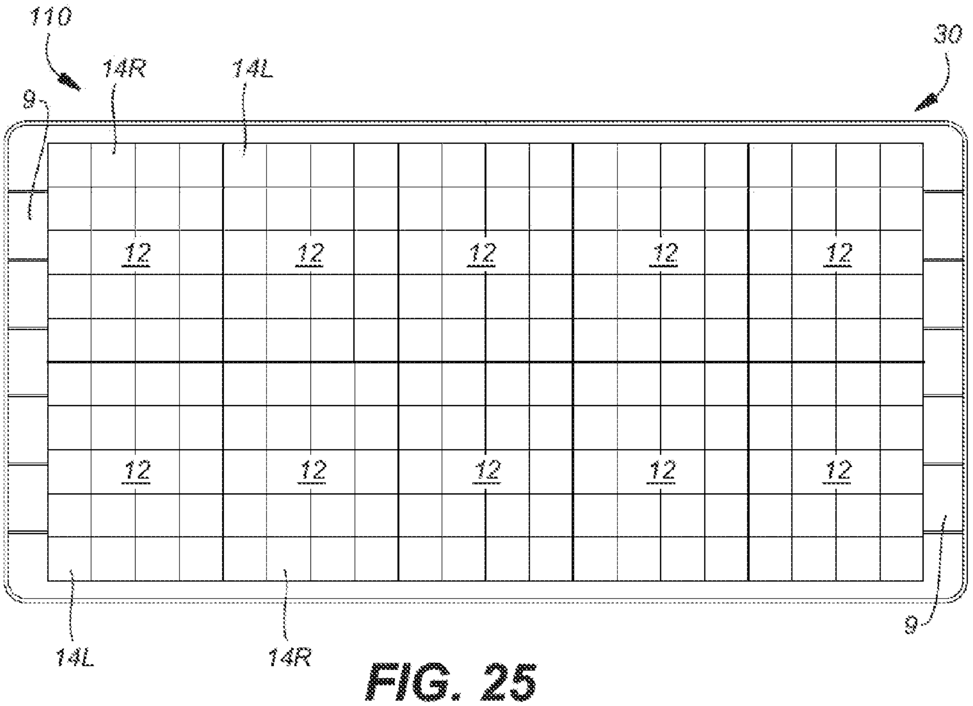
FIG. 25 is a front elevational view of the billboard of FIG. 1, with its display module louvers removed to illustrate the side by side relationship of the individual display panels forming part of the display module of FIG. 8.

It should be noted that each display module 14 is latched into place by a simple quarter turn with a latch access tool (not shown) such as a conventional Allen wrench tool. It should further be noted that when a display module 14 is mounted within an associated structural bay members 16, it is mounted in abutment with another display module 14. In this regard, a continuous line of display modules is configured on the frontside of the billboard 110 as best seen in FIG. 25 to provide an uninterrupted side by side relationship and an uninterrupted top to bottom relationship. The abutment of the weatherized display modules, in a tight fit with one another, is therefore by design and effectively seals the frontside of the structural bay members of each structural frame within the array 30, while at the same time forming a substantially flat frontside face construction for the billboard 110, which substantially flat front face construction is extremely resistant to wind load forces.

As above-described, each display module 14 is latched in place by a latch assembly 412 which is disposed to the backside of the display module 14 creating a latch assembly access issue. This access problem for removing a display module 14 from its associated bay member 16 from the frontside of the billboard 110 was solved by providing each display module 14 with a set of latch access holes, such as a latch access aperture 17H as best seen in FIG. 9. In this regard, the access aperture 17H enable an installer to use his or her tool and reach a sufficient distance through the display module 14 to activate each associated latch with a simple quarter turn, thus securing the display module 14 within its structural bay member 16.

The display module 14 is further adapted to be coupled to a universal source of electrical power via an individual one of the plurality of wire routing paths that will be described hereinafter in greater detail. For the moment it will suffice to state that the display module 14 operates on a direct current low voltage source which is coupled from the backside of the billboard 110 to the frontside of the billboard 110. The modular electrical conversion device or display module 14 is further adapted to be coupled to a data source via an individual one of the plurality of wire routing paths. Each one of the LED boards, forming part of the display module or the modular electrical conversion device includes a plurality of electrical elements coupled to the constant power source and to the data source for converting electrical energy into visible radiant energy indicative of an electronic message intended for pubic viewing.

Finally it should be noted that the structural frame 12 (FIG. 23) has a sufficient depth dimension and a sufficient strength construction so that no unexpected wind loads within normal building code weather conditions can be expected to overstress a structural frame 12. To further obviate such bending stresses, each structural frame 12 of the billboard sign 110, has been provided with a sufficiently large number of restraint/bolt locations, such as a center frame bolt location feature 62 and an outside frame edge bolt location 63. These center restraint location features 62 are disposed along the center of the structural frame 12 in a spaced apart manner from the top of the structural frame 12 to the bottom of the structural frame 12. In a similar manner the outside frame edge restraint location features 63 are disposed along the right side edge and the left side edge of the structural frame 12 from top to bottom of the structural frame 12. To over restrain the billboard 110 relative to the undersurface poster panels, if necessary, each structural frame 12 is further provided with intermediate bolt location features 61 which also extend from the top to the bottom of the structural frame 12. Such over or excess restraint ability built into each structural frame 12 substantially eliminates the danger of such bending stresses. During installation of the retrofit kit 10, a minimum bolt pattern is established based on worst wind loads and the allowable stress on the frame 12. In short, the new and unique billboard 110 is designed to reduce tensile stress and to optimize the load bearing capabilities of the designed billboard structure 110.

The above-mentioned multiple bolt locations 61, 62, 63 also enables flexibility during the installation of the retrofit kit 10. For example, in order to miss a panel seam in an existing gauge metal structure associated with a static billboard 8, an installer can easily avoid such a seam by simply utilizing an adjacent bolting feature. This, in turn, means that during the installation of the retrofit kit 10 less billboard structural steelwork modifications, if any, are required greatly reducing installation time. Moreover, it should be further understood that because the sealed display modules 14 are removably latched into place within respective ones of the bay members 16, such display modules 14 can be easily and quickly removed from the frame 12 thereby allowing additional bolts to be secured to a frame 12 accommodating possible future changes in a building code wind load design should that ever occur. Again this is an important, unique and novel feature of the present invention since there is the ability to replace sections of the billboard 110 without the use of heavy machinery. Moreover, if desired as earlier-mentioned, the billboard 110 may be easily and quickly disassembled and transported for installation at another static billboard location. For example, first using the dynamic billboard at a football field and then later using the dynamic billboard at a baseball field. This is an important and uniquely novel feature of the present invention although it is not expected that this feature will be utilized to any great extent because of the substantially low cost of the billboard components and labor.

The Poster Panels of an Existing Static Billboard

Since the retrofit kit 10 is mounted to existing poster panels 9 of a static billboard 8, it should be understood by those skilled in the art, that preparing a site for installation of the retrofit kit 10 is an important step in the retrofit process. This preparation process will be described hereinafter in greater detail. For the moment; however, it should be noted that each poster panel 9 that will receive a structural frame 12 of the retrofit kit 10, must be substantially flat and uniform and cleaned of any residual poster paper. This is necessary since the structural frames that will be installed, need to be aligned with one another, and the structural frames need to lay flat against and in intimate contact with the surface of each poster panel 9. It should also be noted that poster panels are an industry standard. They are typically constructed of 20 gauge sheet metal, which is formed into interlocking panels. The total depth of a poster panel is about 2 inches so the bolts and self-drilling or tek-screws utilized to secure the structural frames to the underlying poster panels 9 can pass through the panels without the use of anything but standard steel drills and the like.

The Compound Structural Frame

Considering now the compound structural frame 12 in greater detail, each compound structural frame 12 as earlier-mentioned is composed of a structural foam material, which is a type of cellular plastic with a dense outer skin surrounding a foam core. Structural foam was selected because of its light weigh, strength and its ability to be easily molded to provide the many unique and novel features designed into each structural frame 12. In this case, it should be understood that structural foam molding is a process for making extremely strong, rigid and light-weight plastic parts and products that have a hard outer "skin or shell" and a hard honeycomb type foamed inner core. The structural foam molding process is an extension of a standard injection molding process but is a greatly improved process for the present invention providing several unique and important advantages.

For example, using injection molding would be very impractical and cost prohibitive for the large 4 foot by 5 foot structural frames of the present invention. Moreover, the steel molds required in injection molding as opposed to the aluminum molds used in structural foam molding, would present another serious problem relative to costs. This deficiency of injection molding relative to the structural frame 12 of the present invention is due to the many built in design features in the structural frame 12 which help to modularize this component. For example, the built in cooling conduits that facilitate a passive cooling structure without the need for using cooling fans; or the built in node receptacles and wire routing paths that facilitate the use of preformed wiring harnesses and the use of jumpers that facilitate redundant data path resulting in a significant reduction in power and data routing complexities but making injection molding quite impractical.

Another unique and important feature of the present invention is that all power delivered to the structural frame array 30 for use by the installed display modules is rectified to less than 30 VDC at the backside of the billboard 110. This low direct current voltage is then coupled through a pair of power access holes or opening from the backside of the billboard 8 to the frontside of the structural frame array 30 where the rectified low voltage power is safely routed within a structural frame array 30 using preformed wire harnesses that will be described hereinafter in greater detail. For now it will suffice to mention that a preformed power/data wiring harness 2400H (FIG. 24C) provides a plurality of preformed nodes or over-mold node features 2401-2411, where the preformed nodes are configured to be snapped or pressed into position in wire harness node receptacle features, such as an upper wire harness node receptacle feature 350 and a lower wire harness node feature 351 (FIG. 23), which receptacle features are built into the structural frame 12. In short, a significant reduction in retrofit time is achieved by the unique and novel complementary features of structural frame receptacle coupled with power/data wiring harness over-mold node features.

Although the time to mount a structural frame 12 of the present invention is much greater than the time to mount an LED display module 14 of the present invention (due to screw and bolt fastening requirement as opposed to simply positioning and sliding an LED module 14 in place in an associated structural bay member 16 and then latching the module into place), it should be appreciated that the large, hand mountable, 5 foot by 4 foot modular structure of each structural frame 12 coupled with a plurality of row aligned and column aligned structural bay members 16 configured to receive a universal display module 14, that do not need or require sectional markings or indicia, facilitates quick and easy installation of the retrofit kit 10 at a low cost. For example, it would be extremely impractical to need to mount one hundred structural frames in order to accommodate 100 LED modules where weatherization of the frames is in-field labor intensive, whereas weatherization of the LED modules is in-factory labor intensive. From the foregoing, it should be understood that due to yield, weight and manufacturing limitations, the structural frames 12 and the LED display modules 14 of the present invention, are each optimized in size and in ease of in-field installation to be fully protected against building code weather conditions.

From the foregoing, those skilled in the art should clearly understand that the structural frame 12 is designed with the following unique and novel features as part of the retrofit kit 10: (1) each frame 12 is composed of light weigh durable structural foam which is sufficiently light in weight (no greater than 50 pounds) that the frame can be easily lifted and installed by a single worker without the need of a crane or any other heavy lifting equipment; (2) each frame is modularized with build in design features that not only help substantially minimize retrofit kit installation time, but which also reduce operating costs; (3) each structural frame 12 is identical, and may be easily and simply reduced in size to it lowest modular structure for duplicative installation weatherizing processes; (4) each structural frame 12 is identical and easy to install which minimizes the skill level required for installing the retrofit kit 10; (5) each structural frame 12 has built in cooling vents capabilities thus, avoiding complicated cooling schemes with electrical cooling fans and the like for the on-board electronics; (6) each structural frame 12 is protected from insect infestation and is further protected from unwanted and undesired small animal and bird invasion; and (7) each structural frame 12 is provided with a safety fall prevention feature in the form of a lanyard receiving hole 69 (FIG. 23) which allows the frame 12 to be temporarily attached to an anchored lanyard so the frame 12 can not fall while be installed to a structural back panel.

Over-Mold Node Locators and Node Receptacles

Figure 28:
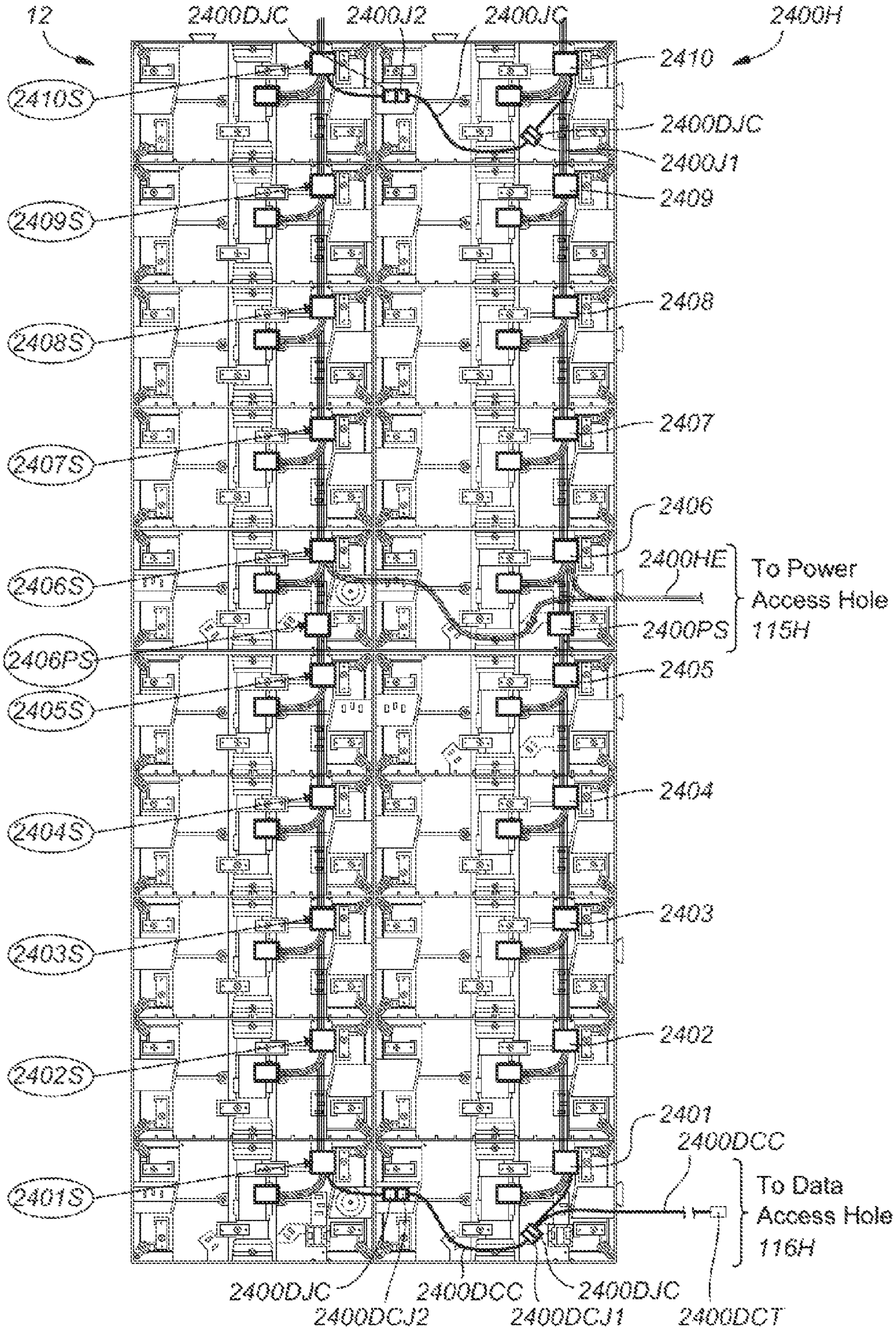
FIG. 28 is a diagrammatic illustration of how the data/power harness with over mold nodes are laid out and secured to a structural frame of the present invention.

Considering now the structural frame 12 in still greater detail, each structural frame 12 is provided with the capability of accepting in predetermined cable routes preformed power and data cable harnesses, such as the power and data harness 2400H as best seen in FIG. 24C. In this regard, each column of structural bay members 16 is provided with a total of 6 over mold node receptacle features which extend from the top of the structural frame 12 to the bottom of the structural frame 12. In this regard, each structural bay member 16 is provided with a single upper over mold node receptacle feature 350 (FIG. 23), but only the bottom row of structural bay members 16 is provided with a pair of over mold node receptacle features, namely the upper wire harness node receptacle feature 350 and a lower wire harness node receptacle feature 352. This is an important and novel configuration as the extra or lower wire harness node receptacle 352 will cooperate with a power introduction over mold node 2406PS (FIG. 14) forming part of the power data harness 2400H to facilitate a 10 AWG wire spliced to a 14 AWG wire midway in the associated power data harness 2400H as best seen in FIGS. 24C and 28. When two structural frames, such as the structural frame 12, are aligned one on the bottom and one on the top as best seen in FIG. 23, the above-mentioned splice takes place between in the bottom row of the top frame 12 or between the $5^{th}$ and $6^{th}$ over mold node locators of the harness 2400H as will be explained hereinafter in greater detail. For now it will suffice to state that this quick and easy "snap or press in place" process, using the over mold nodes of the preformed harness 2400H and the wire harness node receptacles 350 and 352 of the structural frame 12 facilitates quick and easy of installation of the power and data wiring harnesses required by the billboard 110. As all of the power data harnesses 2400H are identical in structure, an installer simply starts by snapping or pressing respective ones of the over mold nodes into their respective ones of over mold node receptacle from top to bottom in the columns of structural bay members (FIG. 28). This wiring installation process therefore is accomplished in a very fast and convenient manner without the need of using complex and unnecessary node/receptacle identification indicia markings. In short, the structural frame 12 and the wire harnesses, such as the preformed wire harness 2400H cooperate with each other to provide a very efficient and novel data and power routing system because of the build in design of wire routing features found within each structural frame 12.

As noted-above, the over mold node receptacles 350 and 352 in each column of structural bay members 16, define a built-in power and data routing features within each structural frame 12 which coupled with the simple, easy to snap or press in place power data harnesses, such as a power/data harness 2400H, facilitates quick and easy installation of the retrofit kit 10. The over-mold node features 2401-2405, 2406PS and 2406-2410 and the wiring harness node receptacles 350-351 are an important and unique feature of the present invention since these features in combination not only help expedite locating the routing and installation paths for the data power wiring, expedite inter-connections within the structural frames 12, but they also help prevent harness damage during installation by helping to prevent the power and data harnesses from becoming tangled in bundle of wires which could be easily pinched and damaged during later installation of the display modules 14. It should also be understood by those skilled in the art that by limiting all the High Voltage AC wiring to the backside of the poster panels and only passing low voltage DC power through to the frontside of the poster panels and structural frames 12 an outstanding safety feature is achieved. That is, when an installer or maintenance person is working on the billboard 110 from the frontside of the billboard, that person will never be exposed to HVAC power. In short, the installer or maintenance person is protected from unwanted and dangerous electrical shocks when removing and replacing display modules from the frontside of the billboard 110 or when making any repairs on the frontside the billboard 110.

The Display Module

Considering now the sealed display module 14 in greater detail with reference to FIGS. 8-11, each hand mountable display module 14, is completely weatherized, self contained and ready for quick and easy installation in a bay member 16 forming part of a structural frame 12. The display module 14 generally has a longer horizontal dimension than vertical dimension and is arranged generally in about a one foot by two foot rectangular configuration. In this regard each LED display module 14 is optimized in size for the structural bays of the present invention. As mentioned herein, each structural frame 12 may be reduced in size from it standard height width configuration to a smaller configuration if needed. In this smallest configuration, which is achieved by using a skill saw to separate the smallest configuration from the balance of the frame, the resulting structural frame 12 still has the ability to receive within its associated structural bay member 16 a single display module 14. In short then, the display module 14 is optimized in size and weight thereby substantially reducing the cost of replacement should a module 14 fail. That is, if this optimization was not achieved, and the display module was substantially larger in size, not only would the increased size, increase weight, but it would further increase the impact of a manufacturing defect failure with a resulting increase in cost. Yield and weight are therefore important trade offs against the need to install a greater number of modules.

As best seen in FIG. 10, which is an exploded view of the display module 14, the display module 14 generally includes an LED frame 201 which is configured to receive two side-by side LED display panel assemblies, namely a left side display panel or PCA assembly 14L and a right side display panel or PCA assembly 14R, where each display pane assembly 14L, 14R has a vertical dimension, and a horizontal dimension which dimensions are substantially equal in length. A frontside 201F of each LED frame 201 is adapted for receiving and supporting therein the left side printed circuit assembly (PCA) 14L, and a right side printed circuit assembly (PCA) 14R. The left PCA 14L is received on a front left side 201FL of the LED frame 201, while the right PCA 14R is received on a front right side 201FR of the LED frame 201. For clarity purposes the printed circuit assemblies 14L and 14R are illustrated at the backside of the LED frame 201 although as above-noted, each assembly is installed in the frontside 201F of the LED frame 201.

The display panel assemblies 14L and 14R are each configured in about a one foot by one foot arrangement abutting one another as best seen in FIG. 25. Each display panel assembly 14L and 14R, provides a display array of two hundred and fifty six pixels, where each pixel is defined by a set of three different color light emitting diodes, namely a red color generating LED 225R, a green color generating LED 225G, and a blue color generating LED 2258 as best seen in FIG. 16. The individual LEDs 225R, 225G, and 225B combine to provide a three color pixel which converts electrical energy into visible radiant energy, which visible radiant energy is cast outwardly from the surface of the display module 14 to display information in recognized light patterns of images and text when viewed as a total assembly of light emitting diodes. In order to help substantially reduce ambient light effects, each display panel assembly 14L and 14R is provided with a louver in the form of a left frontside louver 17L and a right frontside louver 17R respectively. The frontside louvers 17L and 17R are adapted to be mounted to the face of respective ones of the printed circuit assemblies 14L and 14R on LED frame standoff features and a set of 13 screws (black paint, M2.6×8 mm) per side. Please note, that for further clarity purposes, with reference to FIG. 10, each of the PCA assemblies 14L and 14R respectively are shown with only a single light emitting diode 225R.

As already earlier-noted each display module 14 also includes a centrally disposed daughter board 20 which handles the transfer of data between each of the display panel assemblies 14L and 14R respectively and also distributes power for use by the individual light emitting diodes. The electronic structure of the daughter board 20 will be described hereinafter in greater detail. For the moment, it will suffice to mention, that the daughter board 20 is adapted to be mounted to the backside of the LED frame 201 centrally disposed between the two PCA assemblies 14L and 14R. This center mounting arrangement is an important and unique feature of the present invention. In this regard, this arrangement, (1) enables a single power and data control board 20 to drive two separate display panel assemblies 14L and 14R respectively; and it also (2) enables the heat generated from driving the large bank of light emitting diodes associated with the display module 14 to be dissipated rearwardly into a large daughter board heat sink 24. As already mentioned, and as best seen in FIG. 7, the heat sink 24 is disposed within a cooling vent 91, when the display module 14 is latched within an associated structural bay member 16. The manner in which the component parts of the display module 14 are factory assembled will be described hereinafter in greater detail.

Detailed Construction of the Structural Frame

Figure 17:
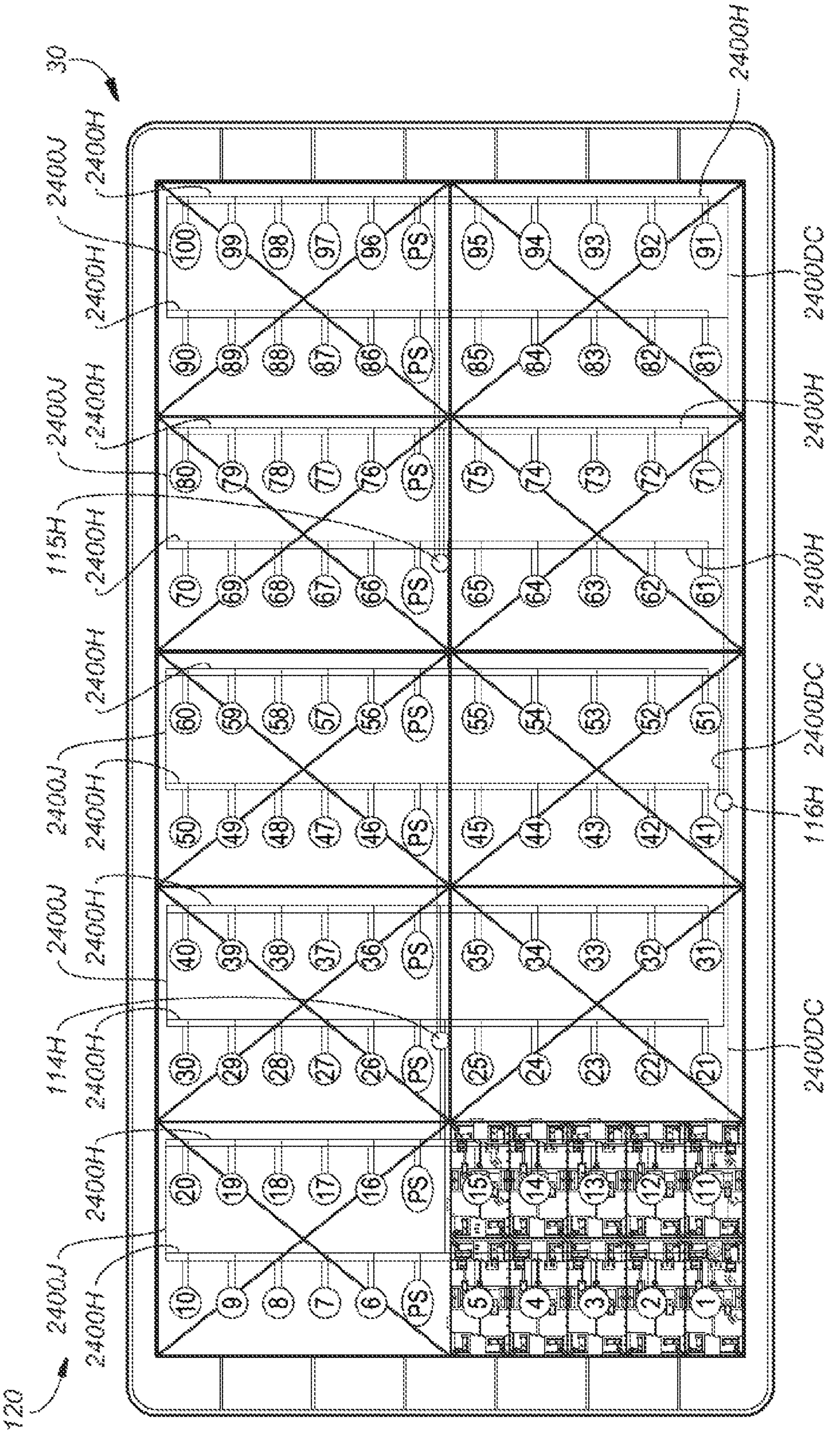
FIG. 17 is a schematic illustration of how all the power/data harnesses, all the data jumper cables and all the data connection cables are layout in the frame array and routed to respective power access holes and data access holes within the frame array leading to backside billboard junction boxes.

Considering now the structural frame 12 in still greater detail with reference to FIGS. 4-7 and 23, the structural frame 12 is configured in about a 4 foot wide by 5 foot high modular unit composed of structural foam. The structural frame 12 is a compound structure since it contains ten substantially identical structures in the form of structural bay members, such as the structural bay member 16. Each bay member 16 as earlier-mentioned is adapted to receive and support therein a display module 14. As the structural bay members are substantially identical in structure, only one of the structural bay members will be described; however, as needed, any structural bay having a unique feature from any other structural bay members 16 will also be described. For example, as already discussed, the bottom row of structural bays in a structural frame 12 includes an extra or lower over mold node receptacle 352 (See FIGS. 4 and 23). The bottom row of structural bay members 16 also include an extra set of wire routing features, such as a left side wire routing feature 308 and a right side wire routing feature 310 that will be described hereinafter in greater detail. The wire routing features 308 and 310 as well as the lower over mold node receptacle 352 are not found in the other four rows of structural bay members 16. These features are only found in the bottom row of structural frame bay members 16. This again, is an important and unique feature of the present invention, as it as will be described hereinafter in greater detail. For the moment, it will suffice to mention that these features enable routing of the data connection cables 2400DC (FIG. 24B) along this bottom row of the frame array 30 as best seen in FIG. 17. In a like manner, these features will help facilitate coupling power wiring from the frontside of the billboard to the backside of the billboard 110 as will be explained hereinafter in greater detail. Based on the foregoing, it should be understood, those structural frames with these unique features will always be installed in the 1st and 6th rows of the frame array 30.

Considering now the structural bay member 16 in greater detail with reference to FIGS. 4-7, the structural bay member 16 generally includes a plurality of irregularly shaped weight reduction cutout areas, such as a top left weight reduction cutout area 312, a bottom left weight reduction cutout area 313, a top right weight reduction cutout area 315, a bottom right weight reduction cutout area 316 and a pair of center right weight reduction cutout areas 317 and 318 which are adjacent to weight reduction cut out areas 315 and 316 respectively. The plurality of weight reduction cutout areas 312-318 are strategically positioned so the weight of the frame does not exceed 50 pounds and so as not to compromise the structural integrity of the structural frame 12 so it can withstand wind load forces in excess of 100 pounds per square foot. Such cutout areas also provide access areas for installer to easily reach power and data harnesses, wire routing hooks, and over mold or snap-in node receptacles. In this regard, harnesses, jumper and connection cables can be easily routed and secured within the bay members and secured to wiring harness node receptacles, such as the upper wire harness node receptacles 350, the lower wire harness node receptacles 351, which receptacles form part of each structural bay member 16.

As mentioned earlier, the bottom row of the structural bay members as best seen in FIGS. 4 and 23, include unique features not found in the other rows of structural bay members. As a result of these extra features, the other rows without these features are provided with different shaped cutout areas indicated generally as an expanded bottom left side cutout weight reduction area 304 and an expanded bottom right side cutout weight reduction area 306 as best seen in FIG. 23.

The wire harness node receptacles 350-351, are an important and unique feature of the present invention as they allow power and data wiring harnesses, such as the power data wiring harness 2400H, to be quickly and easily snapped or pressed into place within the frame array 30, which in turn, makes assembly of the plurality of harnesses 2400H into the array 30 very efficient while at the same time helping the installer to easily organize the power and data wiring of each of the structural bay members 16.

Each structural bay 16 further includes a plurality of latch receiving boss areas, which are oriented either in a lateral direction relative to the structural frame 12 or in a vertical direction relative to the structural frame 16. The latch receiving boss areas are further oriented to receive a frame latch assembly, such as a frame latch assembly 412 as best seen in FIG. 5 within associated latch latching member 416 extending upwardly, downwardly, to the right, or to the left so that the LED tile or display module 14 secured by the respective different ones of the latch assemblies 412 is protected against unwanted and unexpected wind load forces within the scope of building code requirements. In this regard, there are two +Y latch receiving boss areas; including an upper left side +Y latch receiving boss area 322 and an upper center +Y latch receiving boss area 323; a single left lower side −X latch receiving boss area 324; an upper right side +X latch receiving boss area 327, and two −Y latch receiving boss areas, including a lower center −Y latch receiving boss area 325 and a lower right side −Y latch receiving boss area 326. Each of the latch receiving boss areas 322-327 have pairs of latch mounting holes, such as a pair of latch mounting holes 320 and 321 respectively, which holes 320-321 are dimensioned for receiving a latch mounting rivet 419 to facilitate mounting the frame latch assembly 412 within its corresponding latch receiving boss area.

The orientation of the latch receiving boss areas 322-327 and their associated frame latch assemblies 412 is another important and novel feature of the present invention. In this regard the latching action of the individual frame latch assemblies 412 disposed in boss areas 322 and 327 are diagonally opposed in the ±Y directions, while the latching action of the frame latch assemblies 412 disposed in boss areas 324 and 325 are diagonally opposed in the ±X directions, and finally, the latching action of the frame latch assemblies 412 disposed in boss areas 323 and 326 are oriented in opposition to one another along a central axis of the structural bay member 16 in the +Y and −Y directions respectively. From the foregoing, it should be understood the multi-latching-directions as described herein assures that a LED display module 14 is completely protected from unwanted and unexpected wind loads. As will be explained hereinafter in greater detail, each display module 14 includes a corresponding or complementary set of latch receiving receptacles, such as a display module latch receiving receptacle 14LM as best seen in FIG. 9. In this regard, the module receiving receptacles 14LM are oriented similarly to the frame latch assemblies 412, in order to facilitate latching engagement with respective ones of the latch assemblies 412 mounted within respective ones of the structural bay members 16. For now, it will suffice to mention, that because of the unique modular construction of both the structural frames 12 and the display modules 14, the display modules of the present invention may be installed in any structural bay member 16 within the frame array 30. In short, there is no need for identifying installation location indicia within the frame array 30 for individual one of the display modules 14, as their placement is universal within the frame array 30.

Each structural bay 16 further includes a centrally disposed daughter board receiving cut out area 330 (FIGS. 4-5) which is disposed between the left side weigh reduction cutout areas 312-313 and the right side weight reduction cutout areas 317-318. The daughter board cut out area 330 is strategically positioned within the center of the structural bay member 16 directly over a structural frame lateral rear inside wall area 319 (FIGS. 6-7) that helps to define a vent column or cooling conduit, indicated generally at 91 in the structural frame 12. In this regard, a cooling conduit is formed when the structural frame 16 is secured with it rear face against the forward or front face of the poster panel 9 disposed directly rearward of the structural frame member 12. This daughter board cut out area 330 is sufficiently large to allow the heat sink fins 24F of the display module 14 mounted within such a cutout area to be disposed directly within the air path of the cooling conduit 91 as best seen in FIG. 7. In this manner, natural air flow along this cooling conduit 91 is sufficient to substantially cool a plurality of display modules which are similarly disposed in the same cooling conduit. For example, billboard 110 which is illustrated as being constructed with ten (10) structural frames 12 arranged in two rows and five columns would be provided with ten (10) structural bay members 16 in each row of the structural frames 12, and twenty (20) structural bay members 16 in each of ten column of structural frames 12 as best seen in FIG. 27. This array 30 of structural frames therefore, would include two cooling vents 91 in each structural frame 12 column, so a total of twenty cooling vents would be distributed across the entire frame array 30 given by equation 2:

$$\text{Total Number of Cooling Vent}=(10\ \text{Columns}\times 2\ \text{Vents/Column})=20\ \text{Coding Vents} \quad \text{[Equation 2]}$$

This in turn means that a total of 20 chimney vent locations would be disposed across the top and bottom of the structural frame array 30.

As already explained, labor costs are greatly reduced relative to using the retrofit kit 10 to convert a static billboard 8 into a dynamic billboard 110 because for a 11 foot by 22 foot billboard sign only requires ten (10) structural frames and one hundred (100) completely weatherized LED modules 14. To help minimize the time to install a structural frame so that the frame 12 is also completely weatherized against building code weather conditions, each structural frame 14 is provided with a pilot hole feature, such as a pilot hole feature 64 as best seen in FIG. 4. The pilot hole feature 64 is disposed in the bottom row of structural bay members 16 and therefore this feature helps an installers immediately identify the top and bottom of each structural frame 16 for frame array 30 mounting purposes. As will be explained hereinafter in greater detail the pilot hole feature 64 also helps an installer to determine where access holes 114H-116H (FIG. 17) will be drilled in the frame array 30 for routing power and data wiring within the structural frame array and out to the backside of the billboard 110 for connection to power junction boxes and a power data controller enclosure box as will be explained.

Figure 30:
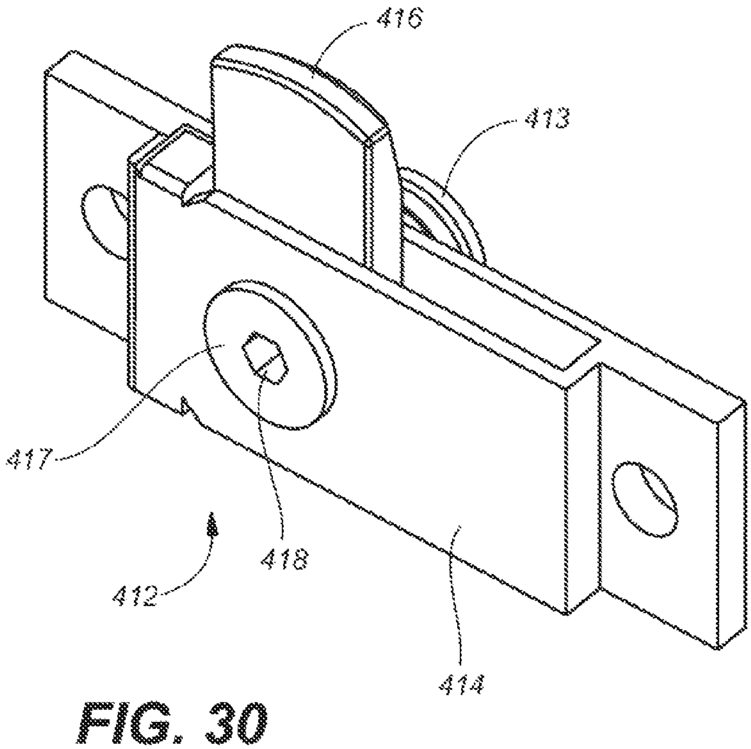
FIG. 30 is a greatly enlarged perspective view of a frame latch assembly forming part of the field modification kit of FIG. 2.

Considering now the frame latch assembly 412 in greater detail with reference to FIG. 30, the frame latch assembly 412 generally includes a frame latch housing 414 and a frame latch latching member 416. The housing 414 and the frame latch latching member 416 are adapted to be securely mounted within a latch receiving boss area of the structural bay member 16 as previously discussed. In this regard, the proper mounting orientation of a frame latch assembly 412 relative to an associated receiving boss area is done quickly and easily by the orientation of the boss receiving areas. In other words, a frame latch assembly 412 can only be received within a boss area in the correct mating orientation. Once the frame latch assembly 412 has been received or mounted within a boss area it is secure within the boss area by a frame latch assembly mounting rivet 419 which fastens the assembly 412 to the structural bay member 16 of the structural frame 12. It is contemplated that in order to expedite field installation time of the retrofit kit 10, that frame latch assemblies, such as the frame latch assembly 412 will be secured by a rivet to the structural frame 12 at the factory during structural frame construction time at the location of a structural frame vendor, rather than installing the latch assemblies 412 in the field.

Detailed Construction of the Display Module

Figure 32:
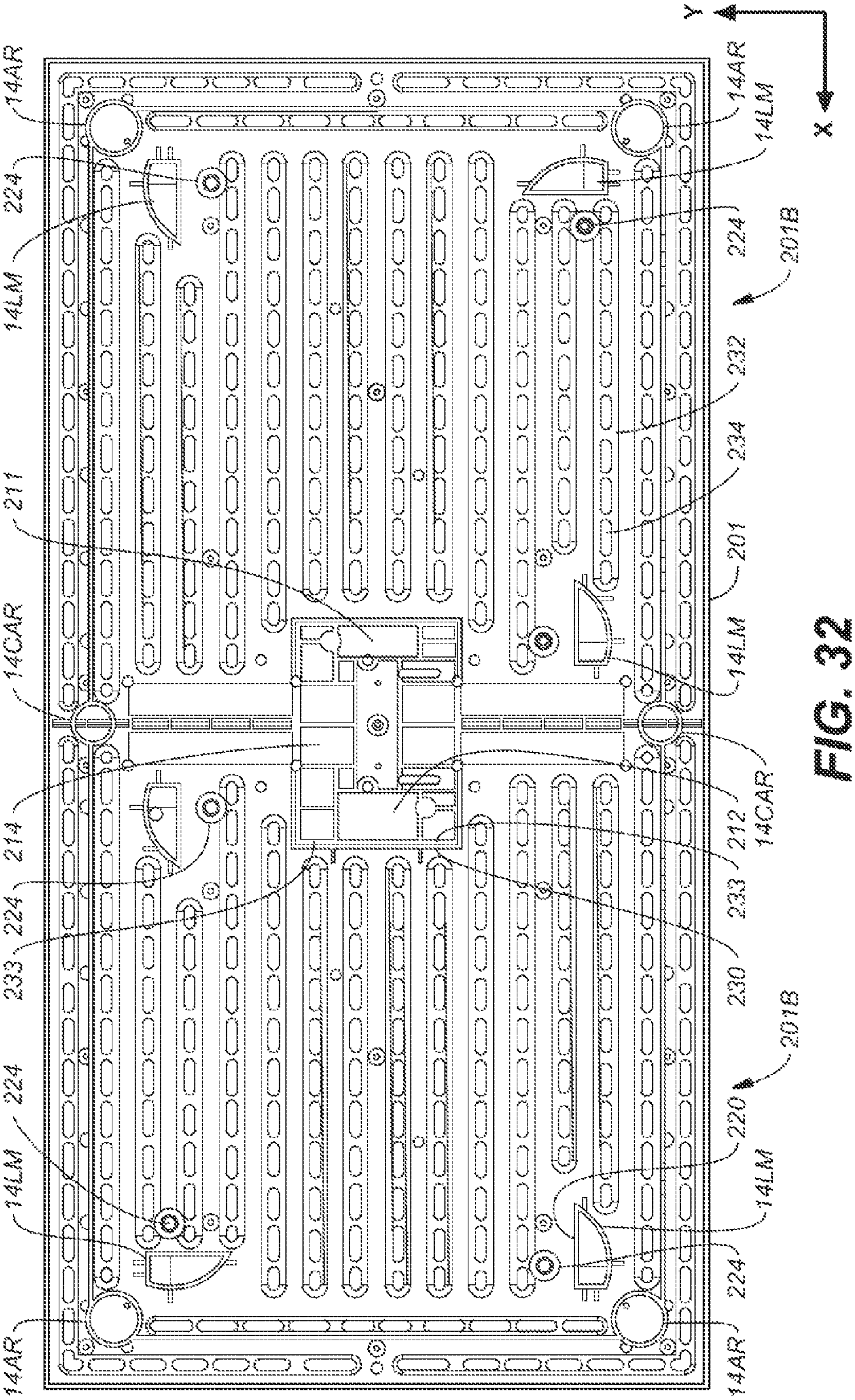
FIG. 32 is a top plane view of the backside of a LED frame forming part of the display module of FIG. 8.
Figure 33:
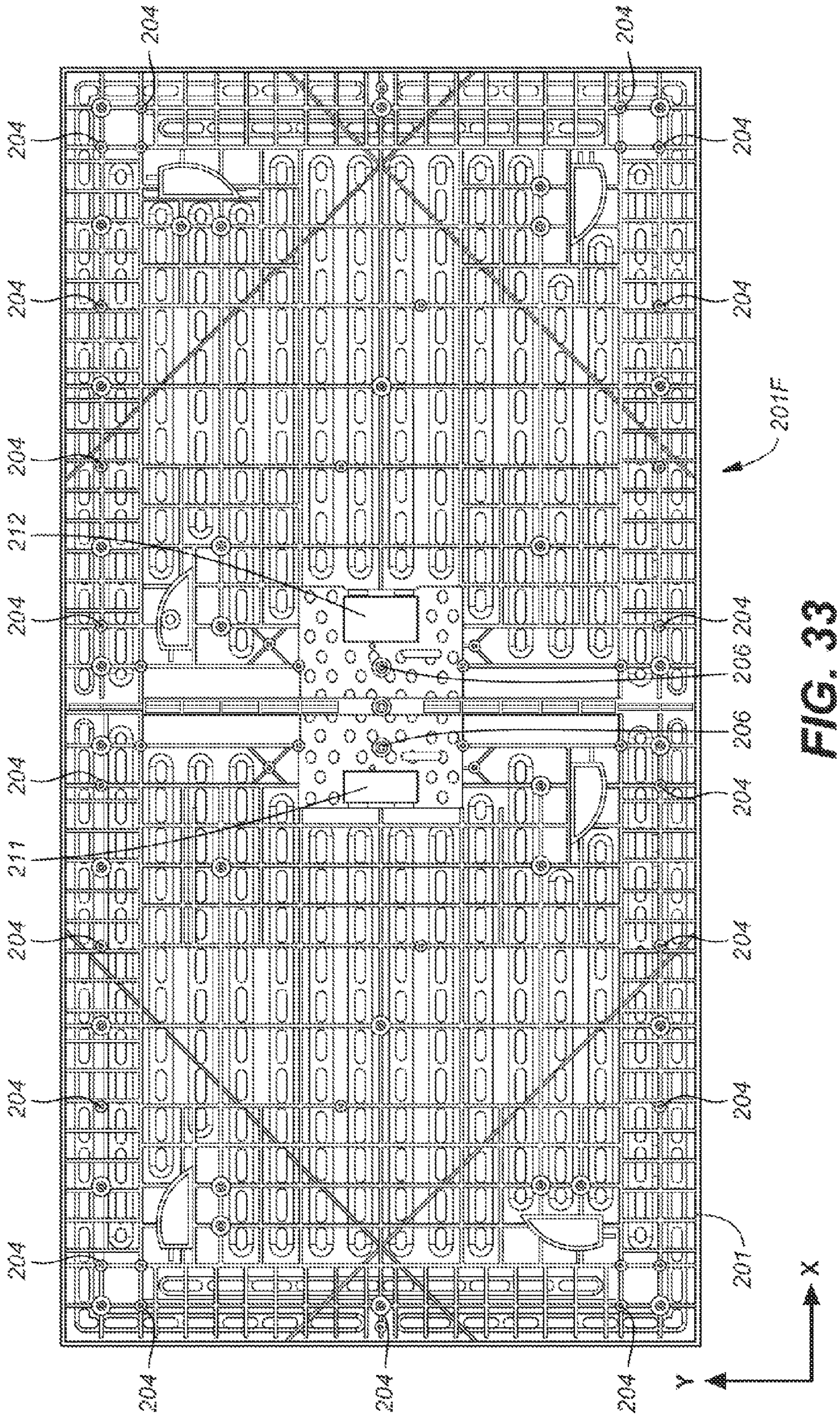
FIG. 33 is a top plane view of the frontside of the LED frame of FIG. 32.

Considering now the display module 14 in still greater detail with reference to FIGS. 10-11, 13 and 32-33, in order to facilitate the distribution of data and low voltage power, each display module 14 is provided with an integrated circuit assembly as the heretofore mentioned daughter board 20. The daughter board 20 is mounted to an LED frame 201. FIG. 32 is a backside view of the LED frame 201, and FIG. 33 is a frontside view of the LED frame 201, without the daughter board 20 being mounted thereto. Referring again to FIGS. 10-11, the daughter board 20 generally includes a printed circuit board 21 having mounted thereon a micro-controller which is disposed in an integrated circuit can 26 and a direct current to direct current converter 25. The micro controller 26 functions as an input/output data transferring device which is mechanically and electrically coupled to a twelve-pin power and data connector, indicated generally at 27. The connector 27 is mounted to the printed circuit board 21 and is adapted to be connected to a mating power and data connector 2400HM forming part of a set of preformed power data harnesses, such as the harness 2400H. The power data harnesses 2400H distribute power and data throughout the array 30 of structural frames as best seen in FIG. 17. The direct current to direct current converter 25 includes a left side low voltage channel 70 and a right side low voltage channel 72 for distributing a stepped down low voltage from 24-30 VDC to 4 VDC for use by the individual light emitting diodes, for example diodes 225R, 225G and 225B (and their drivers), forming the pixel structures on the display panels 14L and 14R respectively. The daughter board 20 also includes a daughter board dam, indicated generally at 22, which is adapted to be secured to the printed circuit board 21 by screws (not shown) through the plastic frame. The daughter board dam 22 overlays a thermal pad forming part of the DC-to-DC converter 25. The dam 22 allows for an isolated increased potting depth at the connector, which is aligned to the board before the dam 22 is placed in position. The dam 22 also facilitates the mounting of the daughter board heat sink 24 in proper orientation to the other components of the daughter board 20.

To facilitate distribution of data and power to respective ones of the display panels 14L and 14R, the daughter board 20 is further provided with a pair of spaced apart pin headers, including a left side pin header 28LSPH and a right side pin header 28RSPH which in combination with the power data connector 27 enables the display module 14 to be electrically and mechanically coupled to the power data distribution system 120 as will be explained hereinafter in greater detail.

As already mentioned, the display module 14 generally includes a left side PCA display panel assembly 14L and a right side PCA display panel assembly 14R. As will be described shortly, and as best seen in FIG. 10, the left side PCA assembly 14L includes a printed circuit board 610, while the right side PCA assembly 14R includes a printed circuit board 612. Sometimes during the following detailed description of the assembly of the display module, the term PCA assembly 14L may simply mean the printed circuit board 610 with loaded light emitting diodes. In a similar manner the term PCA assembly 14R may simply mean the printed circuit board 612 with loaded light emitting diodes. This occurs because once the assembly of the display module 14 has been completed the left side PCA assembly 14L and the right side PCA assembly 14R are adhesive secured to the LED frame on their respective front left side 201FL and front right side 201FR and can not be removed individually from the LED frame 201. The above described terminology therefor occurs during those instances where the PCA assemblies 14L and 14R have not been adhesive secured to the LED frame 201 and it is utilized simply for that purpose.

Figure 31:
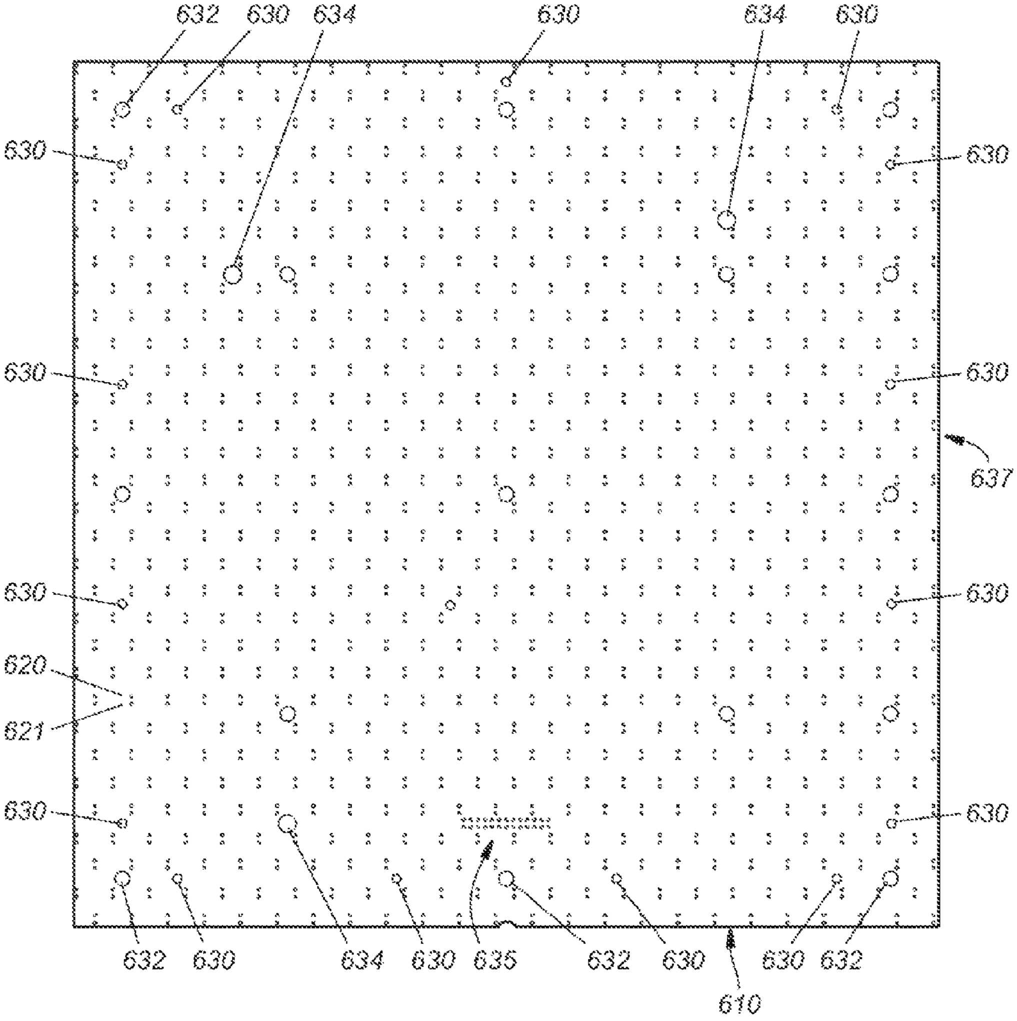
FIG. 31 is a top plane view of the frontside of a printed circuit board forming part of the display module of FIG. 8.

Considering now the PCA assembly 14L in greater detail, the PCA assembly 14L generally comprises a printed circuit board 610 which is provided with a plurality of pairs of LED mounting holes, such as LED mounting holes 620-621 as best seen in FIG. 31. The LED mounting holes 620-621 are dimensioned for receiving and surface mounting individual ones of the LEDs 225R, 225G and 225B. In this regard, the positive and negative leads of the LEDs are received in their respective mounting holes, trimmed and soldered to the printed circuit board 610, until all the LED mounting holes disposed on the printed circuit board 610 have been loaded. The printed circuit board 610 is also provided with a set of latch access holes, such as a latch access hole 634 that enables frontside access to the structural frame latch assemblies and their actuators, such as an actuator 418 as best seen in FIG. 30. The printed circuit board 610 also includes a set of header pin mounting holes, indicated generally at 635. These header pin holes indicated at 635 are dimensioned for receiving a set of header pins, which extend outwardly from the connector 28LSPH mounted to the daughter board printed circuit board 21. The PCB assembly 14R, since it is mounted to the right side of the LED frame 201, has its header pin mounting holes 635 disposed on the center left side of its associate printed circuit board 612. Indicia markings, such as the indicia marking indicated generally at 637 provide an assembler a visual indication of whether a given board is to be mounted on the top left side of the LED frame 201 or on the top right side of the LED frame 201. This orientation is important as it provides an indication of a further position reference so the latch access holes 634 in the printed circuit board 610 are placed in their proper orientation to the other component parts of the display module 14.

As best seen in FIGS. 10 and 32-33, the left side PCA 14L is adapted to be securely mounted to a front left side 202 FL of the LED frame 201. In a similar manner, the right side PCA 14R is adapted to be securely mounted to a front right side 201FR of the LED frame 201. For the moment, it will suffice to mention that the left side PCA 14L is provided with a left side pin header slot or opening, indicated generally at 211, while the right side PCA 14R is provided with a right side pin header slot 212 which is larger than slot 211 as it further accommodates the power data connector 27 as best seen in FIG. 33. These slots 211 and 212 are utilized for aligning and helping to mount the power data connector 27 and the left side pin header 28LSPH and the right side pin header 28RSPH of daughter board 20 to the LED frame 201. In this regard, the daughter board 20 is mounted by a pair of screws (not shown) to a centrally disposed dam receiving space or area indicated generally at 214 on backside 201B of the LED frame 201.

To facilitate these various mounting tasks, the frontside 201F of the LED frame 201 is provided with a set of alignment mounting features, such as an alignment mounting 204 (FIG. 33), while the individual ones of the printed circuit board assemblies 14L and 14R are each provided with a plurality of alignment holes, such as a left side alignment hole 630 as best seen in FIG. 31. In this regard, during assembly of an individual one of the display modules 14, which assembly occurs in a factory setting and not on-site or in-the-field, an assembler will line up the plastic stand-off features 204 disposed on the front left side 201FL of the LED frame 201 with the left side alignment holes 630 disposed in the left side PCB 610. Each individual one of the printed circuit board assemblies 14L, 14R is marked with orientation indicia in the form of a left or right arrow indicating which side of the PCA is up. Assembly continues by the assembler making certain that the PCB 610 is push down flush within the front left side 201FL the LED frame 201. This alignment and mounting procedure is repeated for the front right side 201FR of the LED frame 201 and the right side PCB 612. Once the printed circuit board assemblies 610 and 612 are mounted flush to the LED frame 201, they are then secured to their respective frame sections utilizing a set of seventeen (17) Zinc plated, M2.6×8 mm screws with a torque driver set to 5 inch pounds.

Considering now the weather sealed display module 14 in still greater detail with reference to FIGS. 10-11 and 32-33, the LED frame 201, is provided with a set of daughter board alignment features, such as an alignment feature 206 as best seen in FIG. 33. The daughter board alignment features 206 facilitate assembly of the daughter board 20 to a backside of the LED frame 201. In this regard, with the LED frame 201 flipped over onto a soft ESD sage surface, the daughter board alignment features 206 are clearly seen and are utilized to mount the daughter board 20 to the LED frame 201. As best seen in FIG. 11, the circuit board 21, forming part of the daughter board 20, has a corresponding set of alignment features in the form of a set of alignment holes 207 and 208 respectively. The alignment holes 207 and 208 are dimensioned to receive therein the alignment posts 206 of the LED frame 201.

During assembly, after the board 21 has been mounted to the LED frame 201, the alignment holes 207, 208 are sealed with a standard industrial silicone sealing agent. Once the alignment holes 207 and 208 are sealed, the power data connector 27, which is a standard Molex connector, and the left side pin header 28LSPH and the right side pin header 28RSPH are aligned with their respective header openings 211 and 212 in the left side PCA 14L and the right side PCA 14R, while the pins of the data power connector 27 are aligned within the alignment opening 212. The connector body of the power connector 27 is further aligned with a plastic dam alignment feature 230 which is disposed on the backside the LED frame 201. When so aligned, the daughter board 20 is then pushed downward into place until it is flush with the LED frame 201.

To facilitate correctly mounting the brick 25, the brick 25 is provided with a set of off set holes (not shown) which should be aligned toward the center of the daughter board 20 over the large integrated circuits disposed on the daughter board 20. Once the brick 25 is mounted, then a thermal gap pad 25A is mounted to brick 25.

Next in the assembly process of the display module 14, a bead of industrial silicon is deposited around the edges 22E of the daughter board dam 22. This bead of silicon material forms a dam around the connector pins of the power data connector 27. The daughter board dam 22 is then installed over the daughter board 20 with the silicone side of the dam 22 and against a corresponding centrally disposed dam feature indicated generally at 233 (FIG. 32) forming part of the LED frame 201. The daughter board dam 22 is then secured in place over the daughter board 20 with a single screw (Zinc plated, M3×15) with a torque driver set to 5 inch pounds. This structure forms a seal preventing potting material that will be introduced from leaking away from the daughter board 20.

With the daughter board dam 22 and thermal gap pad 25A installed, the daughter board heat sink 24 is then mounted to the dam 22 with a set of six (6) Zinc plated screws (M3×15). The heat sink screws further secure the dam 22 to the LED frame 201. It is important to note that the screws for securing the heat sink 24 to the dam 22 must be followed in a direct sequence as follows: first in the middle left, second in a top right, third in a top left, fourth in a middle right, fifth in a bottom left, and sixth in a bottom right. This order reflects that the header connector on the right hand side of the assembly.

Next, the left side pin header 28LSPH is soldered to the face of the left side printed circuit board 610 or PCA 14L, while the right side pin header 28RSPH is soldered to the right side printed circuit board 612 or PCA 14R. The frontside of the display module 14 is then potted using a standard potting compound, such as a potting compound manufactured and sold by Shin-Etsu Chemical Co. Ltd. of Tokyo, Japan, identified as their 3 component mat surface potting material KE-1283. In this regard, the potting is poured to substantially a 3 millimeter depth and then cured in an oven at ninety (90) degrees Centigrade for about 30 minutes. The potting in this case must cover every exposed surface area of the printed circuit boards 610 and 612 but without allowing any of the potting material to touch the tips of the light emitting diodes mounted in their respective printed circuit board assemblies 14L and 14R.

After the display module 14 has been removed from the oven and allowed to cool, the left side louver 17L is install to the face of the left side printed circuit board assembly 14L using a set of thirteen screws (black paint, M2.6×8 mm) per side. A louver visor 17V (FIG. 10) is disposed at an edge portion on one side of the frame 201 but not on the other side. That side with the visor 17V is a top side and is installed accordingly so that when the display module 14 is in the upright position, the top row of light emitting diodes mounted therein will all be red light emitting diodes.

Next, the daughter board dam 22 is potted with a standard potting compound, such as a potting compound manufactured and sold by Shin-Etsu Chemical Company, Ltd as identified earlier. In this regard, the potting of the daughter board dam 22 must be followed in a direct sequence as follows: first that side opposite the power data connector 27 starting with the dc-dc brick side first. This area is filled with a sufficient amount of potting material until the potting material is level with the bottom of the aluminum extrusion of daughter board heat sink 24. Next, the power data pins are encapsulated with the potting compound, which is a sufficient amount of potting material, is poured over the pins until they are completely covered. Finally, the balance or rest of the daughter board dam 22 is filled ensuring that all areas and all components of the daughter board 20 are completely covered.

As a final step, a set of perforated potting troughs, such as an elongate perforated potting channel 232 having a plurality of perforations, such as a perforation 234 disposed along it bottom trough area are disposed on the rear or backside of each of the printed circuit board assemblies 14L and 14R respectively are filled to a depth of about 2 millimeters with a standard potting compound, such as a potting compound manufactured and sold by Shin-Etsu Chemical Company, Ltd. identified earlier. Once all the troughs are filled, the display module 14 is placed in an oven at ninety (90) degrees Centigrade for a period of about 30 minutes to allow the poured potting compound to sufficiently cure. The display module is then removed from the oven and allowed to cool.

Figure 18:
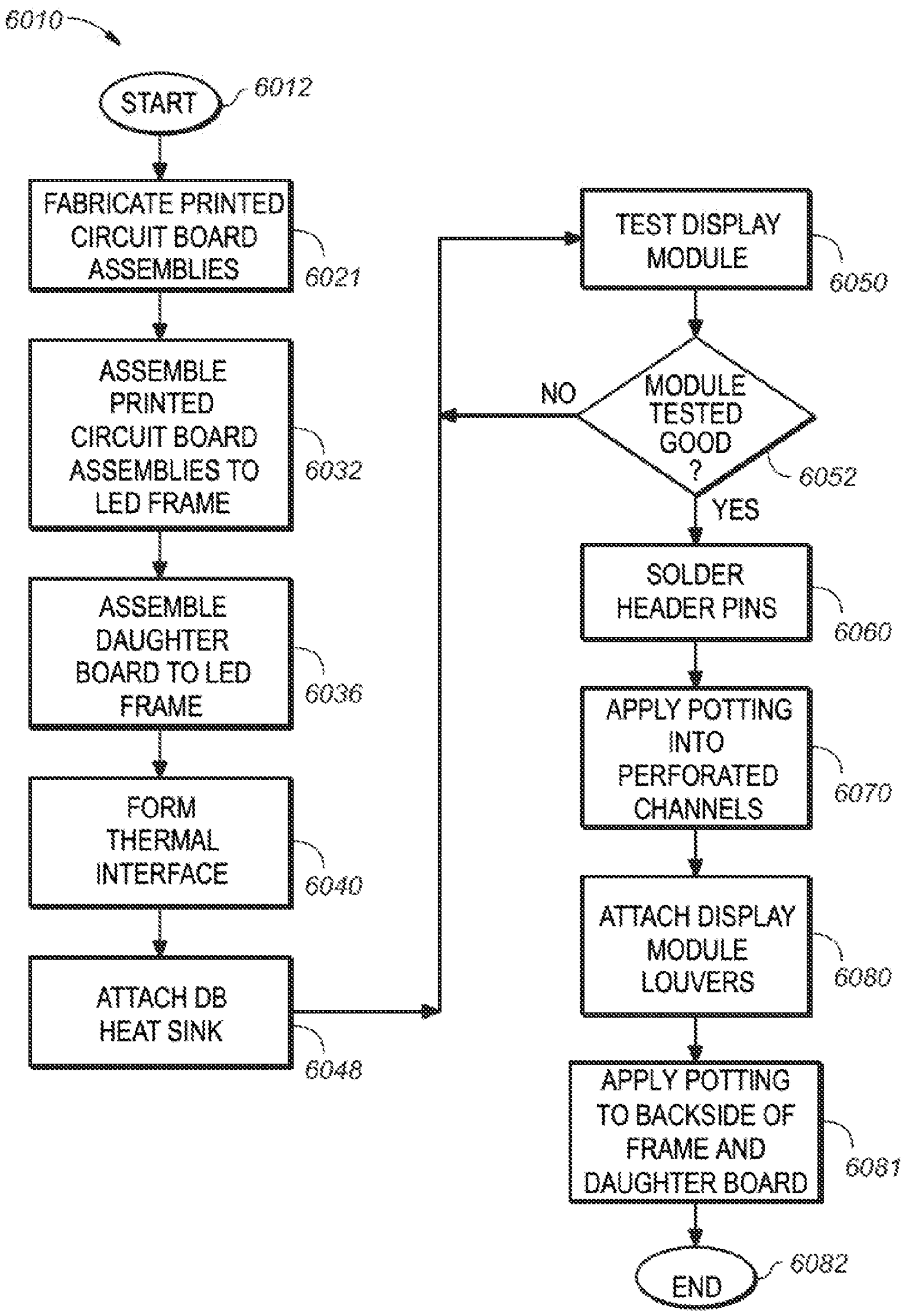
FIG. 18 is a flowchart illustrating the steps followed in assembling a light emitting diode display module forming part of the in field modification kit of FIG. 2.

As noted earlier, the assembly process followed for assembling each display module 14 is done at a factory and not on-site or in-the-field where the conversion process is being performed. In this regard, the retrofit kit 10 is provided with a set of completely assembled display modules, such as the sealed display module 14. Each sealed display module 14 then is completely weatherized and made immune to invasion by insects and other small animals. This is an important feature of the present invention. FIG. 18 provides a flowchart depiction of the display module board 14 assembly processes.

Considering now the display modules in still greater detail, each display module 14 is provided as a completely sealed printed circuit board assembly which is substantially rectangular in shape with a long X axis, an intermediate Y axis, and a short Z axis. Each module 14 is completely sealed from the outside and each display module 14 as best seen in FIGS. 8-9 has a frontside 215 and a backside indicated generally at 216. The backside 216 has a plurality of module alignment features, such as a module alignment feature 14AR and 14CAR. The individual alignment features 14AR and 14CAR extend along the short Z axis of the module 14. The backside 216 also has a plurality of latch receivers, such as a latch receiver 14LM. The individual ones of the latch receivers 14LM each have a latch access opening or cutaway area indicated generally at 220 which openings 220 are dimensioned to receive therein a module latch 416 forming part of latch assembly 412 mounted on the frontside of the structural frame array 30. In operation, when a latch 416 is received within an individual one of the latch receivers 14LM, the latch 416 and latch receiver 14LM cooperate to pull the display module 14 into its associated structural bay member 16 while simultaneously applying a retaining tension so the display module 14 is held in a tight fit within its associated structural bay member 16 of the structural frame array 30.

A total of six (6) module latches receivers 14LM are provided on each display module 14 and these receivers 14LM are aligned to receive the structural frame latches, such as a latch 416. In this regard, the receiver latch openings 220 are configured to receive an associated module latch 416 in generally a lateral direction which is parallel to the XY plane of the display module 14. In this regard, two of the latch openings 220 receive a module latch 416 in the +Y direction, two of the latch openings 220 receive a module latch 416 in the −Y direction, one of the latch openings 220 receive a module latch 416 in the +X direction, and one of the latch openings 220 receive a module latch 416 in the −X direction. Stated otherwise, the module latches receivers 14LM and the structural frame latch assemblies, such as the latch assembly 412 are arranged in a generally zigzag layout pattern which allows for flexibility during installation but more importantly and which is considered a unique and novel feature of the present invention. In this regard, the zigzag layout optimizes and protects each module display 14 from being dislodged from its structural bay member 16 due to unexpected high force gusts of wind. It is in this manner, each individual display module 14 is firmly and securely latched within an associated structural bay member 16. Each individual latch receiver 218 further has disposed adjacent to it a tool access opening indicated generally at 224, which is best seen in FIG. 32 which is a back plane view of the LED frame 201. Each tool access opening 224 is dimensioned and configured to receive therein an actuation tool 912 for engaging and actuating the module latch actuator 418 associated with its latch 416 (FIG. 30).

In summary then, as best seen in FIG. 18, a display module manufacturing process 6010 begins with a start step 6012, and immediately advances to a fabricate a printed circuit board assembly step 6021. At the fabrication step 6021, a printed circuit board assembly, such as the PCA 14L is assembled as described earlier herein. The manufacturing process continues to an assembly step 6032, where the individual PCA units 14L and 14R are attached to the frontside 201F of the LED frame 201 by a set of fasteners (not shown).

Next, at an assembly step 6036, an assembled daughter board 20, is secured to the backside 201B of the LED frame 201. During this assembly process, the header pins extending from the daughter board 20, from its left side and from its right side are received within the header pin mounting holes 635 of respective ones of the printed circuit boards 610 and 612 forming part of PCA assemblies 14L and 14R respectively. Next, the daughter board heat sink 24 is attached to the backside of the daughter board 20 at a form thermal interface step 6040 and its associated attach heat sink step 6048.

Next, the now partially assembled display module is tested at a testing step 6050 to verify that the daughter board 20 and the associated PCA units 14L and 14R are fully operational. If not operational, the unit is diagnosed to determine what repairs are necessary to place the assembly into an operational condition and repair is made. If the partially assembled display module is fully operational, the header pins of the daughter board are soldered at a solder step 6060 to their respective printed circuit boards.

Once the display module is so assembled, a weather sealing step 6070 is performed where the perforated adhesive channels 232 of the frame 201 are filled with a potting compound adhesive 236 (FIG. 9). This adhesive flows through the perforations 234 and forms a sealing layer of compound across the entire rear surface of the printed circuit board assemblies 14L and 14R respectively. The potting compound is allowed to cure in an oven at about 80 degrees Centigrade for about 30 minutes. Once cured, the display module 14 is removed from the oven and turned over to its frontside where the assembly process is completed at an attach louvers step 6080. At the attach louver step 6080, the right side louver 17R is attached to the right side display panel assembly 14R and the left side louver 17L is secured to the frontside 201F of the left side display panel assembly 14L. The manufacturing process then ends at an end or stop manufacturing display module step 6082. An important feature and novel feature of the present invention is that display modules or tile 14 may be installed within any structural bay member 16 forming part of the frame array 30. No special marking or indicia is need on any display module 14 to indicate where it should be installed within the frame array 30 and thus, significantly and substantially reducing installation and retrofit time.

Figure 13:
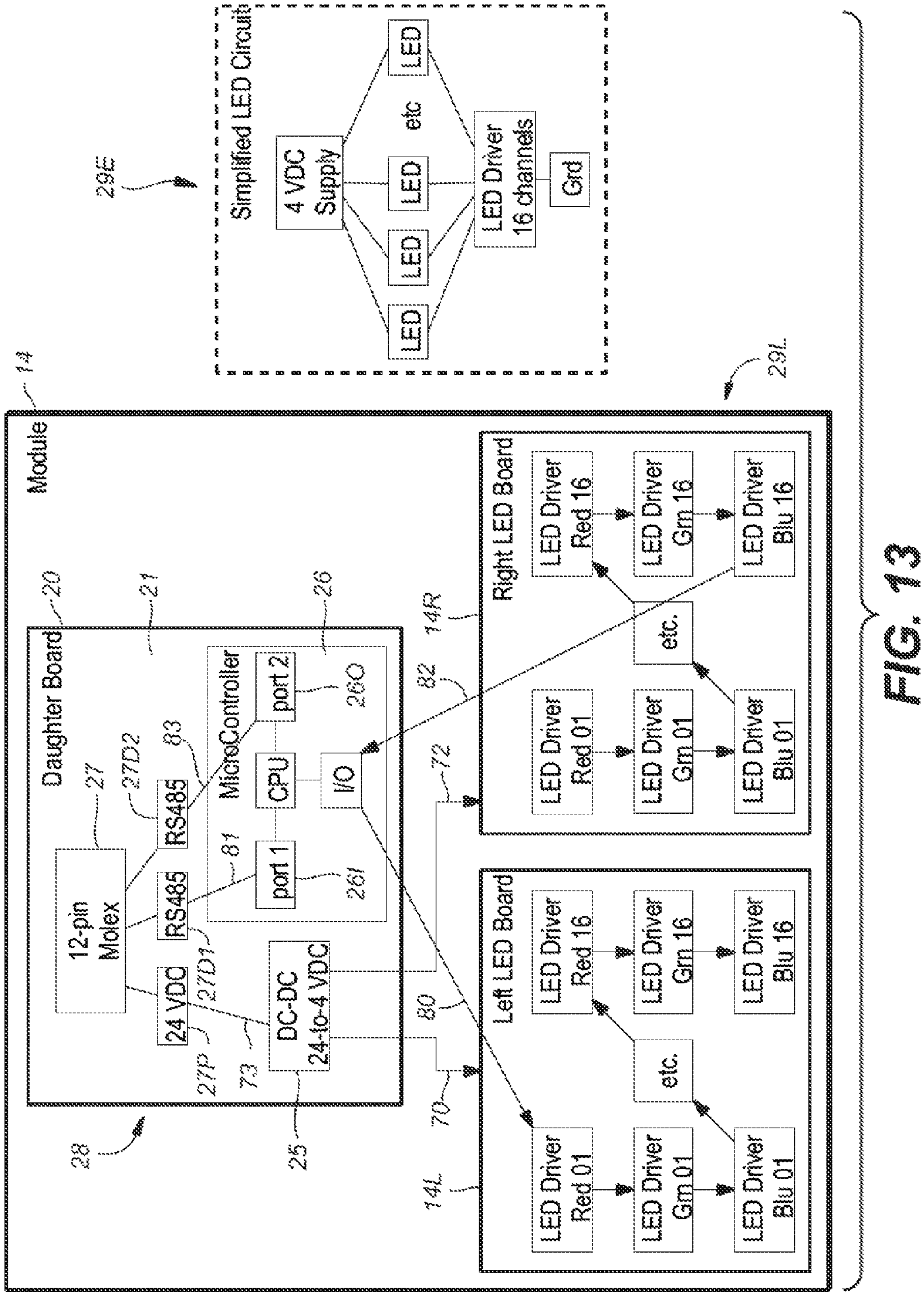
FIG. 13 is a greatly simplified electrical circuit block diagram of the display module of FIG. 11.
Figure 26:
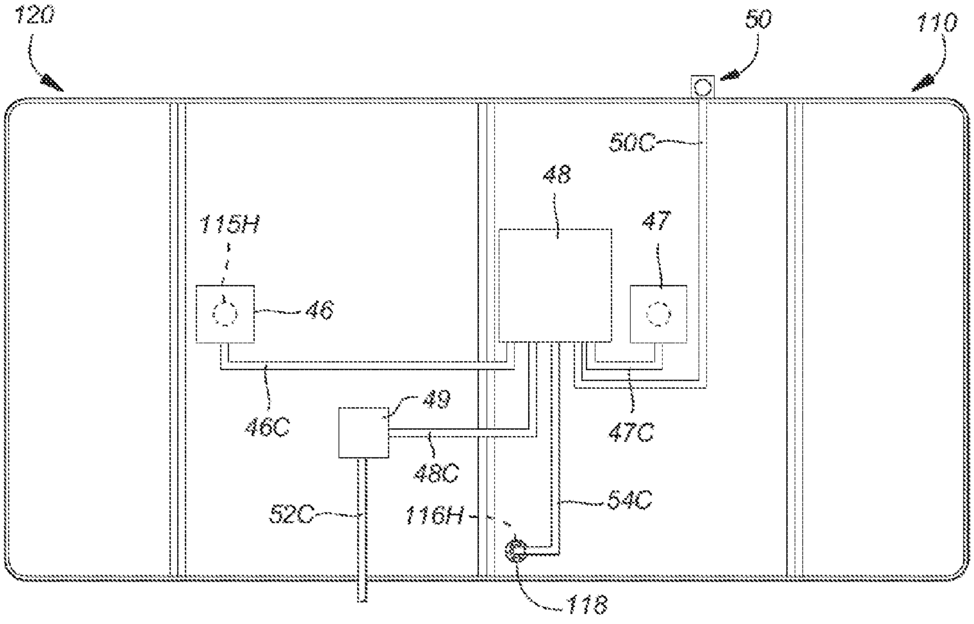
FIG. 26 is a rear elevational view of a billboard of FIG. 1, illustrating component parts of the power data routing system.

The above-mentioned electrical structure of the display module 14 is best seen in FIG. 13, which is a block diagram illustrating part of the power data routing system 120 (FIGS. 17 and 26). That is, the power data routing system 120 is routed and installed both on the frontside of billboard 110 via the structural frame array 30 and on the backside of the billboard 110 via the various components of the power modification kit 10C. Each individual display module 14 mechanically and electrically couples into this power data routing system 110 to provide radiant light energy. FIG. 13 therefor is a very simplified electrical block diagram of the display module 14 illustrating its interconnecting electrical component and interconnections that will be described hereinafter in greater detail. For the moment, it will suffice to mention that the power requirements for the billboard 110 are determined by the voltage drop constraints and that routing paths for power data wiring harnesses are fixed by various structural frame features that have been described herein with greater detail.

Referring now to FIG. 13, the electrical structure of the display module 14 is illustrated in very simplified block diagram form, showing that the display module 14 generally includes the daughter board 20 and its associated LED display panel boards 14L and 14R respectively. The daughter board 20 includes an integrated circuit board 21 having mounted thereon a DC-to-DC converter 25 and a micro controller 26. Both the DC-to-DC converter 25 and the micro controller 26 are electrically coupled between a power data interface indicated generally at 28 and respective ones of the LED display panel boards 14L and 14R. In this regard, the DC-to-DC converter 25 is electrically coupled to display panel 14L by a left board DC power path 70 and to display panel 14R by a right board DC power path 72. The micro controller 26 is coupled to display panel 14L by a left board data path 80 and to display panel 14R by a right board data path 82.

The power data interface 28 includes direct electrical connections from the twelve-pin data/power connector 27 via a power port pin 27P and power conductor 73 that provides 24 VDC power to the DC-to-DC converter 25. The power data interface 28 also includes a direct electrical connection from the connector 27 via a pair of data port pins 27D1 and 27D2 and a pair of data connectors 81 and 83 respectively that provide input and output data paths to the micro controller 26 and its input port 261 and its output port 260. In this arrangement, a closed loop data path is formed between the display panels 14L and 14R respectively.

FIG. 13 also provides a greatly simplified block diagram of the electronics 29E for each display panel, such as the display panel 14L. In this regard, it can be seen that power conductor 70 supplied the panel 14L with a rectified direct current low voltage of about 4 VDC stepped down from about 24-30 VDC, which 4 VDC is coupled to each of the light emitting diodes or modular electrical conversion devices disposed on panel 14L. The data conductor 80 is coupled to 16 channels of light emitting diode drivers indicated generally at 29L for driving individual ones of the red, green, and blue light emitting diodes forming part of the electronics 29E. As this same arrangement is implemented for the display panel 14R, it will not be described in further detail for the display panel 14R.

The Retrofit Kit Installation Procedure

Figure 19:
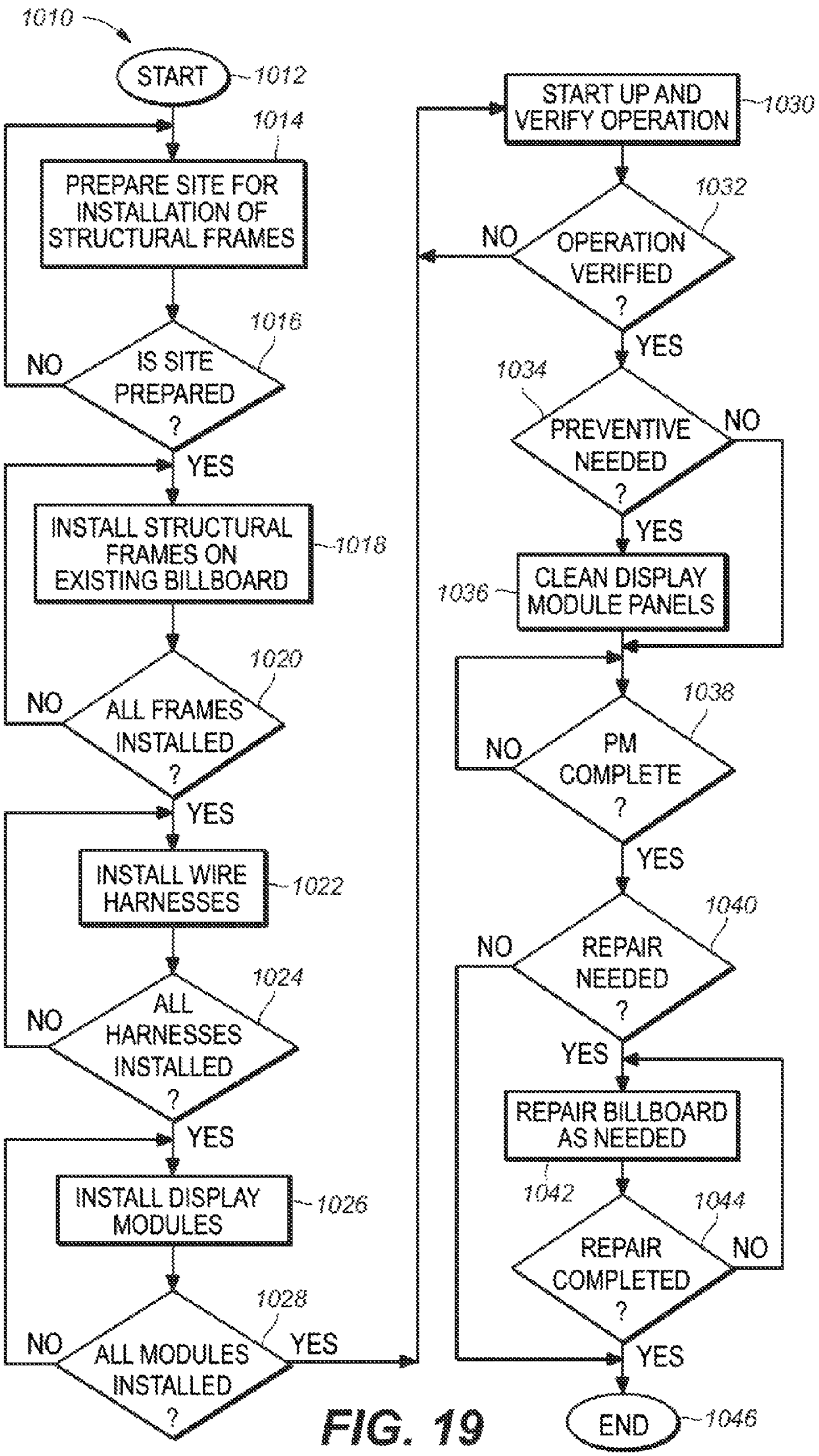
FIG. 19 is a flowchart illustrating the steps followed in using the in field retrofit kit of FIG. 2 to convert a non electronic billboard into an electronic billboard.

Considering now with reference to FIG. 19, a retrofit procedure 1010 is illustrated, which procedure 1010 is followed in accordance with the retrofit steps of the present invention. The retrofit procedure 1010 is carried out on-site for an existing non-electronic billboard 8, in order to retrofit or convert the billboard 8 into a dynamic electronic billboard 110. The retrofit procedure 1010 involves the following major steps:

1. Site preparation to verify that an existing poster board is acceptable to overlay with a digital light emitting diode billboard;

2. Structural frame installation to prepare the existing poster panels of the billboard 8 for the mounting of a plurality of display or light emitting diode modules, such the fully weatherized LED display module 14 as best seen in FIGS. 8-9;

3. Wire harness and backside power installation for providing the bay array embodied within each structural frame with a source of data and direct current electrical power;

4. LED display module installation by providing each individual bay within the bay array with a display module 14 having dual LED display panels, such as LED display panels 14L and 14R respectively as best seen in FIG. 25; and 5. A start up and verify operation for signage content and updating.

Each of these major steps will be described hereinafter in greater detail, but for now it will suffice to mention, that after verification of operation, two important follow on steps are considered part of the retrofit procedure 1010; namely:

6. A preventive maintenance and cleaning process; and

7. An actual maintenance and repair process should repair be required.

These last two steps will be briefly described at the conclusion of the detailed description of the retrofit process 1010.

The Preparation of the Site for Kit Installation

Referring now to FIG. 19, the retrofit procedure 1010 begins with a start step 1012 and commences to a call site preparation step 1014. At the site preparation step 1014, the installation team seeks to verify that that the existing poster panels of the static billboard 8 are acceptable to be overlaid with an array of LED display modules, such as the LED display module 14. In this regard, the team proceeds from step 1014 (FIG. 19) to a site preparation process 2010, as best seen in FIG. 20.

Figure 20:
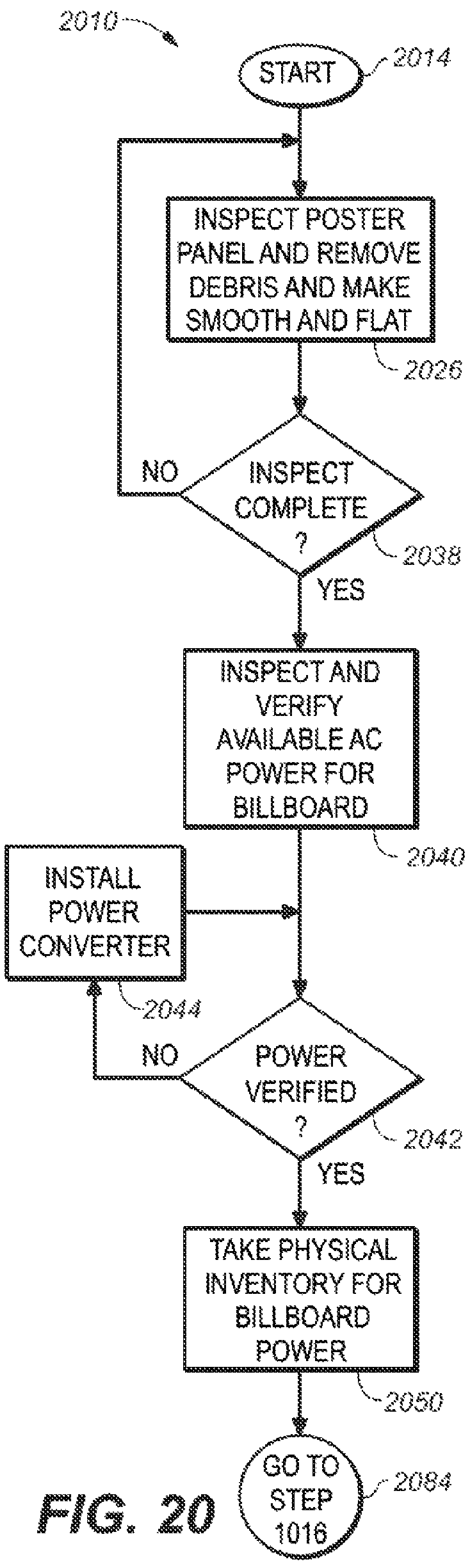
FIG. 20 is a flowchart of the steps followed by an installation team in preparing an existing billboard for the retrofitting process.

Considering the site preparation process 2010 in greater detail with reference to FIG. 20, the process begins at a start step 2014, and proceeds to an inspection step 2026. At the inspection step 2026, the installation team conducts a visual inspection of the existing poster panels, such as a poster panel 9. A poster panel 9 may from time to time hereinafter be referred to as poster board(s), which phrase stems back to the time when static billboards were constructed of wood instead of sheets of metal as used in construction today. There is no intention of limiting the installation of the retrofit kit 10 to billboards or poster boards as the retrofit kit 10 is constructed to be installed on any type of structural planar back panel constructed of any suitable structural material in accordance with local building codes. In this regard, when the word "billboard" or "poster board" is used herein it is intended to be inclusive of any type of structural planar back panel.

During the inspection step 2026 the installation team addresses areas of the sheet metal poster panels which may be broken, bent or damaged in any way. The surface of each poster panel 9 is also inspected to make certain the surface is substantially flat and uniform as possible to facilitate the proper mounting and installation of each hand mountable structural frame 12 forming part of the retrofit kit 10. In addressing these areas the installation team will remove any vinyl or paper left over from old static paper panel images. The team will further clean the surface of the billboard panels of any unwanted materials.

Once, the visual inspection step 2026 has been completed at a determination step 2038, the installation team proceeds to a power inspect and verification step 2040. If it is determined, that inspection is not completed at step 2038, the team returns to step 2026 and continues as described earlier. Continuing then, at verification step 2040, the team begins by simply determining that the billboard site is provided with acceptable 2-phase, 240 VAC 40 amp power or 2-phase, 120 VAC, 80 amp power. It should be understood that when other input power is provided, for example, when the billboard 110 is being installed outside of the United States where the countries power is something different from the standard U.S. power sources, a power converter 49 (FIG. 26) may be installed at an install power converter step 2044 to provide a rectified power source for the billboard 110. In this regard, the billboard system of the present invention is a universal power system fully capable of using any available power source in the world.

After inspection of available power, the team proceeds to a verification step 2042 so the team can mark on its installation checkout list (not shown) that proper power has been verified. If proper power has not been verified the team will either install a power converter 49 at the install step 2044 or take whatever other corrective action is necessary to assure that proper power is available. Once there is a determination of the availability of acceptable power at a determination step 2042, the installation team follows a safety procedure while working with electrically components by turning the power off at a main circuit breaker and then provides the circuit breaker with a lock out tag out in accordance with local safety regulations. Next the team disconnects any lights remaining from the static display site and the associate wiring that provided power for illuminating the static display billboard with light. As a final action, a confirmation step 2050 the team takes a physical inventory to verify that all parts needed as best seen in FIG. 2 are available by cross referencing parts to a provided parts list for the site billboard 8 which is being retrofit or converted.

Figure 21:
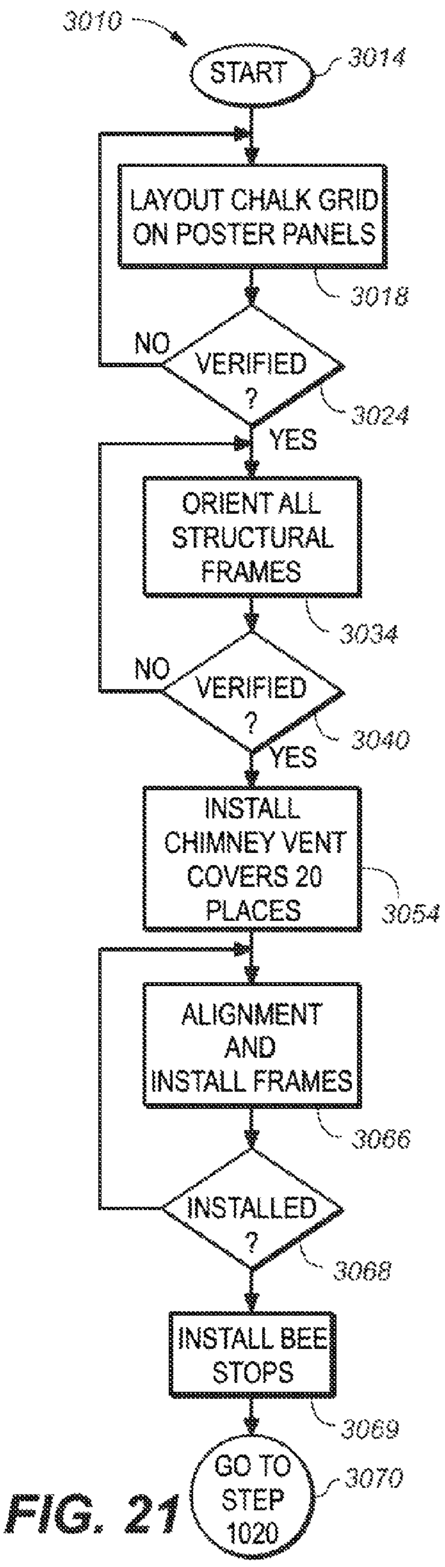
FIG. 21 is a flowchart of the steps followed by an installation team in preparing an existing billboard site for installation of the structural frames.

After the confirmation step 2050 has been completed, the installation team proceeds by going to a go to step 2084 and follows a checklist at a determination step 1016 (FIG. 19). At step 1016, the team verifies that the site preparation process performed at step 1014 has been completed. If anything has been overlooked, the team returns to the site preparation process 1014 and proceeds as described before until the site is properly prepared. If the site is properly prepared, the installation team then advances to a call install step 1018 which causes the team to initiate a structural frame installation process 3010 as best seen in FIG. 21.

The Structural Frame Installation

The structural frame installation process 3010 (FIG. 21) begins at a start step 3014 which prompts the team to begin preparing the poster panels of the existing billboard 8. This preparation process is best understood with reference to FIG. 3. At the start step 3014, the team gathers the necessary tools and chalk to do the preparation task. After gathering their materials the team advances to a layout step 3018. At layout step 3018, the installation team prepares the poster panels 9 of the existing static billboard 8 for installation of the structural frames, such as a structural frame 12. This preparation begins by the installation team using a ladder, a plum line, measuring tape and chalk, to lay out a grid pattern 508 (FIG. 3) on the frontside or face of the poster panel billboard 8. This grid pattern 508 will be a visual indication of the size and pattern of the structural frames that will be installed on the billboard 8 for its conversion. This begins with the installation team finding a horizontal center point of the static billboard 8 and then measuring 10 feet to the left of a horizontal center point line 514 at the top and bottom of the billboard 8 and then running chalk lines 512T and 512B respectively. The installation team then runs a chalk line 513 from the distal ends of lines 512T and 512B to mark a left lower corner starting point 520 for the installation of a starting structural frame 12. FIG. 3 provides a visual indication of how the billboard would appear after the first or initial structural frame 12 is installed, while FIG. 27 provides a visual indication of how the billboard would appear after all of the structural frames in the kit 10, have been installed.

Next, during the layout step 3018, the installation team measures the billboard 8 to find the vertical center point line 516 and then measuring one frame height down on the left and right side of the billboard 8, they run a chalk line 514 between these two points.

Next, at the layout step 3018, using the above-mentioned reference lines, the installation team lays out the grid pattern 508 using a chalk line to represent the size and pattern of the structural frame. The team then verifies the grid measurement by measuring the layout diagonally at a verification step 3024 via a pair of corner to corner diagonal chalk lines 522 and 524 respectively. It should be understood that the above-mentioned measurements are not absolute. They can be shifted horizontally and or vertically to avoid issues with the billboard structure when needed. Should this occur at verification step 3024, the team returns to step 3018 and proceeds as described earlier; otherwise, the team is ready to advance to the next task.

Once the billboard 8 poster panels have been prepared with the grid layout 508, the team proceeds to an orientation step 3034 that facilitates the unpacking and orienting of the structural frames 12 from their packing pallet for installation on the poster panels of billboard 8. In this regard, each structural frame 12 is thin and ultra light so the frame 12 can be easily handled and oriented for installation. To facilitate proper orientation, it should be noted that the pilot hole feature 64 which is located in the first or bottom row of the structural bay member array. In this regard, the pilot hole feature 64 further function as a visual indicator for where the bottom of each structural frame 12 is disposed. As will be explained hereinafter in greater detail, when the frames are laid out on the panels 9, the pilot hole feature 64 will also be disposed in either a bottom row of the structural bay members indicated generally at 16B (FIG. 27) or in a middle row of structural bay members indicated generally at 16M when considered as part of the total frame array 30.

Figure 29:
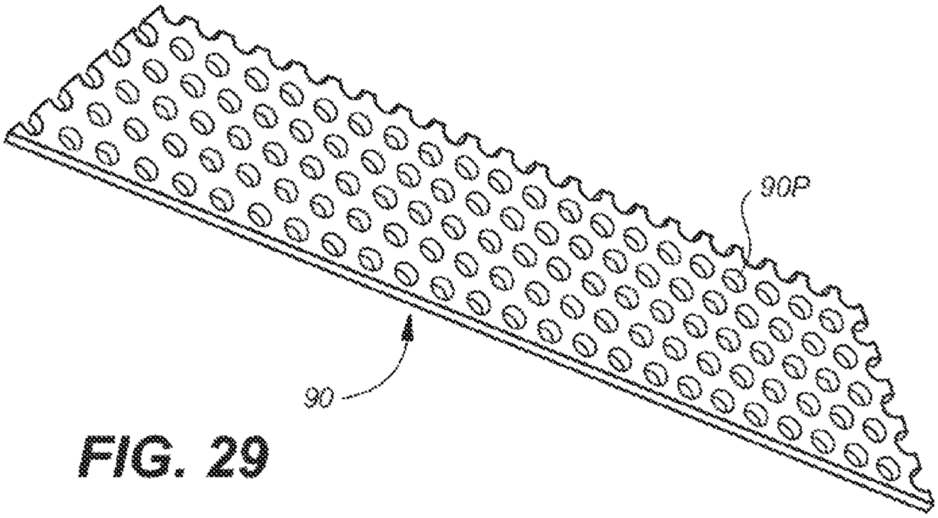
FIG. 29 is a greatly enlarged perspective view of a chimney vent cover forming part of the field modification kit of FIG. 2.

The pilot feature 64 also then provides an indication to the installation team of which side of a frame 12 goes up and which side of the frame is facing the frontside, since the pilot feature 64 will also be disposed on the left side of the structural frame when it is disposed facing toward the frontside of the billboard 8. During this unpack and orient step 3034, the installation team also designates ahead of time which structural frames will be on a lower row of the grid layout and which structural frames will be on an upper row of the grid layout. This advance determination is made because it will determine where the unique chimney vent structures, such as a chimney vent cover 90, as best seen in FIG. 29, will be installed within a structural frame 12 prior to the individual structural frames 12 being mounted to the poster panels 9 of the billboard 8. When the installation team has completed the unpacking step a determination is made at a verification step 3040 that all the necessary parts are available to complete installation. The process then proceeds to a chimney vent installation step 3054.

At the chimney vent installation step 3054, the installation team installs each individual chimney vent cover 90 either in a top structural frame area or in a bottom structural frame area of the so the installed vent cover 90 functions to cap each chimney vent ingress or egress channels 91 relative to all lower frame horizontal surfaces and all upper frame surfaces as best seen in FIGS. 6-7 for example. Each chimney vent cover 90 is provided with a plurality of perforations, such as a perforation 90P as best seen in FIG. 29, which is sufficiently small to prevent environmental debris such as leaves from clogging the free air venting system created between the existing billboard 8 poster panels and the structural frames 12 mounted thereon. The chimney vent covers 90 also prevent birds and other small animals as well as insect pests from entering and nesting in the cooling channels of the venting system, such as the cooling channel 91 (FIG. 7).

Once the chimney vent covers 90 have been inserted into respective ones of the structural frames 12 at step 3054, the installation team begins the actual installation of the structural frames relative to the poster panels 9 at a align first frame step 3066. During this step 3066, the installation team takes the first frame 12 and starting on the bottom left hand corner of the grid layout 508, the bottom left corner of the frame 12 is positioned at the bottom left corner 520 of the grid chalk lines so the bottom of the frame 12 and the left side of the frame falls in alignment with the left side grid chalk line 513 and the bottom grid chalk line 512B. When the frame 12 is aligned, a member of the installation team screws a self-drilling screw, such as Tek screw 92 as best seen in FIG. 23 into a top mounting hole, a middle mounting hole and a bottom mounting hole on the frame 12, each hole being identified in general as a mounting hole 93 for a self drill screw 92. If necessary, these top, middle and bottom mounting screws 92 can be repositioned to other mounting holes 93 on the frame 12 in order to avoid seams in the billboard 8 structure. Four Tek of self drilling screws 92 are utilized to secure the first frame 12 to the poster board 8. For clarity purpose, not all of the mounting holes 93 have been identified with reference characters, but their locations within the frame 12 can be clearly seen in FIG. 23. Similarly only two of the self-drilling screws 92 are shown in FIG. 23 for clarity purposes.

After the first frame 12 is secured to the poster panel 9, the installation team will install the next structural frame 12 to the immediate right of the first frame 12. In this regard, a set of dovetail joints (FIG. 27), such as a set of side frame dovetail joints 84 and a set of bottom frame dovetail joints 86, facilitate a quick and easy, frame 12 to frame 12 alignment processes. Each individual one of the dovetail joints includes a dovetail alignment tab 94 (FIGS. 4-5) and a dovetail alignment tab slot 96 (FIGS. 6-7) which is adapted to receive the tab 94 extending from an adjacent frame or in this case, the second frame 12. This dovetail arrangement of tab to tab slot alignment assures that the second frame is properly aligned with the first frame and is ready to be secured in place. It should be noted that the two frames must be flush to one another for proper installation. The second frame 12 is then secured to the poster board 9 using the Tek screws 92 provided in the retrofit kit 10. In short then, the second frame 12 is dovetailed in perfect alignment with the first frame 12. This dovetail process is then repeated until all of the structural frames as outlined in the grid have been installed in the bottom row. It should be noted that when the individual frames 12 are secured to the poster panels 9 of the billboard 8, a substantially airtight fit is created between their contacting surfaces, which in turn creates a pair of self cooling air channel columns or conduits, such as the air channel column indicated generally at 91 as best seen in FIG. 23. As already noted, and as best seen in FIG. 7. Prior to installing a frame 12 against the billboard 8 poster panels, each of the air channel columns 91 are capped with chimney vent covers 90 as hereinbefore described. In this manner, the covers 90 can not be removed, once the structural frame 12 is secured to the billboard 8 poster panels.

When the bottom row of structural frame members 12 has been installed, the installation team verifies that all the frames are in alignment and lined up with the chalk lines and are substantially level. Once the alignment of the bottom row of frames has been determined, the installation team installs the top row of frames using a substantially similar procedure starting at the top left and proceeding to the top right. After the top row of frames has been installed the installation team verifies that the bottoms of the top row of frames 12 is flush with the tops of the bottom row of frames 12 and that the top of the top row of frames is in alignment with the top chalk line of the laid out grid. If any adjustments are needed, the installation team makes the necessary adjustments to achieve an array of structural frames which are in perfect alignment with one another.

Next to make certain the frames are securely fastened to the billboard 8 so that they may not be dislodged or come loose during windy conditions, the installation team using a standard drill drills secondary holes through the billboard steel frame poster panels for each of the structural frames 12. Nine holes are drilled for each frame 12 and nine bolts, with associated washers and nuts, are utilized to further secure each frame to the poster panels 9 of billboard 8. The individual bolts 112B are torque to 8-inch pounds and are installed at the bottom left frame corner, the middle left of the frame, the top left corner, the top right corner, the middle right of the frame, and the bottom right corner of the frame. To facilitate the installation of the mounting bolts each structural frame 12 is provided with a set of mounting bolt holes, such as a mounting bolt hole 112H as best seen in FIG. 4. In order to avoid issues with poster panel 9 structure flaws or conflicts with structural seams, the structural frame 12 is provided with an excess number of bolt mounting holes 112H along its peripheral boundaries. In this regard, the placement of the bolts can be distributed to other mounting bolt holes 112H if needed.

After all the frames have been secured with mounting bolts 112B, and verified that they are properly secured at a determination step 3068. If not properly installed the team returns to step 3066 and continues as described earlier. Otherwise, the installation team proceeds to an install bee stops or plug step at 3069, where a set of bee stops, such as a bee stop plug 98, are installed into each perimeter opening in the structural frame array 30. The bee stop plugs 98 are an important and unique feature associated with the structural frames 12. In this regard, the slot 97 disposed in the top, bottom, right side and left side of the structural frame function as wire routing access hole to enable power and data wires mounted on the various ones of the structural frames 12 to pass from one frame to another frame and ultimately to the power access holes 114H and 115H and the data access hole 116H to traverse to the backside of the billboard 110 for connection to the power and data control system. The hole or slots 97 on the outside walls of those structural frames not butted up against the walls of an adjacent frame 12 would otherwise be open allow access to bug, insect, wasps, and bees. By closing these access holes with the plugs 98, bees, wasps, hornets and the like are stopped from entering the frame array 30 and creating nesting hives behind the display modules mounted to the frontside of the billboard. This would otherwise create a safety hazard, as a repair or maintenance team would never know when a display module 14 was unlatched and removed, whether a hive of bees or hornets would be disposed behind the module 14. The installation of the bee stops or plugs 98 completely eliminates this unwanted safety hazard.

With the bee plugs 98 in place, the installation team is now ready to mechanically and electrically couple the frame 12 to a source of electrical power. In this regard, the installation process returns to determination step 1020 via a go to step 3070 (FIG. 21), where the team verifies that all the structural frames 12, all the chimney vent covers 90 and all the required bee stops or plugs 98 have been properly installed and that wiring of the structural frames is now ready to be commenced. If verification is not made at determination step 1020, the process returns to the install step 1018 (FIG. 19) and proceeds as described before.

Based on the foregoing, it should be understood by those skilled in the art, that each structural frame is provided with a sufficient number of both vertical axis mounting holes and lateral axis mounting holes which are distributed throughout the structural frame, each mounting hole being dimensioned for receiving therein a mounting bolt to facilitate securing the structural frame to the poster panels 9 of billboard 8 so that a sufficient mounting force may be applied to the structural frame to substantially eliminate face to face separation of the structural frame and the poster panel in wind load forces in excess of 100 pounds per square foot. In this regard, the wind force rating applied to the anchored billboard 8 can be matched relative to the frame to poster panel anchoring arrangement as described herein.

The Wire Harness Installation

Figure 22:
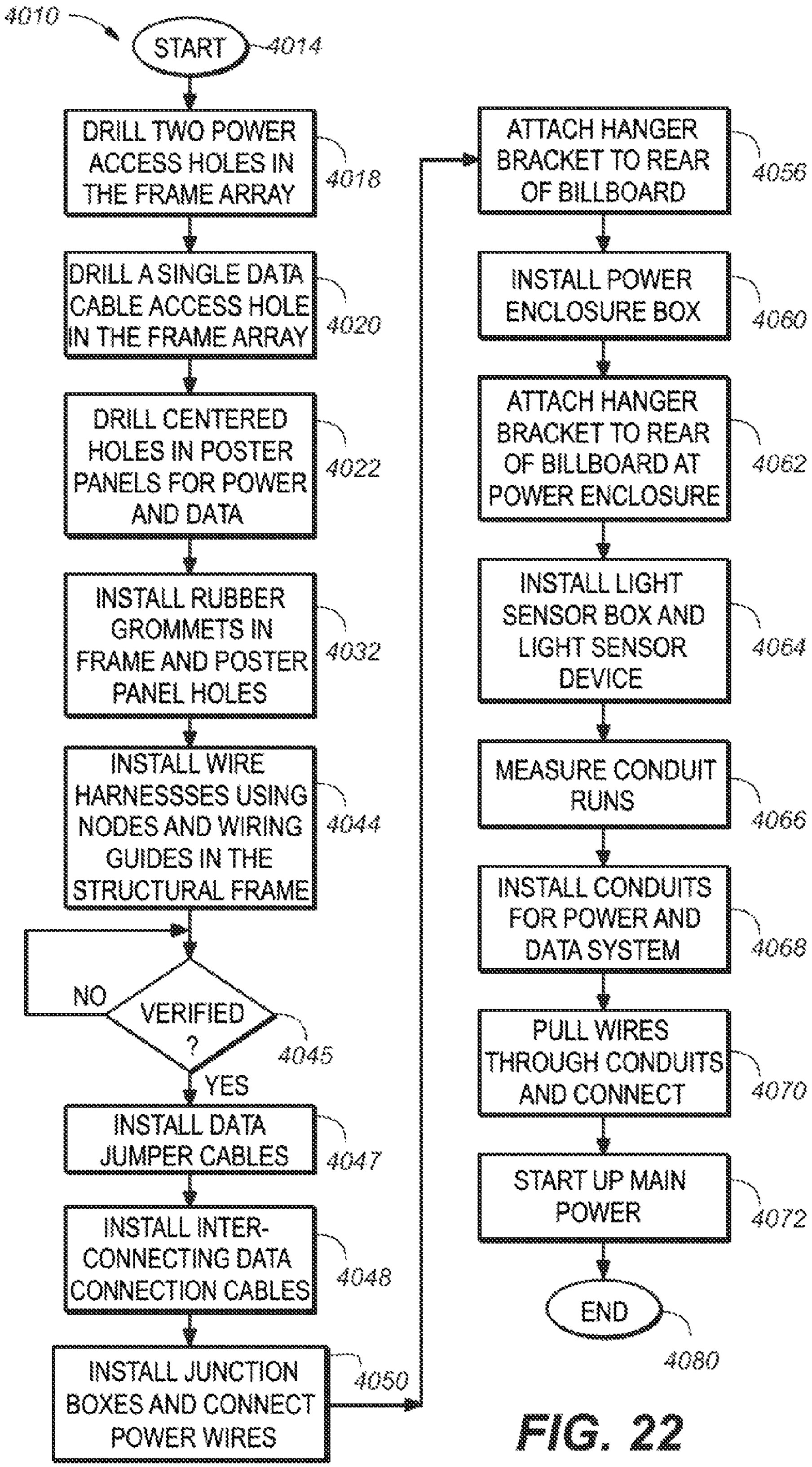
FIG. 22 is a flowchart illustrating the steps followed by an installation team for installation of the power and data wire harnesses of FIG. 24C using the in field modification kit of FIG. 2, to convert a static sign into a dynamic advertising display.

From the determination step 1020, the team advances to a call install wire harnesses step 1022 which initiates an install wire harness process 4010, as best seen in FIG. 22. The process 4010 begins at a start step 4014 which directs the team to a drill access hole step 4018. At step 4018, the installation team drills a pair of power access holes 114H and 115H in the frame array 30 as indicated in FIG. 17. These access holes 114H and 115H are drilled at the pilot features 64 disposed in the $6^{th}$ row of frames in the frame array 30.

Next at a drill data access hole step 4020, the installation team drills a two inch data access hole 116H in the frame array 30 as indicated in FIG. 17, again using the pilot feature 64 in the bottom row 16B of structural bay members 16. In this regards, the two upper holes, at 114H and 115H are power access holes because of their close proximity to the power harnesses 2400HE, while the lower hole 116H is a data access hole because of its close proximity to the data connection harnesses 2400DCC as best seen in FIG. 17. In short, a total of three holes are drilled into the frame array 30. It should be noted that the pilot hole feature 64, as best seen in FIGS. 4-8 is formed with a small starter hole. This small starter hole is utilized by the installation team as they drill these larger two inch holes in the frame array 30. This is an important feature of the present invention as it prevents the larger two inch drill from slipping on the structural frame 12, which could not only be a safety hazard, but it could also increase the likelihood that the frame 12 could be damaged.

Next, the installation team at a drill centered holes step 4022, drills one inch holes through the poster panel steel structure centered with the two inch holes drilled in steps 4018 and 4020 respectively. This will enable the wire harness installed to the face of the structural frame array 30 to be coupled to the backside of the billboard 8 to make mechanical and electrical connections with the power and data boxes installed on the backside of the billboard 110 as best seen in FIG. 26.

After the holes are drilled as described-above, the installation team at a grommet installation step 4032, install two inch rubber grommets, such as a rubber grommet 118 as best seen in FIGS. 5 and 7, in each of the three two inch frame holes 114H, 115H and 116H respectively.

Figure 14:
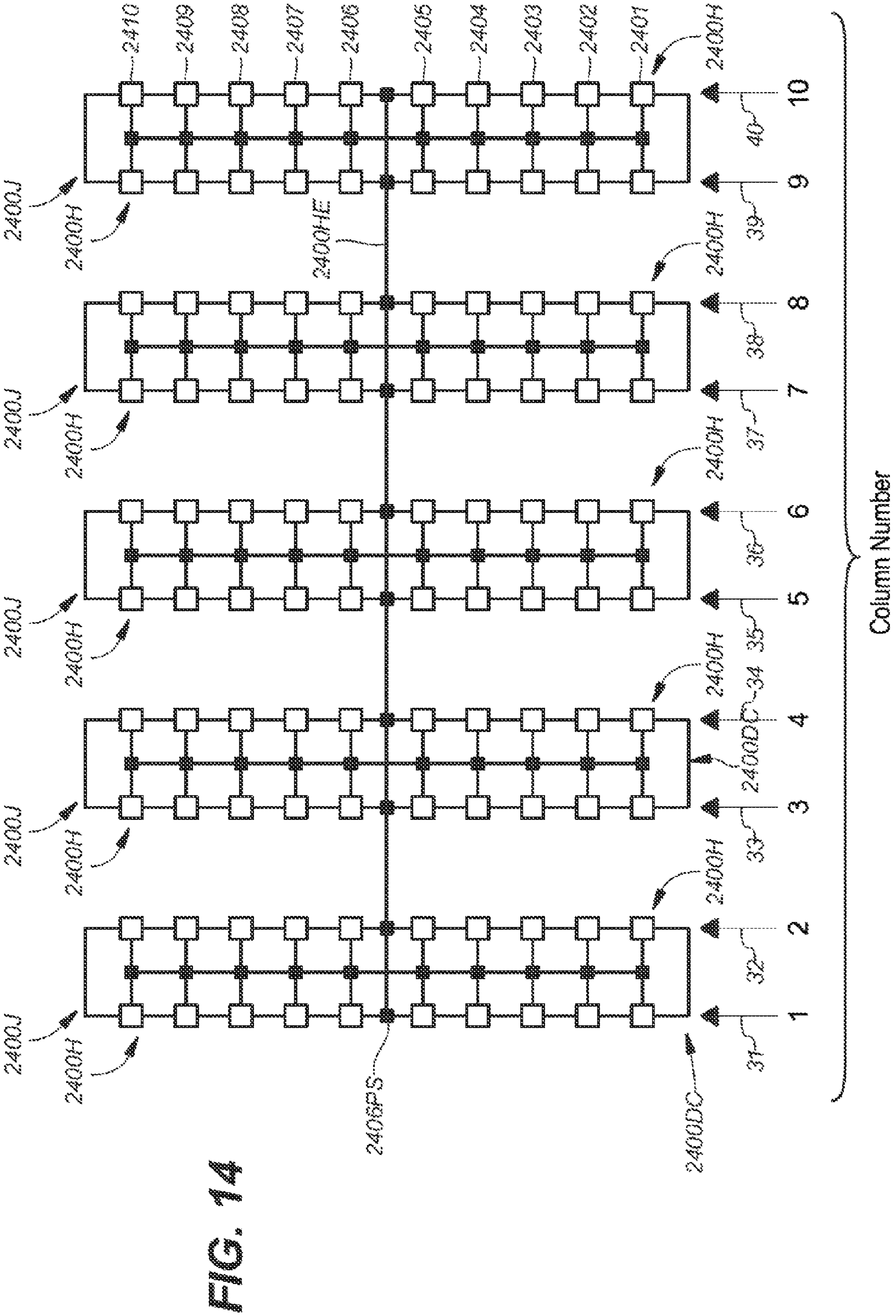
FIG. 14 is a diagrammatic view illustrating a column number arrangement forming part of the power and data distribution system of the in field modification kit of FIG. 1.

Next, at an install power/data wiring harness step 4044, the installation team connects in a specific sequence a set of power/data wiring harnesses, such as the wire harness 2400H. This sequence begins at the left side of the frame array 30 in the first column indicated generally at 31 in FIG. 14. Referring now to FIGS. 14, 17 and 19, the installation team starting with a first connection sequence indicator 2401S for a first node or over mold locator 2401 in the power/data wiring harness 2400H to a first power/data node receptacle 350 in the first row of structural bay members 16 as best seen in FIG. 28. The team then continues to connect each consecutive node locator in the wire harness 2400H into the remaining locations sequentially as follows: a second connection sequence indicator 2402S for a second node locator 2402 to a second power/data node receptacle 350 in the second row of structural bay members 16; a third connection sequence indicator 2403S for a third node locator 2403 to a third power/data node 350 in the third row of structural bay members 16; a fourth connection sequence indicator 2404S for a fourth node locator 2404 to a fourth power/data node 350 in the fourth row of structural bay members 16; a fifth connection sequence indicator 2405S for a fifth node locator 2405 to a fifth power/data node 350 in a fifth row of structural bay members 16.

As best seen in FIG. 28, two node receptacles 350 and 352 are disposed in the sixth row of structural bay members. Accordingly, the sequence continues as follows: a power slice connection sequence indicator 2400PS for a power splice node locator 2406PS to a power slice node 352 in the sixth row of structural bay members 16; a sixth connection sequence indicator 2406S for a sixth node locator 2406 to a sixth power/data node 350 in the sixth row of structural bay members 16; a seventh connection sequence indicator 2407S for a seventh node locator 2407 to a seventh power/data node 350 in the seventh row of structural bay members 16; an eighth connection sequence indicator 2408S for a eighth node locator 2408 to an eighth power/data node 350 in an eighth row of structural bay members 16; a ninth connection sequence indicator 2409S for an ninth node locator 2409 to an ninth power/data node 350 in the ninth row of structural bay members 16; a tenth connection sequence indicator 2410S for a tenth node locator 2410 to a tenth power/data node 350 in a tenth row of structural bay members 16. This process is then repeated on a column by column basis from the first column 31, to a second column 32, to a third column 33, to a fourth column 34, to a fifth column 35, to a sixth column 36, to a seventh column 37, to an eighth column 38, to a ninth column 39, to a tenth and final column 40, until all of the structural frames 12 in the billboard array 30 have been mechanically connected to their power/data wire harnesses as best seen in FIG. 14. Although this installation sequence has been described as proceeding from the bottom of a column to the top of a column, it should be understood by those skilled in the art, that a reverse sequence could be equally utilized going from the top of a column to the bottom of a column.

It should be noted, that with reference to the installation step 4044, the structural frame 12 is provided with a plurality of wire routing features including a data connection wire routing feature 307, a left side data connection wiring feature 308, a power/data harness wire routing feature 309, a right side connection wire routing feature 310 and a central data connection wiring routing feature 311 as best seen in FIG. 4. Each of these wire routing features 307-311 will be described hereinafter in greater detail. For the moment however, it will suffice to mention that the position or location of the wire routing features 307-311 within the structural frame 12 is an important feature of the present invention. For example the wiring features 309 are arranged in a column in a spaced apart manner relative to the power data receptacles 350 and 352 respectively. In this regard, the power/data harness 2400H as it nodes 2400-2410 are snapped or pressed into their respective receptacles, the harness wires extended between pairs of nodes use the hook engaging under-over-under or the over-under-over technique with each routing feature 309 to firmly secure the power/data harness 2400H to the structural frame 12.

Accordingly, it should be understood by those skilled in the art, that these features are important as they enable an installation team member to quickly route all the preformed wire assemblies, such as the data jumper wire assembly 2400J, the data connection wire assembly 2400DC and the power/data wire harness 2400H through the various ones of the structural frames in the frame array 30 by an under/over/under or over/under/over hook engagement process so that these wire assemblies 2400DC, 2400H, and 2400J respectively, do not separate from their assembly structures. Most importantly however, they wire assemblies 2400DC, 2400H and 2400J become seated in fixed protected locations within the frame array 30 and properly secured so that they are non-interfering with the mounting of the display modules 14 and are sufficiently protected from being accidentally damaged during the display module installation process. Such efficiency and safety features are unique and novel in the use of the retrofit kit 10. As these unique structures of a nodes, wire guide securing structures and paired sets and plural sets of mounting or securing hooks 42-43 respectively are repeated in the construction of each structural frame 12, they will be described in greater detail hereinafter but only with a limited discussion.

Considering now in greater detail with reference to FIGS. 4 and 23, the paired sets of mounting hooks 42, the paired set includes an upper hook 42A and a lower hook 42B. The plural set of hooks 43 includes three L-shaped hooks 43A, 43B, and 43C respectively. Each hook member, such as the hook member 42A and 43A for example, is configured in generally an L-shape configuration to block slippage of a group of wires therefrom and thus, helping to facilitate the repeated fastening steps of under/over/under or over/under/over for securing the preformed wire assemblies 2400DC, 2400H, and 2400J respectively to the structural frame 12.

Continuing now with the installation process 1010, as best seen in FIG. 22, the installation team proceeds to a verify decision step 4045, where the installation team verifies that all node locators have been installed and are properly seated in their respective power/data nodes or receptacles 350 and 352 respectively and that the harness 2400H is properly secured to the structural frame 12 via the wiring routing features 309. This step 4045 includes routing the individual Molex connector plugs 2400HM associated with each power/data harness 2400H to their respective cable plug stations or daughter board cut out areas indicated generally at 330 in the structural frame 12 as best seen in FIGS. 5 and 28. When the connector 2400HM is so positioned it is allow to freely hanging in this area, where it will be available for connection to a display module, during the display module installation procedure (FIG. 19) that will be described hereinafter in greater detail. More particularly, by allowing the harness connector 2400HM to freely hang, the process facilitates their quick and easy connection to a display module 14 when a display module 14 is ready to be seated within an associated structural bay member 16. The installation team also route the free power wire ends of the harnesses, indicated generally at 2400HE, using the wire routing features 308, 310, and 311 located in the $6^{th}$ row of the structural frame array 30, to their closest power access holes 114H or 115H respectively. When the power wires 2400 HE are routed to their respective access holes 114H and 115H, the team continues routing them to the backside of the billboard 8 for connection to their respective junction boxes as will be described hereinafter in greater detail.

After making this verification at step 4045, the wire harness installation process 4010, then proceeds to an install inter-connecting data jumper cable step 4047. In this regard, the installation team interconnects the data harness wiring using a data jumper cable, such as a data jumper cable 2400J as best seen in FIG. 24A. More specifically, the installation team connects the data jumper cables 2400J in a specific data coupling sequence that establish inter-connected data transfer paths as best seen in FIGS. 14 and 17.

The data coupling sequence begins by a team member connecting a first data jumper cable 2400J between the structural frame bay members of a first column 31 (FIG. 14) in the structural frame array 30 with the structural frame bay members of a second column 32 in the structural frame array 30 as best seen in FIG. 30. More specifically, a first data jumper cable connector 2400J1 of jumper cable 2400J is connected to a first data jumper cable connector 2400DJC of the power data wiring harness 2400H in the first column 31. Then, a second data jumper connector 2400J2 of jumper cable 2400 J is connected to a first data jumper connector 2400DJC of the power data wiring harness 2400 H in the second column 32. It should be understood by those skilled in the art, that the interconnecting cable 2400JC has a sufficient length to extend from one column to another column of power data wiring harnesses 2400H, such as between the first column 31 and the second column 32.

Next, the installation team connects a second jumper cable 2400J between the structural frame bay members in a third column 33 in the structural frame array 30 with the structural frame bay members of a fourth column 34 in the structural frame array.

Next, the installation team connects a third jumper cable 2400J between the structural frame bay members in a fifth column 35 in the structural frame array 30 with the structural frame bay members of a sixth column 36 in the structural frame array.

Next, the installation team connects a fourth jumper cable 2400J between the structural frame bay members in a seventh column 37 in the structural frame array with the structural frame bay members of a eighth column 38 in the structural frame array 30.

Next, the installation team connects a fifth jumper cable 2400J between the structural frame bay members in a ninth column 39 in the structural frame array 30 with the structural frame bay members of a tenth column 40 in the structural frame array 30.

After all five (5) of the data jumper cables have been installed, the installation team then proceeds to an interconnection step 4048 (FIG. 22), where the team using data connection cables, such as the data connection cable 2400DC as best seen in FIG. 24B, initiates the process of installing the data connection cables, such as a data connection cable 2400DC as best seen in FIG. 24, to the structural frame 12. More particularly, these cables are routed in the bottom row 16B of the structural bay members. In this regard, the team interconnects the first column 31 of wire harness locations 1-11 to a first data connection connector 2400DCJ1. Then the team interconnects the second column 32 of wire harness locations 21 to 31 to a second data connection connector 2400DCJ1. The free end plug 2400DCT and the cable wiring 2400DCC is then routed along the bottom row of structural bay members using the wiring routing features 308, 310 and 311 to route the free end plug to the data access hole 116H. This process is repeated for the remaining third through tenth columns 33-40 respectively. All the power and data wiring harness free ends are routed through there respective power access holes 114H and 115H as well as the data access hole 116H allowing the free end to extend to the backside of the billboard 8.

Next, after the power data wire securing and routing has been completed, as best seen in FIG. 22, the installation team proceeds to an install junction box step 4050, where the team installs a pair of lockable junction boxes 46 and 47 respectively on the backside of the billboard 8 as best seen in FIG. 26.

After completing installation of the junction boxes 46-47, the installation team, at an attach step 4056 attaches one hanger bracket to each junction box with bolts and nuts, and then runs each wire harness through an associated cord grip on the backside of each junction box. The team then levels the hanger bracket and secures it to the billboard steel over the feed hole used for the wire harness. This step is repeated for both junction boxes.

Next, the installation team proceeds to an install power data controller enclosure step 4060, where the team installs a lockable power data controller enclosure or box 48 between the junction boxes 46-47, so that conduit paths 46C and 47C respectively may be run from the junction boxes 46 and 47 to the power enclosure box 48 as best seen in FIG. 26. The power data controller box 48 may be hoisted into place for mounting to the backside of the billboard 8, using a hand hoist or the like or in the alternative it may simply be lifted into place by the installation team and mounted.

Continuing, the team next at an attach step 4062, attaches one hanger bracket to on power/controller enclosure using a four bolt/nut arrangement. The team then levels the hanger bracket and secures it to the billboard as best seen in FIG. 26 with six Tek screws into the ribs of the billboard steel. Next the team secures the two bottom attachment points first than the two outer top points before removing the center attachment from the winch or hoist.

Proceeding, the installation team at an install light sensor arrangement step 4064, installs a light sensor box with an associated light sensor device arrangement 50 disposed at the top portion of the billboard 8 as best seen in FIG. 26.

Next at a measurement conduit runs step 4066, the installation team measures the distance between the junction boxes 46 and 47, the power/controller enclosure 48, the main circuit breaker box (not shown), the mounting position of the light sensor junction box and to the billboard panel where the data cable harness will be routed, while accounting for any bends necessary. The team then cuts conduit tubing for each run making certain to clean the edges of the cut conduit to remove any burrs or sharp edges or points. Holes are then knocked out in each of the enclosures in appropriate locations for a set of conduit runs 46C, 47C, 48C, 50C, 52C and 54C respectively as best seen in FIG. 26. It is anticipated that in certain installations flexible non metallic liquid tight conduit may be utilized.

Each piece of conduit is then installed between each section in an install conduit step 4068. In this regard, conduit must be secured with conduit clamps at regular intervals for the suggested layout. It should be noted that all conduit connections are water proof.

Once the conduit strings 46C, 47C, 50C, 52C and 54C respectively are attached and connected, the team at a pull and connect step 4070, pull all the wire harnesses through the conduit strings or runs between the billboard and the power/controller enclosure. Once the wires are pulled the installation team begins to connect the wire harness into the data board (not shown) in the power/data controller enclosure or box, indicated generally at 48 as best seen in FIG. 26.

The team then pulls all necessary power cables (not shown) through the conduit run between the power/data enclosure 48 and a universal power source 49. A one inch hole is then punched in order to mount the wireless antenna (not shown) to the power/controller box 48. The team then connects the wireless antenna (not shown) to the cellular router.

A single gang weatherproof conduit box forming part of the light sensor box arrangement 50 is then assembled to the top of the light sensor conduit 50C running to the light sensor location. The team then pulls all necessary wires from the power/controller enclosure 48 to the junction box 47 for the light sensor arrangement 50. The wires are cut to length and terminate to the appropriately labeled terminal block in the power/controller enclosure 48. Wire terminations to the light sensor arrangement 50 is shown in Table II:

TABLE II

| | |
|---|---|
| Red wire | Terminal A |
| Blue wire | Terminal B |
| White wire | Terminal C |
| Green wire | Ground |

A single gang weatherproof raised cover (not shown) is then attached to the single gang weatherproof conduit box forming part of the light sensor arrangement 50 using provided screws from the kit 10.

The team then pulls two 18 AWG, one 2 AWG and two 1 AWG cables through the conduit between the power/controller enclosure 48 and each of the junction boxes 46 and 47. Cable is cut to length after the pull and terminated to the appropriately labeled terminal blocks. Wire harnesses are also cut to length and terminate in each junction box to its appropriately labeled terminal block.

The team following written safety procedures makes certain that the main power is off at the main source. They then terminate power cables at this power source and at power supply. At a start up step 4072, main power is turned on and voltages are tested at all output points as matched in Table III:

TABLE III

| | |
|---|---|
| Output at wire harness | 27 V DC |
| Output at wire run to light sensor | 5 V DC |

Finally, main power is turned off and lock out tag out is effected, which completes the wire harness installation process at an end step 4080 (FIG. 22), which returns the installation process 1010 back to a determination step 1024 (FIG. 19) where the installation team verifies that all the power/data harnesses 2400H, all the data jumper cables 2400J and all the data connector cables 2400DC are installed and properly connected. If any correction is needed the team returns to the install step 1022 and proceeds as described previously; otherwise the team goes to a install display modules step 1026.

Figure 15:
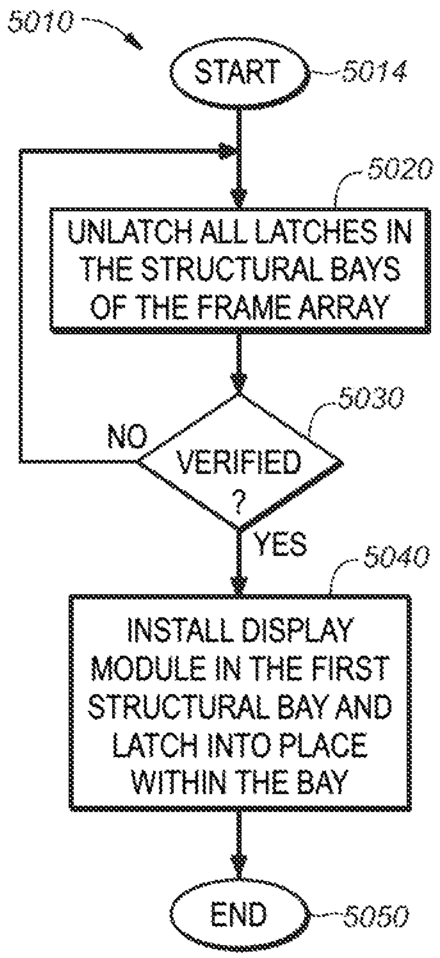
FIG. 15 is a flowchart illustrating the steps followed in installing the display modules forming part of the field retrofit kit of FIG. 2.

After verification that all the wire harnesses and power data wiring of the system have been installed, the installation process 1010 advances to the install display modules step 1026 (FIG. 19). Step 1026 starts the LED tile or display module installation process indicated generally at 5010 as best seen in FIG. 15.

The install display module process 5010 (FIG. 15) begins at a start step 5014. From the start step 5014, the installation team proceeds to an unlatch step 5020 where the team unlatches all of the structural bay latch assemblies, such as a latch assembly 412 (FIG. 30). It is contemplated that all latches may be unlatched at the factory where the structural frames are assembled, so this step may be omitted.

Figure 34:
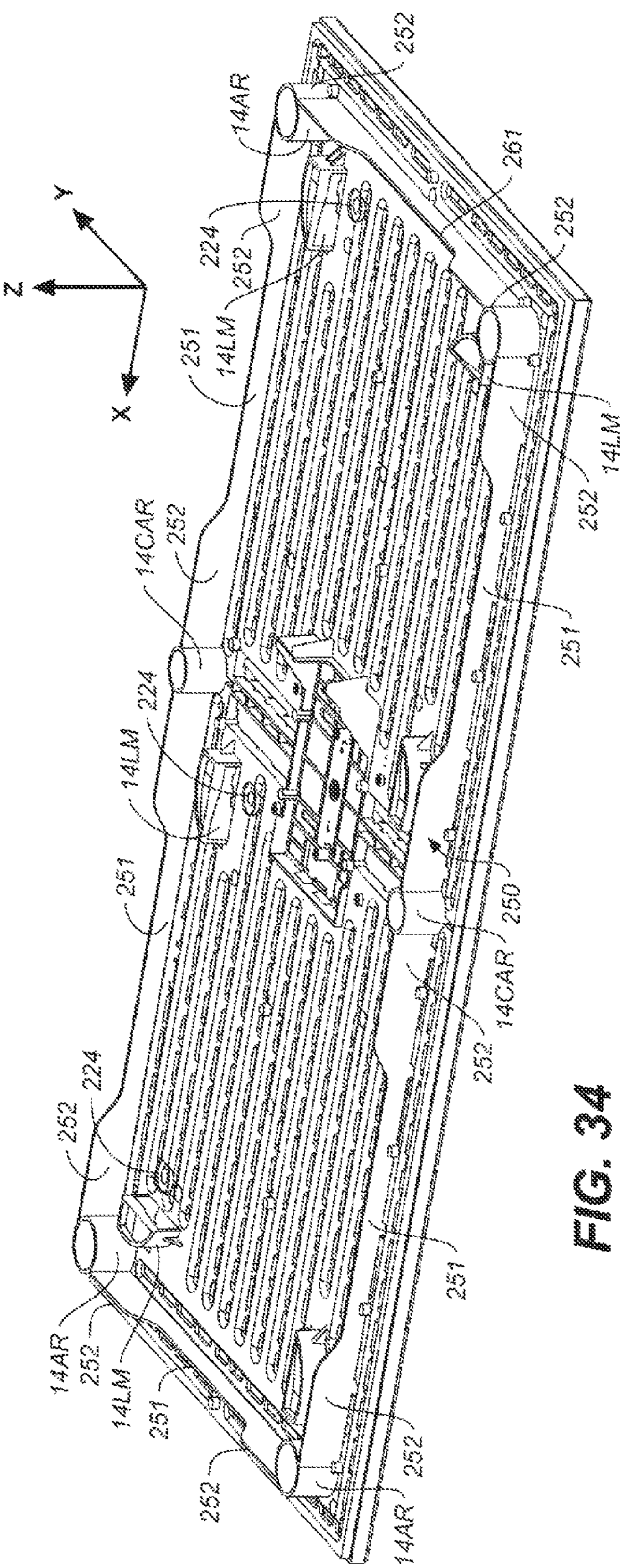
FIG. 34 is a perspective view of the LED frame of FIG. 32, illustrating a seating wall adapted to be seated in a structural frame bay member.

When all the latches have been unlatched, a verification process is initiated at a verify step 5030. Once all latches have been verified to be unlatched, the process 5010 proceeds to an install display module sequence step 5040. In this regard, a member of installation team proceeds to install a first display module in the first structural bay. This process is repeated. That is, the team starts with location 1 and continues through location 100. Modules are not numbered and can be installed in any location and in any order. Therefore there is no intention of limiting the installation process to the sequence as described herein. Installation of a display module 14 is simplified by using a suitable lanyard (not shown) attached to the LED tile 14. The lanyard is optionally used to secure the tile 14 while making connections with the data power connector 2400HM available at that bay location 330. Using the lanyard to hold an LED tile 14 in place, the installer plugs the wire harness power data connector 2400HM into the daughter board module data power connector 27. Then lanyard is then disconnected as the display module 14 is now supported by the power/data harness 2400H. Then, the installer aligns the receptacle-like alignment features 14AR and 14CAR respectively on the backside of the display module 14 so they can receive the post-like alignment features 60AR and 60ARC extending out in the z-axis within the structural bay member 16. When aligned, the installer simply slides the posts 60AR and 60ARC (FIGS. 4-5) into the receptacles 14AR and 14CAR (FIG. 34), as the tile 14 is pushed into place in a tight-fit within the structural frame array 30.

As best seen in FIGS. 4-5, 23 and 34, each display module 14 is provided with an LED seating wall 350 which extends about the outer peripheral boundary on the backside of the LED frame 201. The wall 350 includes low wall portions, such as a low wall portion 251 as well as high wall portions, such as a high wall portion 252. The low wall portions 251 and the high wall portions 252 are dimensioned to be received in a tight fit in a set of Z-axis slots 712 (as best seen in FIG. 23), which slots 712 are disposed in each structural bay member 16. The height of the seating wall 250 function to define a stop, which prevents the display module 14 from being further seated rearwardly within a structural bay member 16. In short when the distal end of the seating wall 250 makes contact with the base of the receiving slots 712 (FIGS. 4-5, and 23) it provides a physical indication to the installer that the display module 14 in process of being installed has been properly seated. The installer then only needs to proceed by latching removably the display module within its associated structural bay member 16. In this regard, using a one T-handled 5⁄32" Hex wretch, each latch within the associated structural bay member 16 is then turned one quarter anti-clockwise turn to secure the display module 14 within the structural frame array 30. This process is repeated until all the display modules 14 have been installed in the array 30. The module installation process 5010 ends at an end step 5050. From the end step 5050, the installation process 1010 returns to the verification step 1028 as best seen in FIG. 19 to verify that all display modules have latched into place. Once verification has been accomplished the team is ready to start up the billboard 110.

The Start Up Procedure

The team is now ready to engage the start up process at a start up step 1030, where the team performs the following tasks: (1) they remove and clear all debris from power cabinet and Junction boxes; (2) the check for exposed wires; (3) they make certain that all connections are secure; (4) they turn on switches to AC supply, power enclosure and junction boxes in that order; (5) they refer to product user manual for full commissioning procedure; (6) they check for initial color balance; (7) they contact the media center to upload content to be tested; and finally (8) they verify for proper alignment of images. This process is completed at a verification step 1032.

Repair and Preventive Maintenance Considerations

In completing the conversion and installation process, the team performs a quick preventive maintenance process if needed. In this regard, the process advances to a preventive maintenance check step 1034. If no preventive maintenance is needed the teams verifies that preventive maintenance has been completed at a verify step 1038. If at check step 1034 a determination is made that preventive maintenance needs to be performed the process advances to a clean display module panel step 1036 so the face of each display modules 16 is cleaned and so logged. The face of the sign needs to be cleaned every six months. A log is established to make certain the team returns perform this cleaning process. Over time the LEDs will degrade and change color. When this occurs it will cause a visible checker board effect when replacing modules. In this regard, when replacing modules the installation/repair team needs to replace modules in the middle of the sign trying to swap modules from the bottom of the display first. In this regard, replacing modules at the bottom of the module array with newer modules is done so the brighter modules will be less noticeable. The installation team, using a web interface can color balance the display modules 8 in order to match colors with the older modules. When the preventive maintenance has been completed, the team proceeds to verify that all needed preventative maintenance step have been performed at the verification step 1038.

Next at a determination step 1040, the team determines whether the billboard 110 needs any repairs, If repairs are needed the teams makes the repairs at a repair step 1042, and verifies at a repair completed step 1044 that all repairs have been made. If repairs are still needed the team returns to step 1042 and continues as previously described. If all repairs have been completed and verified, the team has completed the installation of billboard 110 using the retrofit kit 10 and the process ends at an end step 1046 as best seen in FIG. 26.

CONCLUSION

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

All patents, publications, scientific articles, web sites, and other documents and materials referenced or mentioned herein are indicative of the levels of skill of those skilled in the art to which the invention pertains, and each such referenced document and material is hereby incorporated by reference to the same extent as if it had been incorporated by reference in its entirety individually or set forth herein in its entirety. Applicants reserve the right to physically incorporate into this specification any and all materials and information from any such patents, publications, scientific articles, web sites, electronically available information, and other referenced materials or documents to the extent such incorporated materials and information are not inconsistent with the description herein.

The written description portion of this patent includes all claims. Furthermore, all claims, including all original claims as well as all claims from any and all priority documents, are hereby incorporated by reference in their entirety into the written description portion of the specification, and Applicant(s) reserve the right to physically incorporate into the written description or any other portion of the application, any and all such claims. Thus, for example, under no circumstances may the patent be interpreted as allegedly not providing a written description for a claim on the assertion that the precise wording of the claim is not set forth in haec verba in written description portion of the patent.

The claims will be interpreted according to law. However, and notwithstanding the alleged or perceived ease or difficulty of interpreting any claim or portion thereof, under no circumstances may any adjustment or amendment of a claim or any portion thereof during prosecution of the application or applications leading to this patent be interpreted as having forfeited any right to any and all equivalents thereof that do not form a part of the prior art.

All of the features disclosed in this specification may be combined in any combination. Thus, unless expressly stated otherwise, each feature disclosed is only an example of a generic series of equivalent or similar features.

It is to be understood that while the invention has been described in conjunction with the detailed description thereof, the foregoing description is intended to illustrate and not limit the scope of the invention, which is defined by the scope of the appended claims. Thus, from the foregoing, it will be appreciated that, although specific embodiments of the invention have been described herein for the purpose of illustration, various modifications may be made without deviating from the spirit and scope of the invention. Other aspects, advantages, and modifications are within the scope of the following claims and the present invention is not limited except as by the appended claims.

The specific methods and compositions described herein are representative of preferred embodiments and are exemplary and not intended as limitations on the scope of the invention. Other objects, aspects, and embodiments will occur to those skilled in the art upon consideration of this specification, and are encompassed within the spirit of the invention as defined by the scope of the claims. It will be readily apparent to one skilled in the art that varying substitutions and modifications may be made to the invention disclosed herein without departing from the scope and spirit of the invention. The invention illustratively described herein suitably may be practiced in the absence of any element or elements, or limitation or limitations, which is not specifically disclosed herein as essential. Thus, for example, in each instance herein, in embodiments or examples of the present invention, the terms "comprising", "including", "containing", etc. are to be read expansively and without limitation. The methods and processes illustratively described herein suitably may be practiced in differing orders of steps, and that they are not necessarily restricted to the orders of steps indicated herein or in the claims.

The terms and expressions that have been employed are used as terms of description and not of limitation, and there is no intent in the use of such terms and expressions to exclude any equivalent of the features shown and described or portions thereof, but it is recognized that various modifications are possible within the scope of the invention as claimed. Thus, it will be understood that although the present invention has been specifically disclosed by various embodiments and/or preferred embodiments and optional features, any and all modifications and variations of the concepts herein disclosed that may be resorted to by those skilled in the art are considered to be within the scope of this invention as defined by the appended claims.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

It is also to be understood that as used herein and in the appended claims, the singular forms "a," "an," and "the" include plural reference unless the context clearly dictates otherwise, the term "X and/or Y" means "X" or "Y" or both "X" and "Y", and the letter "s" following a noun designates both the plural and singular forms of that noun. In addition, where features or aspects of the invention are described in terms of Markush groups, it is intended and those skilled in the art will recognize, that the invention embraces and is also thereby described in terms of any individual member or subgroup of members of the Markush group.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

Other modifications and implementations will occur to those skilled in the art without departing from the spirit and the scope of the invention as claimed. Accordingly, the description hereinabove is not intended to limit the invention, except as indicated in the following claims.

For example, although the dynamic display of the present invention as described herein is installed on poster panels of an existing billboard, it is contemplated that a cabinet type electronic display system could also be modified by stripping the cabinet of its display modules and electrical system leaving an open faced cabinet frame. A structural planar back panel could then be mounted to the open face area of the open faced cabinet frame. This structural planar back panel would then serve and function as the planar mounting surface for the retrofit kit 10 in the same manner as a field billboard. The cabinet structure originally installed would remain in place but would be modified as described herein.

As another example, a building face surface of a multi-store or single story building could be modified by the installation of a structural planar back panel of any suitable structural material (sheet metal, wood, structural foam, plastic, etc.) with surface to surface standoffs to provide sufficient spacing for installation of the power system described herein. In this regard, the power and data junction boxes would be installed on the backside of the planar back panel so as to be disposed spaced from the exterior surface of the building. In an alternative configuration, the planar back panel could be installed flat against the exterior surface of the building and power access for front mounted display modules could be provided from junction boxes installed inside the building and routed to a structural planar back panel mounted on the exterior surface of the building. This structural planar back panel would then serve and function as the planar mounting surface for the retrofit kit 10 in the same manner as the poster panels of an in-field billboard.

Therefore, provided herein is a new and improved in field retrofit kit for converting a static non electronic billboard into a dynamic electronic billboard and methods of retrofitting a static billboard in the field in a fast and convenient manner without the need of special equipment. The following specific features are deemed important and unique:

Harnesses:

By utilizing the frame as a raceway (as opposed to running cables through a conduit), there are less design limitations. For example: (1) connectors, or multiples of connectors would be difficult to pull through conduits, which would more likely than not result in multiple conduits to avoid this problem; (2) alternately, such harnesses may have to be replaced with cabling that is pulled through conduits, with the connectors then added in the field. Quality control and build time issues would then become a problem, which is not an issue with the present invention; and (3) utilizing conduit and cables as opposed to the disclosed structural frames and preformed harness design would result in more sign real estate required for conduit, especially at bends where there is a minimum radius requirement; more material costs, and greater labor costs for installing conduits, cable routing and connector installation. Again, the structural frame and harness design of the present invention eliminates all of these issues.

Safety of Installation:

HVAC power is rectified to substantially less than 30 VDC from the backside of the billboard 110 to the frontside of the billboard 110. In this regard, safety and practicality for workers to install and service the billboard 110 is of paramount importance. Higher direct current voltages or line voltages represent pending safety hazards and may affect the required skill level of the person or persons installing the billboard 110. Use of the substantially less than 30 VDC power eliminates the need for such skill labor during the installation and maintenance of the billboard 110.

Compound Frames with Specific Arrays:

The new and improved billboard 110 is optimized for panel form factor and assembly efficiency. In this regard, the 4 foot by 5 foot form factor selected for the structural frames 12 is optimized for the size of existing static panels which will be utilized in the retrofit process. Moreover, with the use of compound frames, such as the compound structural frames 12, the number of frames required to be mated with an existing panel board is greatly reduced.

Structural Foam Use:

Ease of mating a structural frame 12 with an existing static billboard 8, is achieved with the large, light-weight structural frames, such as the structural frame 12. This is a key factor in the design criteria of the present invention; namely substantial weight reduction coupled with simple and effective molding constraints. In short, the utilization of large 4×5 foot frames is the optimal way of fabrication. That is, injection molding would make molding costs prohibitive and would make the overall weight of the individual panels too excessive for a worker to lift and place in position without using special equipment during installation. The structural foam construction of the individual frames 12 imparts to the individual frame unusual strength and durability effectively weatherizing the frames against strong buffeting winds for example. The structural foam in fact is so strong that it may be used in other applications as a structural building material or a form of heavy-duty furniture.

Bee Stops and Vent Chimney Screens:

To help prevent local insects and ground animals, such as bees, wasps, flies, rodents, squirrels and the like from finding shelter between the panel boards of the billboard 8 and the structural frames 12 of a converted billboard 110, each retrofit kit 10 includes a plurality of bee stops, such as a bee stop 98 that is utilized to close off the electrical pass troughs on the end of the array structural of a structural frame 12. Pass through notches uniquely enable the vertical routing of data connections, which at the same time, in combination with the bee stops prevent the invasion of such flying insects into the cooling vents 91 and electrical conduit passageways.

Easy of Operating Latches:

The structural frames and bay members are configured with mutual mechanical datum structures coupled with central power and data connectors that provide for effective and easy installation and release of the individual LED display modules 14 relative to an associated bay member 16. That is, the module latches 412, which help secure each display modules within its associate bay member 16, is made ready to be acted upon through strategically placed latch access openings 17H disposed in each display module 14.

In combination then, the retrofit kit 10 enables a static billboard 8 to be easily and quickly converted into a dynamic billboard 110 by assembling an array of structural bays 16 upon an existing standing panel of the static billboard 8. Each bay member 16 in this arrangement, includes a power and data connector for coupling power and data to an individual display module 14, a strategically placed alignment features, and a uniquely operable latching feature, which operate or cooperate with a complementary set of display module 14 features including a module data and power connector, a module alignment feature, and a module latching feature for enabling a display module 14 to be mechanically and electrically coupled to a bay member 14 for dynamically displaying sign information. Advantageously, each display module 14 is also provided with a weatherized sealing design which protects the electronics and completely eliminates the need for a rigorous weather seal which would otherwise be needed between the module 14 and the bay member 16. In this regard, the otherwise needed rigorous weather seal is eliminated by a unique and novel perforated channel member which is filled with a potting compound in order to weatherize and seal the display module 14. Moreover, the weatherized modules protect the cabling from the degradation effects of ultra-violet sunlight.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

Other modifications and implementations will occur to those skilled in the art without departing from the spirit and the scope of the invention as claimed. Accordingly, the description hereinabove is not intended to limit the invention, except as indicated in the following claims.

The following is a parts list for each of the component parts identified in the detailed specification and drawings:

8 a static non electronic billboard
9 a poster panel 9 of the static billboard 8
10 a self contained in-field modification or retrofit kit 10
10A a plurality of structural frames 10A
10B a plurality of fully weatherized display modules 10B
10C a power modification kit 10C
10D a plurality of preformed wire harness assemblies 10D
12 a structural frame 12
14 a sealed display module 14
14AR an alignment receptacle of the display module 14
14CAR a center alignment receptacle of the display module 14
14L a left side display panel of module 14
14R a right side display panel of module 14
16 a structural bay member 16
16B a bottom row of structural bay members 16B
16M a middle row of structural bay members
17L a left side louver 17L
17R a right side louver 17R
17H a latch access hole 17H
17V a louver visor 17V
18 a pixel arrangement 18 (256 pixels)
20 a daughter board
21 a daughter board printed circuit board 21
22 a daughter board dam 22
22E an edge feature of the daughter board dam 22
23 a daughter board thermal gap pad or brick 23

24 a daughter board heat sink 24
24F daughter board heat sink cooling fins 24F
26 a daughter board can (electronics) 26
27 a power data connector 27 (A Molex connector)
28LSPH a left side pin header 28LSPH
28RSPH a right side pin header 28RSPH
29E a greatly simplified diagram of the display panel electronics 29E
29L a channel of 16 light emitting diode drivers
30 a structural frame array 30
31 a first column in a structural frame array
32 a second column in a structural frame array
33 a third column in a structural frame array
34 a fourth column in a structural frame array
35 a fifth column in a structural frame array
36 a sixth column in a structural frame array
37 a seventh column in a structural frame array
38 an eight column in a structural frame array
39 a ninth column in a structural frame array
40 a tenth column in a structural frame array
42 a set of paired wire guide securing structures
42A a perpendicularly extending hook
42B a perpendicularly extending hook
43 a set of plural wire guide securing structures
43A a perpendicularly extending hook
43B a perpendicularly extending hook
43C a perpendicular extending hook
46 a lockable junction box for a first power path
46C a conduit for power harness wires to junction box 46 to power enclosure 48
47 a lockable junction box for a second power path
47C a conduit for power harness wires to junction box 47 to power enclosure 48
48 a lockable power/data controller enclosure 48
48C a power conduit to the universal power source
50 an ambient light sensor arrangement 50
50C a conduit for ambient light sensor 50 to power enclosure 48
52C a conduit for universal power source
54C a conduit for data harness wires
60AR a structural bay alignment column structure or feature
60ARC a center structural bay alignment column structure of feature
61 an intermediate frame bolt location feature
62 a center frame bolt location feature
63 an outside frame edge bolt location feature
64 a pilot hole feature
66 a horizontal visualization or cutting line guide feature
68 a vertical visualization or cutting line guide feature
69 a lanyard receiving hole
70 a left board dc power path 70
72 a right board dc power path 72
80 a left board data path 80
82 a right board data path 82
84 a side frame to side frame dovetail joint 84
86 a bottom frame to top frame dovetail joint 86
88 a chimney vent cover slot 88
90 a chimney vent cover 90
91 an air channel column, conduit or self cooling air vent 91
92 a self drilling screw 92
93 a mounting hole 93 for a self drilling screw 92
94 a set of alignment tabs 94
96 a set of alignment slots 96
97 a bee stop slot 97
98 a set of bee stops or plugs 98
110 a dynamic electronic billboard 110
112B a mounting bolt
112H a mounting bolt hole 112 to secure frame 12 to poster panel
112W a mounting bolt washer 114 for use with bolt 112B
112N a mounting bolt nut 112N for use with bolt 112B
114H a power access hole 114H, a two inch hole in frame 12
115H a power access hole 115H, a two inch hole in frame 12
116H a data access hole 116H, a two inch hole in frame 12
118 a rubber grommet 118
120 a power/data distribution system
201 a perforated channel LED frame 201 forming part of display module 14
201F a front side of the LED frame 201
201B a back side of the LED frame 201
201FL a front left side of the LED frame 201
201 FR a front right side of the LED frame 201
201BR a back right side of the LED frame 201
201BL a back left side of the LED frame 201
204 an alignment feature of the LED frame 201
206 a daughter board alignment feature forming part of frame 201
207 a daughter board alignment hole 207
208 a daughter board alignment hole 208
211 a left side 26 pin header slot or opening 211
212 a right side 26 pin header slot or opening 212
213 a plurality 213 of power data connector alignment pins
214 a dam receiving space or area 214
215 front side of display module 14
216 backside of display module 14
217 a center alignment feature of display module 14
218 a latch receiver of the display module 14
220 a latch access opening or cutaway area of the display module 14
224 a tool access opening or cutaway area of the display module 14
225R a red light generating LED 225R
225G a green light generating LED 225G
225B a blue light generating LED 225B
230 a plastic dam feature 230 on the backside of the LED frame 201
232 an elongate perforated potting channel
233 a centrally disposed LED frame dam 233
234 a plurality of perforations
250 an LED frame seating wall 250
251 a low wall portion of the LED frame wall
252 a high wall portion of the LED frame wall
304 an expanded bottom left side weight reduction cutout area
306 an expanded bottom right side weight reduction cutout area
307 a data connection wire routing feature 307
308 a left side data connection wire routing feature 308
309 a power/data harness wire routing feature 309
310 a right side data connection wire routing feature 310
311 a central wire routing feature 311
312 a top left weight reduction cutout area 312
313 a bottom left weight reduction cutout area 313
315 a top right weight reduction cutout area 315
316 a bottom right weigh reduction cutout area 316
317 a top middle right weight reduction cutout area 317
318 a bottom middle right weight reduction cutout area 318
319 a lateral rear inside wall area 319
320 a latch assembly mounting hole
321 a latch assembly mounting hole
322 an upper left side +Y latch receiving boss area
323 a upper center +Y latch receiving boss area
324 a lower left side −X latch receiving boss area
325 a lower center −Y latch receiving boss area

326 a lower right −Y latch receiving boss area
327 an upper right side +X latch receiving boss area
330 a centrally disposed daughter board receiving area
331 a first power/data node or over mold structure
332 a second power/data node or over mold structure
333 a third power/data node or over mold structure
334 a fourth power/data node or over mold structure
335 a fifth node power/data node or over mold structure
336 a sixth node power/data node or over mold structure
337 a seventh power/data node or over mold structure
338 a eighth node power/data node or over mold structure
339 a ninth power/data node or over mold structure
340 a tenth power/data node or over mold structure
350 an upper wire harness node receptacle feature
352 a lower wire harness node receptacle feature
412 a frame latch assembly
413 a frame latch screw member
414 a frame latch housing
416 a frame latch latching member
418 a frame latch tool receiving hole
419 a frame latch assembly mounting screw or rivet
420 a display module latch receiving receptacle (delete for 14LM)
508 a chalk outline grid
512T a top horizontal chalk line
512B a bottom horizontal chalk line
513 a left side chalk line to mark a starting corner
514 a horizontal center chalk line
516 a vertical center point chalk line
520 a bottom left corner of the grid
522 a corner to corner diagonal chalk line
524 a corner to corner diagonal chalk line
610 a left side printed circuit board 610 forming part of PCA 14L
612 a right side printed circuit board 612 forming part of PCA 14R
620 a LED mounting hole
621 a LED mounting hole
630 a printed circuit board mounting hole
632 a louver mounting hole
634 a latch access hole
635 a set of header pin mounting holes
637 indicia marking identify printed circuit association
712 structural bay display module wall receiving slot 712
1010 a method of retrofitting or assembling a billboard 1010
1014 a prepare site for installation step
1016 a decision step, is site prepared
1018 an install step, install structural frames and chimney vent covers
1020 a decision step, are all structural frames installed
1022 an install step, install wire harnesses on structural frames
1024 a decision step, are all harnesses installed
1026 an install step, install display modules
1028 a decision step, are all display modules installed
1030 a verify step, start up and verify system operation
1032 a decision step, is system operational
1034 a decision step, is preventive maintenance needed
1036 a cleaning step, clean all display modules
1038 a decision step, is preventive maintenance completed
1040 a decision step, is repair needed
1042 a repair step, repair as needed
1044 a decision step, is repair completed
1046 an end step, installation complete
2010 a site inspection process 2010
2014 a start step 2014 start inspection process 2010
2026 an inspect poster panel step 2026
2038 a determination step 2038, inspection completed
2040 a power inspection step 2040
2042 a determination step 2042, power verified
2044 an install step 2044, install a power converter
2050 a take physical inventory step for billboard power
2084 a go to step 2084, go to step 1016
2400H a power/data wiring harness 2400H
2400HE wire end of a power/data wiring harness 2400H
2400HM Molex connector of a power/data wiring harness 2400H
2400DJC a data connector of the power/data wiring harness 2400H
2400J a data jumper cable assembly 2400J
2400JC a data jumper cable
2400J1 a data connector of data jumper cable 2400J
2400J2 a data connector of data jumper cable 2400J
2401 a first node or over mold locator
2401S a first connection sequence indicator 2401S
2402 a second node or over mold locator
2402S a second connection sequence indicator 2402S
2403 a third node or over mold locator
2403S a third connection sequence indicator 2403S
2404 a fourth node or over mold locator
2404S a fourth connection sequence indicator 2404S
2405 a fifth node or over mold locator
2405S a fifth connection sequence indicator 2405S
2406 a sixth node or over mold locator
2400PS a power splice connection sequence indicator 2400PS
2406PS a power splice node or over mold locator
2407 a seventh node or over mold locator
2407S a seventh connection sequence indicator 2407S
2408 a eighth node or over mold locator
2408S an eighth connection sequence indicator 2408S
2409 a ninth node or over mold locator
2409S a ninth connection sequence indicator 2409S
2410 a tenth node or over mold locator
2410S a tenth connection sequence indicator 2410S
3010 a structural frame installation process 3010
3014 a start step 3014, start structural frame installation process
3018 a grid layout step 3018
3024 an verify grid layout step 3024
3034 an orient structural frames step 3034
3040 a parts verification step 3040
3054 an install chimney vent covers step 3054
3066 an align and install structural frames step 3066
3068 a verification step, all frames are properly secured
3069 an install bee stop plugs step
3070 a go to step 3070, continue installation process
4010 an install wire harness process
4014 a start step for the install wire harness installation process 4010
4018 a drill power access holes step 4018
4020 a drill data access hole step 4020
4022 a drill centered holes step
4032 an install rubber grommets step
4044 an install wire harnesses step
4047 an install data jumper cable step
4048 an install data connection cable step
4050 an install junction boxes step
4056 an attach hanger bracket step
4060 an install power data controller step
4062 an attach step
4064 an install light sensor arrangement step
4066 a measure conduit run step
4068 an install conduit run step 4070 a pull and connect wire step
4072 a start up main power step
4080 an end wire harness installation process step
5010 an install LED tile or display module process
5014 a start process step
5020 an unlatch step, unlatch all latches in the structural bays
5030 a verify all latches are unlatched
5040 an install first display module step
5050 an end step, ending the install display module process
6010 a display module manufacturing process
6012 a start assembly process
6021 a fabricate printed circuit board assembly step
6032 an assembly step 6032, assemble PCA units to frame
6036 an assembly step 6036, assemble daughter board to frame
6040 a form thermal interface step 6040
6048 an attach heat sink step 6048
6050 a test partially assembled display module step 6050
6060 a solder step, solder header pins step 6060
6070 a dispense and cure step, dispense adhesive potting compound
6080 an attach louvers step 6080
6082 an end or stop manufacturing display module step 6082

We claim:

1. A modification kit for converting an anchored planar mounting structure having a frontside and an opposing backside into a dynamic electronic sign, the modification kit comprising:

a plurality of weatherized display modules;

a plurality of structural frames for supporting said plurality of weatherized display modules, each structural frame having a back portion for mounting to the frontside of the anchored planar mounting structure and a front portion defining a plurality of bay members for receiving corresponding ones of said plurality of weatherized display modules;

at least one wiring harness including a first end for coupling to a power source mounted on the backside of the anchored planar mounting structure and a plurality of power extensions for coupling the power source to said plurality of weatherized display modules.

2. The modification kit of claim 1 wherein each individual one of said plurality of bay members define a receiving feature for receiving and aligning a portion of the at least one wiring harness within the bay member to facilitate assembly of the at least one wiring harness to the bay member.

3. The modification kit of claim 2 wherein the receiving feature is a receptacle, the at least one wiring harness including a portion to be received into each receptacle.

4. The modification kit of claim 3 wherein the portion to be received into the receptacle is an overmolded node which is configured to be received into the receptacle and retained therein to help facilitate the routing of at least one of said plurality of power extensions to an individual one of said plurality of weatherized display modules.

5. The modification kit of claim 1 wherein each individual one of said plurality of structural frames includes pilot features for facilitating the forming of at least one bore through the anchored planar mounting structure to enable routing of the at least one wiring harness through the anchored planar mounting structure for facilitating the coupling of the power source to said plurality of weatherized display modules.

6. The modification kit according to claim 1, wherein each individual one of said plurality of structural frames is interchangeable with any other individual one of said plurality of structural frames; and wherein each individual one of said plurality of interchangeable structural frames is provided with a plurality of wind load resisting features to facilitate accommodating installation of said plurality of interchangeable structural frames in any wind zone specified for the anchored planar mounting structure.

7. The modification kit according to claim 1, wherein said plurality of bay members is arranged in an array defined by a plurality of visual separation features to facilitate separating the array of bay members into smaller array configurations for customizing a display sign area to comply with the size of the anchored planar mounting structure.

8. The modification kit according to claim 1, further comprising:

a utility box mountable to the opposing backside of the planar mounting structure for facilitating the coupling of the power source to said at least one wiring harness and for receiving electrical energy to be rectified into a low voltage power source for use by said plurality of weatherized display modules to convert display data into visible radiant energy for instantaneous dynamic display purposes.

9. The modification kit according to claim 6, wherein each individual one of said plurality of interchangeable structural frames, when mounted to the frontside of the anchored planar mounting structure, defines a set of cooling conduits; and wherein said set of cooling conduits are in fluid communication with individual ones of said plurality of weatherized display modules when mounted in individual ones of said plurality of interchangeable structural frames.

10. The modification kit according to claim 6, wherein each individual one of said plurality of interchangeable structural frames is provided with rows and columns of aligned wire routing features and node receptacles to help facilitate the routing and securing of said at least one wiring harness within the interchangeable structural frame to enable power to be distributed throughout the interchangeable structural frame in a daisy-chain manner.

11. The modification kit according to claim 10, wherein the node receptacles are arranged in alignment to eliminate the need for special node to receptacle alignment markings to facilitate installation of said at least one wiring harness without installation placement errors.

12. The modification kit according to claim 1, wherein each individual bay member has integrally formed therein a plurality of different types and kinds of wire harness receptacles distributed among a plurality of latching features; and wherein said plurality of latching features are multi-directional and complementary to corresponding display module multi-directional latching features to help facilitate the mounting of individual ones of said plurality of weatherized display modules within individual ones of said plurality of bay members with a sufficient latching force to resist wind load forces in excess of 100 pounds per square foot.

13. The modification kit according to claim 1, wherein each individual one of said plurality of structural frames has a plurality of cutout areas in sufficient number to minimize the frame weight of an individual one of said plurality of structural frames to no greater than 50 pounds, but not such a sufficient number of cutout areas to compromise the structural integrity of the individual structural frame for resisting wind load forces in excess of 100 pounds per square foot when the individual structural frame is mounted to a frontside surface of the anchored planar mounting structure.

14. A modification kit for sign conversion, comprising:

a plurality of display modules for converting electrical data into visible radiant energy for display by an electronic sign;

at least one compound structural frame for defining a plurality of structural bay members, each individual one of said plurality of structural bay members being configured for removably receiving, supporting and latching therein corresponding ones of said plurality of display modules each being mounted with a sufficient latching force to withstand a wind load force in excess of 100 pounds per square foot;

wherein each individual one of said plurality of structural bay members has a sufficient number of cutout areas to provide a frame weight of no greater than 50 pounds for hand lifting and mounting the compound structural frame to a planar structural surface by a single person, but not such a sufficient number of cutout areas to compromise the structural integrity of the compound structural frame for resisting wind load forces of up to 100 pounds per square foot when mounted to the planar structural surface while supporting said plurality of display modules; and at least one preformed interchangeable wiring harness having a plurality of mechanical-electrical nodes for coupling a source of low voltage power from a backside to a frontside of the planar structural surface and then to said plurality of display modules.

15. The modification kit according to claim 14, wherein each individual one of said plurality of structural bay members is provided with a plurality of node receptacles for securing therein said plurality of mechanical-electrical nodes to facilitate coupling the source of lower voltage power at said frontside of the planar structural surface to said plurality of display modules.

16. The modification kit according to claim 14, wherein said plurality of structural bay members are arranged in an array defined by a plurality of visual separation features to facilitate separating the array of structural bay members into smaller array configurations for customizing a display sign area to comply with the size of the planar structural surface.

17. The modification kit according to claim 14, wherein said at least one compound structural frame is provided with rows and columns of wire routing features and node receptacles to accommodate said at least one preformed interchangeable wiring harness and to facilitate distribution of power and data throughout said at least one compound structural frame in a daisy-chain manner.

18. The modification kit according to claim 14, wherein said at least one compound structural frame is provided with a plurality of interconnecting reference features, said plurality of interconnecting reference features including:

a first set of tabs disposed on the compound structural frame;

a first set of slots disposed on the compound structural frame;

said first set of tabs and said first set of slots in combination defining a plurality of top to bottom dovetail joints to facilitate interconnecting pairs of compound structural frames in flush top surface to flush bottom surface alignment along a longitudinal axis of the planar structural surface;

a second set of tabs disposed on the compound structural frame;

a second set of slots disposed on the compound structural frame;

said second set of tabs and said second set of slots defining a plurality of side to side dovetail joints to facilitate interconnecting pairs of compound structural frames in flush right side surface to flush left side surface alignment along a lateral axis of the planar structural surface; and wherein pairs of compound structural frames are interconnectable in an array to support therein said plurality of display modules for providing a billboard display sign.

19. The modification kit according to claim 14, wherein said at least one compound structural frame is provided with plural vertical axis mounting holes and plural lateral axis mounting holes, said plural vertical axis mounting holes and said plural lateral axis mounting holes being distributed in plural mounting hole locations throughout said at least one compound structural frame and each being dimensioned for receiving therein a mounting screw to facilitate securing said at least one compound structural frame to the planar structural surface so that a sufficient mounting force may be applied to said compound structural frame to substantially eliminate face to face separation of said compound structural frame and the planar structural surface in wind load forces in excess of 100 pounds per square foot.

20. A self contained in-field retrofit kit for a static billboard coupled to a universal source of electrical power, comprising:

at least one modular hand mountable compound structural frame for mounting to at least one poster panel of a static billboard, said at least one modular compound structural frame and said at least one poster panel cooperating to provide a plurality of self cooling vents and a plurality of wire routing paths between said at least one modular compound structural frame and the universal source of electrical power;

wherein said at least one modular compound structural frame is provided with a plurality of receptacle nodes and wire routing guides to receive substantially identical power and data wire harnesses for coupling electrical energy along a plurality of wire routing paths within said modular compound structural frame;

at least one modular electrical conversion device for mounting partially within an individual one of said plurality of self cooling vents and partially within said at least one modular compound structural frame, said at least one modular electrical conversion device for coupling to the universal source of electrical power via at least an individual one of said plurality of wire routing paths to transform the universal source of power to a constant power source;

wherein said at least one modular electrical conversion device includes a plurality of electrical elements coupled to said constant power source and to a data source for converting electrical energy into visible radiant energy indicative of an electronic message intended for public viewing; and wherein said at least one modular electrical conversion device is further for coupling to the data source via said at least an individual one of said plurality of wire routing paths.

* * * * *